United States Patent
Kubota

(10) Patent No.: US 8,759,741 B2
(45) Date of Patent: Jun. 24, 2014

(54) TITANIUM BLACK DISPERSION, PHOTOSENSITIVE RESIN COMPOSITION, WAFER LEVEL LENS, LIGHT BLOCKING FILM, METHOD FOR PRODUCING THE LIGHT BLOCKING FILM, AND SOLID-STATE IMAGE PICKUP ELEMENT

(75) Inventor: Makoto Kubota, Shizuoka-ken (JP)

(73) Assignee: FUJIFILM Corporation, Tokyo (JP)

( * ) Notice: Subject to any disclaimer, the term of this patent is extended or adjusted under 35 U.S.C. 154(b) by 184 days.

(21) Appl. No.: 13/502,714

(22) PCT Filed: Oct. 19, 2010

(86) PCT No.: PCT/JP2010/068393
§ 371 (c)(1),
(2), (4) Date: Apr. 18, 2012

(87) PCT Pub. No.: WO2011/049090
PCT Pub. Date: Apr. 28, 2011

(65) Prior Publication Data
US 2012/0199727 A1 Aug. 9, 2012

(30) Foreign Application Priority Data

Oct. 19, 2009 (JP) ................................ 2009-240546
Mar. 30, 2010 (JP) ................................ 2010-079581
Mar. 30, 2010 (JP) ................................ 2010-079779

(51) Int. Cl.
*G03F 7/00* (2006.01)
*H01L 31/00* (2006.01)

(52) U.S. Cl.
USPC ................... 250/214.1; 250/216; 430/270.1; 430/947

(58) Field of Classification Search
USPC ............... 250/214.1, 216, 208.1; 430/270.1, 430/281.1, 292, 298, 904, 947; 252/520.2, 252/586
See application file for complete search history.

(56) References Cited

U.S. PATENT DOCUMENTS

| 6,426,829 B1 | 7/2002 | Feldman et al. |
| 2008/0113273 A1 | 5/2008 | Jin et al. |

(Continued)

FOREIGN PATENT DOCUMENTS

| EP | 2354187 A1 | 8/2011 |
| JP | 2004219978 A | 8/2004 |

(Continued)

OTHER PUBLICATIONS

Notice of Reasons for Rejection, dated Feb. 18, 2014, issued in related JP Application No. 2010-234580, 4 pages in English and Japanese.

(Continued)

*Primary Examiner* — Kevin Pyo
(74) *Attorney, Agent, or Firm* — Sughrue Mion, PLLC

(57) ABSTRACT

A titanium black dispersion includes titanium black particles, a dispersant, and an organic solvent. When the titanium black dispersion is for a wafer level lens, 90% or more of dispersed objects that consist of the titanium black particles have particle diameters of 30 nm or less, or dispersed objects including the titanium black particles contains Si atoms and the content ratio of Si atoms to Ti atoms (Si/Ti) in the dispersed objects is 0.05 or higher. When the titanium black dispersion is used for formation of a light-shielding film that is provided on one side of a silicon substrate having an image pickup device section on the other side, and that shields against infrared light, 90% or more of dispersed objects that consist of the titanium black particles have particle diameters of 30 nm or less.

29 Claims, 11 Drawing Sheets

(56) References Cited

U.S. PATENT DOCUMENTS

| | | |
|---|---|---|
| 2009/0023085 A1 | 1/2009 | Tsuchimura |
| 2010/0118182 A1 | 5/2010 | Fujii et al. |
| 2011/0014401 A1 | 1/2011 | Fujimaki et al. |
| 2012/0243099 A1* | 9/2012 | Kaneko .................. 359/611 |

FOREIGN PATENT DOCUMENTS

| | | |
|---|---|---|
| JP | 3724269 B2 | 12/2005 |
| JP | 2006001775 A | 1/2006 |
| JP | 2006-156801 A | 6/2006 |
| JP | 2006-206891 A | 6/2006 |
| JP | 2006-182627 A | 7/2006 |
| JP | 2006-209102 A | 8/2006 |
| JP | 2007034119 A | 2/2007 |
| JP | 2007-115921 A | 5/2007 |
| JP | 3926380 B1 | 6/2007 |
| JP | 2007148041 A | 6/2007 |
| JP | 2007-256683 A | 10/2007 |
| JP | 2008201853 A | 9/2008 |
| JP | 2009-063985 A | 3/2009 |
| JP | 2009191061 A | 8/2009 |
| JP | 2009227839 A | 10/2009 |
| JP | 2009244408 A | 10/2009 |
| WO | 2005/037926 A1 | 4/2005 |
| WO | 2008/102648 A1 | 8/2008 |
| WO | 2008093516 A1 | 8/2008 |
| WO | 2009116442 A1 | 9/2009 |
| WO | 2010038836 A1 | 4/2010 |

OTHER PUBLICATIONS

Notice of Reasons for Rejection, dated Mar. 11, 2014, issued in related JP Application No. 2011-003444, 4 pages in English and Japanese.

Communication, dated Jan. 2, 2014, issued in corresponding EP Application No. 10824939.2, 8 pages in English.

\* cited by examiner

TITANIUM BLACK DISPERSION, PHOTOSENSITIVE RESIN COMPOSITION, WAFER LEVEL LENS, LIGHT BLOCKING FILM, METHOD FOR PRODUCING THE LIGHT BLOCKING FILM, AND SOLID-STATE IMAGE PICKUP ELEMENT

CROSS REFERENCE TO RELATED APPLICATION

This application is a National Stage of International Application No. PCT/JP2010/068393, filed on Oct. 19, 2010, which claims priority from JP 2009-240546, filed on Oct. 19, 2009 and from Mar. 30, 2010 filed on JP 2010-079581 and JP 2010-079779, the contents of all of which are incorporated herein by reference in their entirety.

TECHNICAL FIELD

The present invention relates to a titanium black dispersion, a photosensitive resin composition, a wafer level lens, a light-shielding film and a method for producing the same, and a solid-state image pickup device.

BACKGROUND ART

In recent years, small and thin image pickup units are installed on portable terminals of electric devices such as cellular phones or personal digital assistants (PDAs). Such image pickup units generally include a solid-state image pickup device such as a charge coupled device (CCD) image sensor or a complementary metal-oxide semiconductor (CMOS) image sensor and a lens that forms a subject image on the solid-state image pickup device.

Due to downsizing and thinning of portable terminals and popularization of portable terminals, image pickup units mounted thereon are also requested to be downsized and thinned, and high production efficiency is also requested. In response to these requests, a method for mass production of image pickup units is known, whereby a lens substrate on which plural lenses are formed is integrally combined with a sensor substrate on which plural solid-state image pickup devices are formed, and thereafter the lens substrate and the sensor substrate are cut such that each of the cut pieces includes a lens and a solid-state image pickup device. Examples of other production methods include: a method for producing an image pickup unit whereby only lenses are formed on a glass wafer or the like, which is then cut into a size appropriate for combined use with an individual sensor, and then combined with an image pickup device provided on a sensor substrate that has been cut into an appropriate size in advance; a method whereby plural lenses are formed from a resin by using a die, the formed lenses are attached to a sensor substrate, and the substrate is cut; a method for producing image pickup units whereby a lens substrate is cut into a size for combination with an individual sensor, and the cut pieces are combined with an image pickup device provided on a sensor substrate that has been cut into an appropriate size in advance.

Examples of known wafer level lens arrays include those having plural lenses obtained by dripping a curable resin material onto a surface of parallel flat plate substrates formed from a light-transmitting material such as glass and curing the resin material in a state in which the resin material is molded in a predetermined shape in a die (for example, see Japanese Patent No. 3926380 and the pamphlet of International Publication WO2008/102648). In some cases, light-shielding regions formed by a black film, a metal film or the like are formed at areas, other than lens portions, of the wafer level lens, or on a part of lens, in order to control the amount of light. The light-shielding region is generally formed by applying a curable light-shielding composition or depositing a metal.

Other examples of known wafer level lens arrays include a wafer level lens array obtained by forming plural through-holes through a silicon substrate, disposing a separately-formed spherical lens material at each through-hole, adhering the lens material to the substrate by soldering, and further polishing the lens material to form plural lenses (see the specification of U.S. Pat. No. 6,426,829). The lenses obtained by this production method may be provided with a light-shielding region formed by a black film, a metal film or the like similar to the above in order to control the amount of light, depending on the case.

Formation of the light-shielding region by metal deposition has problems in that the processes are complicated, lenses bend after the deposition, or scattering of light occurs due to reflection by the metal light-shielding film; accordingly, improvement is desired from the viewpoints of both of production efficiency and performance.

There are cases in which a photosensitive resin composition (light-shielding composition) in which a carbon black for use in, for example, a black matrix of a LCD is used is applied in order to impart light-shielding property.

Further, a light-shielding film is provided on a solid-state image pickup device such as a charge coupled device (CCD) image sensor or a complementary metal-oxide semiconductor (CMOS) image sensor for the purpose of noise prevention and image quality improvement.

Examples of known compositions for forming light-shielding films for solid-state image pickup devices include a photosensitive resin composition that contains a black colorant such as carbon black or titanium black.

Specifically, photosensitive resin compositions that contain titanium black having a specific X-ray diffraction peak intensity ratio, and that aims at improvement of optical density (for example, see Japanese Patent No. 3724269 and pamphlet of International Publication WO2005/037926), and photosensitive resin compositions that contain titanium black having a specific nitrogen concentration or a specific crystalline diameter (for example, see Japanese Patent Application Laid-open (JP-A) No. 2006-182627, JP-A No. 2006-206891 and JP-A No. 2006-209102) are disclosed.

Further, a composition for forming a light-shielding film that contains titanium black and a resin component, and that aims at obtainment of high light-shielding property with a small film thickness is disclosed (for example, see JP-A No. 2007-115921).

SUMMARY OF INVENTION

Technical Problem

When conventional light-shielding compositions are used for formation of light-shielding regions (light-shielding films) in wafer level lenses, residues generated during formation of the light-shielding films tend to remain on or in the vicinity of lenses. The residues cause problems such as deterioration of the light transmittance of the lenses, which have not been mitigated yet.

A first aspect of the present invention aims at achievement of the following objects.

That is, an object of the first aspect is to provide a photosensitive resin composition for a wafer level lens which is used for formation of a light-shielding film provided in a wafer level lens, and which has excellent curability, and which is capable of decreasing photosensitive composition-derived residues in a region other than regions in which a light-shielding film is formed, and a titanium black dispersion for a wafer level lens for use in the photosensitive resin composition.

Another object of the first aspect is to provide a wafer level lens that can suppress scattering or decrease in transmittance of light in the vicinity of the light-shielding film, and a solid-state image pickup device provided with the wafer level lens.

A second aspect of the present invention aims at achievement of the following objects.

That is, an object of the second aspect is to provide a photosensitive resin composition for a wafer level lens which is used for formation of a light-shielding film provided in a wafer level lens, and which is capable of decreasing photosensitive composition-derived residues in a region other than regions in which a light-shielding film is formed, and a titanium black dispersion for a wafer level lens for use in the photosensitive resin composition.

Another object of the second aspect is to provide a wafer level lens that can suppress scattering or decrease in transmittance of light in the vicinity of the light-shielding film, and a solid-state image pickup device provided with the wafer level lens.

In recent years, due to downsizing, thinning, and sensitivity increase of solid-state image pickup devices, it has been more strongly desired that infrared light incident upon a silicon substrate, which has an image pickup device section on one side thereof, from the other side of the silicon substrate be shielded.

The reason therefor is that the silicon substrate, which is a base body of a solid-state image pickup device, exhibits high transmittance to infrared light, and that the image pickup device provided in the solid-state image pickup device exhibits sensitivity not only to visible light but also to infrared light.

Under these circumstances, a light-shielding film in which carbon black is used cannot sufficiently meet these requests since the light-shielding film has high transmittance to infrared light. In contrast, a light-shielding film in which titanium black is used has low transmittance to infrared light and excellent ability to shield against infrared light, thus being favorable as a light-shielding film that satisfies the above requests.

However, a study carried out by the present inventor clarified that formation of a light-shielding film using a titanium black-containing dispersion or a titanium black-containing photosensitive resin composition tends to leave residues derived from the photosensitive resin composition in a region other than regions in which the light-shielding film is formed.

A third aspect of the present invention aims at achievement of the following objects.

That is, an object of the third aspect is to provide a photosensitive resin composition with which a light-shielding film having excellent ability to shield against infrared light can be formed, and residues in a region other than regions in which the light-shielding film is formed is decreased when the light-shielding film is formed, and a titanium black dispersion for use in the photosensitive resin composition.

Another object of the third aspect is to provide a light-shielding film having excellent ability to shield against infrared light, and a method for producing a light-shielding film whereby a light-shielding film having excellent ability to shield against infrared light can be formed, and residues in a region other than regions in which the light-shielding film is formed is decreased when the light-shielding film is formed.

Yet another object of the third aspect is to provide a solid-state image pickup device in which noise due to infrared light is decreased, and noise due to residues is also decreased.

Solution to Problem

Means for solving the problems of the first aspect are as follows.

<1> A titanium black dispersion for a wafer level lens including titanium black particles, a dispersant, and an organic solvent, wherein 90% or more of dispersed objects that consist of the titanium black particles have particle diameters of 30 nm or less.

<2> A photosensitive resin composition for a wafer level lens including the titanium black dispersion according to <1>, a photopolymerizable compound, and a photopolymerization initiator.

<3> A wafer level lens including, at a peripheral portion of a lens present on a substrate, a light-shielding film obtained by curing the photosensitive resin composition according to <2>.

<4> A solid-state image pickup device including the wafer level lens according to <3>.

Means for solving the problems of the second aspect are as follows.

<5> A titanium black dispersion for a wafer level lens including titanium black particles, a dispersant, and an organic solvent, wherein dispersed objects including titanium black particles contain Si atoms, and the content ratio of Si atoms to Ti atoms (Si/Ti) in the dispersed objects is 0.05 or higher.

<6> A photosensitive resin composition for a wafer level lens including the titanium black dispersion according to <5>, a photopolymerizable compound, and a photopolymerization initiator.

<7> A wafer level lens including, at a peripheral portion of a lens present on a substrate, a light-shielding film obtained by curing the photosensitive resin composition according to <6>.

<8> A solid-state image pickup device including the wafer level lens according to <7>.

Means for solving the problems of the third aspect are as follows.

<9> A titanium black dispersion including titanium black particles, a dispersant, and an organic solvent, wherein 90% or more of dispersed objects that consist of the titanium black particles have particle diameters of 30 nm or less, and the titanium black dispersion is used for formation of a light-shielding film that is provided on one side of a silicon substrate having an image pickup device section on the other side thereof, and that shields against infrared light.

<10> The titanium black dispersion according to <9>, wherein the dispersant is a graft copolymer having a graft chain in which the number of atoms excluding hydrogen atoms is from 40 to 10000.

<11> The titanium black dispersion according to <10>, wherein the graft copolymer contains at least a structural unit represented by any one of the following Formulae (1) to (5):

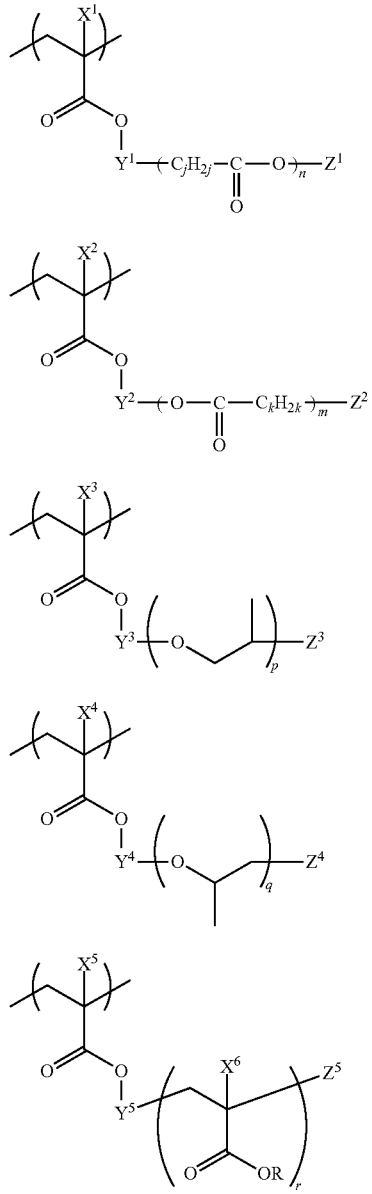

wherein, in Formulae (1) to (5), $X^1$, $X^2$, $X^3$, $X^4$, $X^5$, and $X^6$ each independently represent a hydrogen atom or a monovalent organic group; $Y^1$, $Y^2$, $Y^3$, $Y^4$, and $Y^5$ each independently represent a divalent linking group; $Z^1$, $Z^2$, $Z^3$, $Z^4$, and $Z^5$ each independently represent a monovalent organic group; R represents a hydrogen atom or a monovalent organic group; and R's having different structures may be used in mixture in the copolymer; n, m, p, q, and r each represent an integer of 1 to 500; and j and k each independently represent an integer of 2 to 8.

<12> The titanium black dispersion according to <11>, wherein the graft copolymer contains a structural unit represented by any one of Formulae (1) to (5) in a range of from 10% by mass to 90% by mass relative to the total mass of the graft copolymer.

<13> A photosensitive resin composition including the titanium black dispersion according to any one of <9> to <13>, a photopolymerizable compound, and a photopolymerization initiator, wherein the photosensitive resin composition is used for formation of a light-shielding film that is provided on one side of a silicon substrate having an image pickup device section on the other side thereof, and that shields against infrared light.

<14> A light-shielding film formed on one side of a silicon substrate having an image pickup device section on the other side thereof using the photosensitive resin composition according to <13>.

<15> A method for producing a light-shielding film including:
applying the photosensitive resin composition according to <13> to one side of a silicon substrate having an image pickup device section on the other side thereof to form a photosensitive layer;
patternwise exposing the photosensitive layer to light; and
developing the photosensitive layer after exposure to form a pattern.

<16> A solid-state image pickup device including the light-shielding film according to <14> on the one side of the silicon substrate having an image pickup device section on the other side thereof.

<17> The solid-state image pickup device according to <16> including:
the silicon substrate having the image pickup device section on the other side thereof;
a metal electrode provided on the one side of the silicon substrate and electrically connected to the image pickup device section; and
the light-shielding film according to <14> provided on the side of the silicon substrate on which the metal electrode is provided, and patterned to expose at least a part of the metal electrode.

<18> The solid-state image pickup device according to <16>, further including a metal electrode provided on the one side of the silicon substrate and electrically connected to the image pickup device section, the light-shielding film being patterned to expose at least a part of the metal electrode.

Advantageous Effects of Invention

According to the first aspect, it is possible to provide a photosensitive resin composition for a wafer level lens which is used for formation of a light-shielding film provided in a wafer level lens, and which has excellent curability, and which is capable of decreasing photosensitive composition-derived residues in a region other than regions in which a light-shielding film is formed, and a titanium black dispersion for a wafer level lens for use in the photosensitive resin composition.

According to the first aspect, it is also possible to provide a wafer level lens that can suppress scattering or decrease in transmittance of light in the vicinity of the light-shielding film, and a solid-state image pickup device provided with the wafer level lens.

According to the second aspect, it is possible to provide a photosensitive resin composition for a wafer level lens which is used for formation of a light-shielding film provided in a wafer level lens, and which is capable of decreasing photosensitive composition-derived residues in a region other than regions in which a light-shielding film is formed, and a titanium black dispersion for a wafer level lens for use in the photosensitive resin composition.

According to the second aspect, it is also possible to provide a wafer level lens that can suppress scattering or decrease in transmittance of light in the vicinity of the light-shielding film, and a solid-state image pickup device provided with the wafer level lens.

According to the third aspect, it is possible to provide a photosensitive resin composition with which a light-shielding film having excellent ability to shield against infrared light can be formed, and residues in a region other than regions in which the light-shielding film is formed is decreased when the light-shielding film is formed, and a titanium black dispersion for use in the photosensitive resin composition.

According to the third aspect, it is also possible to provide a light-shielding film having excellent ability to shield against infrared light, and a method for producing a light-shielding film whereby a light-shielding film having excellent ability to shield against infrared light can be formed, and residues in a region other than regions in which the light-shielding film is formed is decreased when the light-shielding film is formed.

According to the third aspect, it is also possible to provide a solid-state image pickup device in which noise due to infrared light is decreased, and noise due to residues is also decreased.

DESCRIPTION OF EMBODIMENTS

Figure 1:
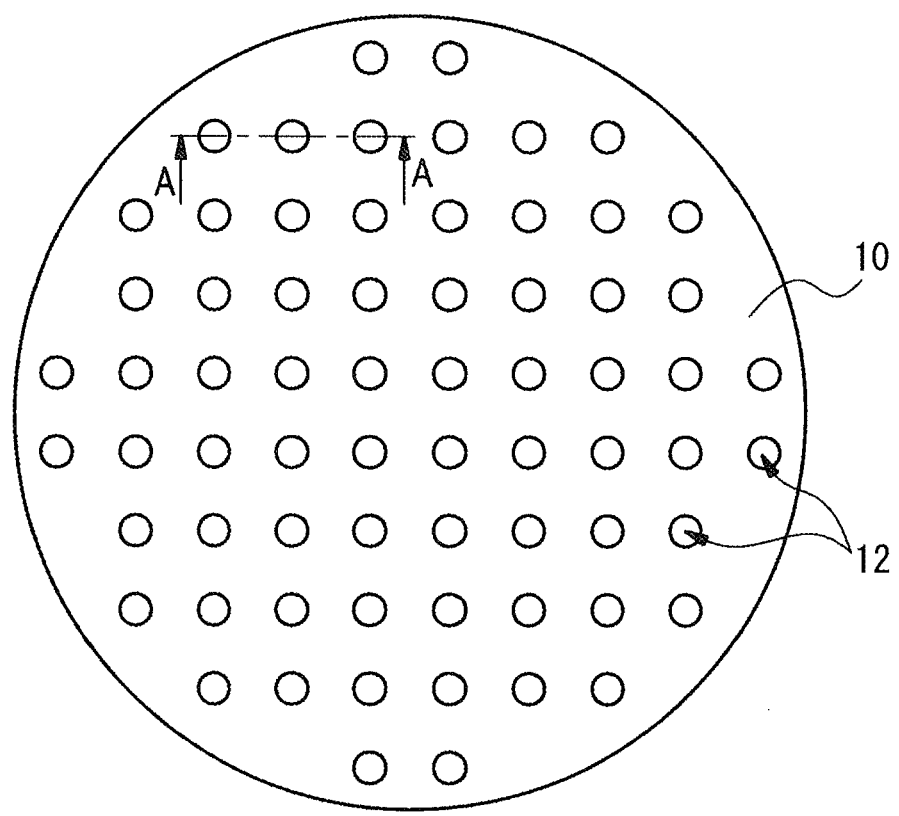
FIG. 1 is a plan view showing an example of a wafer level lens array.

In the following, a titanium black dispersion for a wafer level lens, a photosensitive resin composition including the same, and a wafer level lens according to a first embodiment, and a titanium black dispersion for a wafer level lens, a photosensitive resin composition including the same, and a wafer level lens according to a second embodiment, and a titanium black dispersion and photosensitive resin composition according to a third embodiment are described in detail.

"Wafer level lens" as used herein means a lens which is provided in an image pickup unit (for example, a solid-state image pickup device) and comprises an individual lens present on a substrate and a light-shielding film provided at a peripheral portion of the lens. A group of such wafer level lenses is referred to as "wafer level lens array".

<Titanium Black Dispersion for Wafer Level Lens and Photosensitive Resin Composition Including the Same According to First Embodiment>

The titanium black dispersion for a wafer level lens of the first embodiment (hereinafter sometimes simply referred to as "titanium black dispersion") is a dispersion that includes titanium black particles, a dispersant, and an organic solvent, wherein 90% or more of dispersed objects that consist of the titanium black particles have particle diameters of 30 nm or less.

The photosensitive resin composition for a wafer level lens of the first embodiment (hereinafter sometimes simply referred to as "photosensitive resin composition") is a photosensitive resin composition that includes the titanium black dispersion of the first embodiment, a photopolymerizable compound, and a photopolymerization initiator.

The titanium black dispersion and the photosensitive resin composition of the first embodiment are used for formation of a light-shielding film of a wafer level lens.

Respective components contained in the titanium black dispersion or photosensitive resin composition of the first embodiment are described below in order.

—Titanium Black Particles of First Embodiment—

The titanium black dispersion of the first embodiment includes titanium black particles. The titanium black particles are contained as dispersed objects in the dispersion, and, in the first embodiment, 90% or more of dispersed objects that consist of titanium black particles have particle diameters of 30 nm or less. That is, 90% or more (in terms of particle number) of dispersed titanium black particles have particle diameters of 30 nm or less.

The diameter of a dispersed object in the first embodiment means the particle diameter of the dispersed object, and the particle diameter is the diameter of a circle having the same area as the projection area of the outer surface of the particle. The projection area of a particle can be obtained by measuring the area thereof obtained by taking an electron micrograph, followed by correction for the magnification of the electron micrograph.

Here, the "dispersed objects that consist of titanium black particles" in the first embodiment encompasses titanium black particles in the form of primary particles as well as titanium black particles in the form of aggregates (secondary particles).

The photosensitive resin composition of the first embodiment includes dispersed objects that consist of titanium black particles derived from the titanium black dispersion of the first embodiment. 90% or more of the dispersed objects that consist of titanium black particles and that are contained in the photosensitive resin composition and in a cured film (a light-shielding film) obtained by curing the photosensitive resin composition have particle diameters of 30 nm or less.

In the first embodiment, since 90% or more of the dispersed objects that consist of titanium black particles have particle diameters of 30 nm or less, residues derived from the photosensitive composition in a region other than regions in which the light-shielding film is formed is reduced when a light-shielding film is formed using the photosensitive resin composition of the first embodiment. Here, the residues include components derived from the photosensitive composition, such as titanium black particles and resin components.

Although the reason why the residues are decreased is still unclear, it is presumed that dispersed objects having small diameters contribute to improvement in removability of uncured photosensitive resin composition (in particular, titanium black particles) during the formation of a light-shielding film.

In addition, since titanium black particles have excellent light-shielding property to light of a wide range of wavelength regions ranging from ultraviolet to infrared, the light-shielding film formed using the titanium black dispersion or photosensitive resin composition of the first embodiment exhibits excellent light-shielding property.

In order to determine whether or not 90% of the dispersed objects contained in the titanium black dispersion or photosensitive resin composition of the first embodiment have particle diameters of 30 nm or less, the following method (1-1) is employed.

In order to determine whether or not 90% of the dispersed objects contained in the cured film (light-shielding film) obtained by curing the photosensitive resin composition of the first embodiment have particle diameters of 30 nm or less, the following method (1-2) is employed.

<Method (1-1)>

The titanium black dispersion or photosensitive resin composition is diluted 500-fold with propylene glycol monomethyl ether acetate (hereinafter sometimes simply referred to as "PGMEA"), and dripped onto a carbon thin film and dried, and a photograph for morphological observation is taken using a transmission electron microscope. The projection areas of the outer surfaces of 400 particles are determined from the obtained photograph, the diameters of circles corresponding to the areas are calculated, and the frequency distribution thereof is evaluated.

<Method (1-2)>

A photograph for morphological observation and elemental maps for Ti and Si of a cross-section of the film-formed substrate is taken using a scanning electron microscope (S-3400N (trade name) manufactured by Hitachi High-Technologies Corporation), and an energy-dispersive X-ray analyzer (GENESIS (trade name) manufactured by EDAX Inc.). The projection areas of the outer surfaces of 400 particles in which Ti element has been detected are determined from the obtained photograph, the diameters of circles corresponding to the areas are calculated, and the frequency distribution thereof is evaluated.

<Titanium Black Dispersion for Wafer Level Lens and Photosensitive Resin Composition Including the Same According to Second Embodiment>

The titanium black dispersion for a wafer level lens of a second embodiment (hereinafter sometimes simply referred to as "titanium black dispersion") includes titanium black particles, a dispersant, and an organic solvent, and dispersed objects including the titanium black particles contain Si atoms, and the content ratio of Si atoms to Ti atoms (Si/Ti) in the dispersed objects is 0.05 or higher.

In addition, the photosensitive resin composition for a wafer level lens of the second embodiment (hereinafter sometimes simply referred to as "photosensitive resin composition") is a photosensitive resin composition that includes the titanium black dispersion of the second embodiment, a photopolymerizable compound, and a photopolymerization initiator.

That is, the photosensitive resin composition of the second embodiment includes titanium black particles, a dispersant, and an organic solvent, which are components of the titanium black dispersion of the second embodiment, and further includes a photopolymerizable compound and a photopolymerization initiator; Further, the dispersed objects, including the titanium black particles, contain Si atoms, and the content ratio of Si atoms to Ti atoms (Si/Ti; weight/weight, the same applies hereinafter) in the dispersed objects is 0.05 or higher.

The titanium black dispersion and the photosensitive resin composition of the second embodiment are used for formation of a light-shielding film in a wafer level lens.

Respective components contained in the titanium black dispersion or photosensitive resin composition of the second embodiment are described below in order.

—Titanium Black Particles of Second Embodiment—

The titanium black dispersion of the second embodiment includes titanium black particles. The titanium black particles are contained as dispersed objects in the dispersion. In the second embodiment, the dispersed objects, including titanium black particles, contain Si atoms, and the content ratio of Si atoms to Ti atoms (Si/Ti) in the dispersed objects is 0.05 or higher.

Here, the "dispersed objects including titanium black particles" in the second embodiment encompasses a case in which titanium black particles are in the form of primary particles and a case in which titanium black particles are in the form of aggregates (secondary particles).

When the content ratio of Si atoms to Ti atoms (Si/Ti) in the dispersed objects of the second embodiment is higher than 0.5, preparation of a pigment dispersion using the dispersed objects is difficult. Accordingly, the upper limit of the content ratio is preferably 0.5.

An excessively low Si/Ti of the dispersed objects tends to cause residues at removal regions when a light-shielding film in which the dispersed objects in the second embodiment are used is patterned by, for example, photolithography. An excessively high Si/Ti of the dispersed objects decreases the ability to shield against light. Therefore, Si/Ti of the dispersed objects is more preferably from 0.05 to 0.5, and even more preferably from 0.07 to 0.4.

The following means may be employed in order to provide a Si/Ti of the dispersed objects of 0.05 or higher.

Titanium black having a Si/Ti of the dispersed objects of 0.05 or higher can be obtained by dispersing titanium oxide and silica particles by using a disperser to obtain a dispersion, and subjecting the resultant mixture to reducing treatment at high temperature.

Here, a specific embodiment for providing a Si/Ti of the dispersed objects of 0.05 or higher is explained.

Titanium black having a Si/Ti of 0.05 or higher can be prepared by, for example, a method described in the paragraphs [0005](6) and [0016] to [0021] of JP-A No. 2008-266045.

The photosensitive resin composition of the second embodiment includes dispersed objects that consist of titanium black particles derived from the titanium black dispersion of the second embodiment. The dispersed objects, including titanium black particles, contained in the photosensitive resin composition and in the cured film (light-shielding film) obtained by curing the photosensitive resin composition also have the content ratio of Si atoms to Ti atoms (Si/Ti) in the dispersed objects of 0.05 or higher, and preferable ranges thereof are also the same as those described above.

In the second embodiment, since the content ratio of Si atoms to Ti atoms (Si/Ti) in the dispersed objects including titanium black particles is 0.05 or higher, residues derived from the photosensitive composition in a region other than regions in which the light-shielding film is formed are reduced when a light-shielding film is formed using the photosensitive resin composition of the second embodiment containing the dispersed objects. The residues include components derived from the photosensitive composition, such as titanium black particles and resin components.

Although the reason why the residues are reduced is still unclear, it is presumed that the dispersed objects tend to have small particle diameters (for example, particle diameters of 30 nm or less), and an increase in the proportion of Si atom-containing components in the dispersed objects decreases adsorptivity of the entire film to an underlying support, as a result of which the photosensitive resin composition of the second embodiment including the dispersed objects has improved development removability of an uncured photosensitive resin composition (in particular, titanium black particles) during the formation of a light-shielding film.

In addition, since titanium black particles have excellent light-shielding property to light in a wide range of wavelength regions ranging from ultraviolet to infrared, the light-shielding film formed using the titanium black dispersion or photosensitive resin composition of the second embodiment exhibits an excellent light-shielding property.

In order to determine whether or not the content ratio of Si atoms to Ti atoms (Si/Ti) in the dispersed objects contained in the titanium black dispersion or photosensitive resin composition of the second embodiment is 0.05 or higher, the following method (2-1) is employed.

<Method (2-1)>

The titanium black dispersion or photosensitive resin composition is subjected to heating treatment under an oxygen atmosphere, and dispersed objects including titanium black particles are taken out.

20 mg of the titanium black dispersion or photosensitive resin composition is weighed out, 0.1 mL of HF, 1 mL of $HNO_3$ (10% aq.), 1 mL of $H_2SO_4$ (5% aq.), and 1 mL of HCl (3% aq.) are added thereto and subjected to microwave dissolution. At this time, the temperature of the liquid is 180° C.

Then, $H_2O$ is added to this mixture solution until the total volume reached 100 ml, and the resultant mixture is subjected to ICP-OES (ATTOM (trade name), manufactured by SII Co., Ltd.) to carry out an elemental analysis. The mass ratio of Si/Ti is calculated from the results obtained.

In order to determine whether or not the content ratio of Si atoms to Ti atoms (Si/Ti) in the dispersed objects contained in the cured film (light-shielding film) obtained by curing the photosensitive resin composition of the second embodiment is 0.05 or higher, the following method (2-2) is employed.

<Method (2-2)>

A substrate on which the light-shielding film is formed is split to prepare a cross-section of the light-shielding film, and the cross-section is measured with an energy-dispersive X-ray fluorescence spectrometer, as a result of which the amount of Si atoms and the amount of Ti atoms at a surface of the light-shielding film can be obtained. The ratio therebetween is evaluated as Si/Ti in the light-shielding film.

Here, energy-dispersive X-ray fluorescence spectroscopy can be carried out using, for example, S-4800 (trade name) manufactured by Hitachi High-Technologies Corporation as a scanning electron microscope and an INCA ENERGY PENTAFETX3 (trade name) manufactured by Oxford Corp. as an energy-dispersive X-ray fluorescence detector.

In addition, a measurement method using an energy-dispersive X-ray fluorescence spectrometer may be used not only for measurement of the content ratio of Si atoms to Ti atoms in the dispersed objects contained in the cured film (light-shielding film), but also for measurement of the content ratio of Si atoms to Ti atoms in powder. Therefore, the content ratio of Si atoms to Ti atoms of the dispersed objects contained in the titanium black dispersion or photosensitive resin composition can be measured by carrying out energy-dispersive X-ray fluorescence spectroscopy on a powder obtained by, for example, heating the titanium black dispersion or photosensitive resin composition. The measurement may be carried out according to the following method (2-3).

<Method (2-3)>

The titanium black dispersion or photosensitive resin composition is heated to 700° C. under an oxygen atmosphere using a small rotary kiln (manufactured by Motoyama Co., Ltd.) and maintained in that state for 30 minutes and then cooled to obtain 2 g of powder. The powder obtained is placed on a tungsten plate having a thickness of 0.2 mm, the plate is placed in a vacuum chamber equipped with an electron beam heating mechanism and subjected to heating treatment at 1000° C. for 30 seconds by electron beam heating at a degree of vacuum of $10^{-5}$ Torr or less. The Si/Ti ratio is calculated by obtaining the amount of Si atoms and the amount of Ti atoms of the powder, which has been subjected to the heating treatment, by using a field emission scanning electron microscope S-4800 (trade name, manufactured by Hitachi High-Technologies Corporation) and an energy-dispersive X-ray fluorescence detector INCA Energy PentaFETx3 (trade name, Manufactured by Oxford Corp.).

<Titanium Black Dispersion and Photosensitive Resin Composition of Third Embodiment>

The titanium black dispersion of the third embodiment is a titanium black dispersion for use in formation of a light-shielding film which is provided on one side of a silicon substrate having an image pickup device section on the other side thereof and which shields against infrared light, the titanium black dispersion including titanium black particles, a dispersant and an organic solvent, wherein 90% or more of the dispersed objects that consist of titanium black particles have particle diameters of 30 nm or less. That is, 90% or more (in terms of particle number) of dispersed titanium black particles have particle diameters of 30 nm or less.

In addition, the photosensitive resin composition of the third embodiment is a photosensitive resin composition that includes the titanium black dispersion of the third embodiment, a photopolymerizable compound, and a photopolymerization initiator, and is used for formation of a light-shielding film which is provided on one side of a silicon substrate having an image pickup device section on the other side thereof and which shields against infrared light.

In recent years, due to downsizing, thinning, and increase in sensitivity of solid-state image pickup devices, there is an increasing request that, in a silicon substrate having an image pickup device section on one side thereof (hereinafter also referred to as "first main face" or "front side"), infrared light incident upon the silicon substrate from the other side thereof (hereinafter, referred to as "second main face" or "back side") be shielded. The light-shielding film in which titanium black is used has excellent ability to shield against infrared light, thus being favorable as a light-shielding film satisfying the request.

However, as a result of study on the third embodiment, it has been found that, when a light-shielding film is formed using a dispersion or photosensitive resin composition that includes titanium black, residues derived from the photosensitive resin composition tend to be left in a region other than regions in which the light-shielding film is formed. Although the reason why the residues tend to be left is not clear, it is presumed that tendency for titanium black particles to precipitate over time, tendency for titanium black particles to become coarse, etc. have relation therewith.

Accordingly, as a result of further research of the third embodiment, it has been found that the residues can be reduced while maintaining the ability of titanium black to shield against infrared light, by forming a light-shielding film by using the titanium black dispersion or photosensitive resin composition in which 90% or more of the dispersed objects that consist of titanium black particles have particle diameters of 30 nm or less, and thus the third embodiment has been completed.

Thus, with the titanium black dispersion and photosensitive resin composition of the third embodiment, a light-shielding film having excellent ability to shield against infrared light can be formed, and residues in a region other than regions in which the light-shielding film is formed can be reduced during formation of the light-shielding film.

Here, "infrared" means a wavelength region of from 700 nm to 1200 nm.

In addition, "shielding infrared light" means a state in which transmittance is 10% or less throughout a wavelength region of from 700 nm to 1200 nm.

Further, with the titanium black dispersion and photosensitive resin composition of the third embodiment, curability (pattern forming properties) of the light-shielding film at the time of forming the light-shielding film is also improved.

Although the reason why the curability is improved is not clear, the reason is presumed to be as follows: since 90% or more of the dispersed objects that consist of titanium black particles have particle diameters of 30 nm or less, scattering of ultraviolet light used for curing is suppressed in the light-shielding film to be formed, and traveling of the ultraviolet light in the film thickness direction is facilitated. However, the third embodiment is not limited by this presumption.

The "image pickup device section" as used herein refers to a region in which plural image pickup devices (such as CCDs and CMOSs) are aligned (for example, in a matrix pattern).

In this specification, the silicon substrate provided with an image pickup device section is sometimes referred to as "solid-state image pickup device" or "solid-state image pickup device substrate". In the solid-state image pickup device, other elements (such as a color filter or a microlens) may further be formed.

Respective components contained in the titanium black dispersion or photosensitive resin composition of a third embodiment are described below in order.

—Titanium Black Particles of Third Embodiment—

The titanium black dispersion of a third embodiment includes titanium black particles.

The titanium black particles are contained as dispersed objects in the dispersion, and, in the third embodiment, 90% or more of dispersed objects that consist of titanium black particles have particle diameters of 30 nm or less.

The particle diameter of a dispersed object in the third embodiment means the particle diameter of the dispersed object, and the particle diameter is the diameter of a circle having the same area as the projection area of the outer surface of the particle. The projection area of a particle can be obtained by measuring the area thereof obtained by taking an electron microscope, followed by correction for the magnification of the electron micrograph.

Here, "dispersed objects that consist of titanium black particles" in the third embodiment encompasses titanium black particles in the form of primary particles as well as titanium black particles in the form of aggregates (secondary particles).

The photosensitive resin composition of the third embodiment includes dispersed objects that consist of titanium black particles derived from the titanium black dispersion of the third embodiment. 90% or more of the dispersed objects that consist of titanium black particles and that are contained in the photosensitive resin composition and in a cured film (light-shielding film) obtained by curing the photosensitive resin composition have particle diameters of 30 nm or less.

In the third embodiment, since 90% or more of the dispersed objects that consist of titanium black particles have particle diameters of 30 nm or less, residues derived from the photosensitive composition in a region other than regions in which the light-shielding film is formed is reduced when a light-shielding film is formed using the photosensitive resin composition of the third embodiment. Here, the residues include components derived from the photosensitive composition, such as titanium black particles and resin component.

Although the reason why the residues are decreased is still unclear, it is presumed that dispersed objects having small diameters contribute to improvement in removability of uncured photosensitive resin composition (in particular, titanium black particles) during the formation of the light-shielding film.

In addition, titanium black particles have excellent light-shielding property to light of a wide range of wavelength regions ranging from ultraviolet to infrared, and have excellent light-shielding property to, particularly, infrared light (infrared light-shielding property). Therefore, the light-shielding film formed using the titanium black dispersion or photosensitive resin composition of the third embodiment exhibits excellent infrared light-shielding property.

In order to determine whether or not 90% of the dispersed objects contained in the titanium black dispersion or photosensitive resin composition of the third embodiment have particle diameters of 30 nm or less, the method (1-1) described above is employed.

In order to determine whether or not 90% of the dispersed objects contained in the cured film (light-shielding film) obtained by curing the photosensitive resin composition of the third embodiment have particle diameters of 30 nm or less, the method (1-2) described above is employed.

Titanium black particles in the first to third embodiments are described in more detail below.

In the first to third embodiments, the titanium black particles refer to black particles having titanium atoms, and are preferably black particles such as partially-oxidized titanium or titanium oxynitride.

The titanium black particles may be surface-modified for the purpose of, for example, improvement of dispersibility or suppression of aggregation, if necessary. The modification of the particle surface may be, for example, coating treatment with silicon oxide, titanium oxide, germanium oxide, aluminum oxide, magnesium oxide, zirconium oxide or the like, or may be treatment with a water-shedding substance such as those described in JP-A No. 2007-302836.

Examples of commercial products of titanium black particles include titanium black 10S, 12S, 13R, 13M, 13M-C, 13R-N, 13M-T (trade names: all manufactured by Mitsubishi Materials Corporation), TILACK D (trade name: manufactured by Ako Kasei Co., Ltd.), etc.

Methods for preparing titanium black particles include, but are not limited to, a method in which a mixture of titanium dioxide and metallic titanium is reduced by heating under a reducing atmosphere (a method described in JP-A No.

49-5432), a method in which ultrafine titanium dioxide obtained by high-temperature hydrolysis of titanium tetrachloride is reduced under a reducing atmosphere containing hydrogen (a method disclosed in JP-A No. 57-205322), a method in which titanium dioxide or titanium hydroxide is reduced at high temperature in the presence of ammonia (a method disclosed in JP-A No. 60-65069 and JP-A No. 61-201610), a method in which a vanadium compound is attached to titanium dioxide or titanium hydroxide, and high-temperature reduction is carried out in the presence of ammonia (a method disclosed in JP-A No. 61-201610), etc.

The titanium black particles employed in the first to third embodiments preferably have a small average primary particle diameter.

In the first to third embodiments, the titanium black dispersion and the photosensitive resin composition each may include only one type of titanium black particles, or include two or more types thereof.

So long as the effects of the respective embodiments are not impaired, one type of, or two or more types of, black pigment made of a composite oxide of Cu, Fe, Mn, V, Ni, or the like, cobalt oxide, iron oxide, carbon black, aniline black, or the like, may further be used as dispersed objects in combination with the titanium black particles, in order to control dispersibility, coloring property or the like. In this case, it is preferable that 50% by mass or more of the dispersed objects are dispersed objects that consist of titanium black particles.

As described below, so long as effects of respective embodiments are not impaired, other coloring agents (such as organic pigments or dyes) may optionally be used together with the titanium black particles in order to, for example, control the light-shielding property.

The content of titanium black particles in the titanium black dispersion in the first embodiment is preferably from 5% by mass to 60% by mass, more preferably from 10% by mass to 50% by mass, relative to the total mass of the dispersion.

The content of titanium black particles in the photosensitive resin composition in the first embodiment is preferably from 2.5% by mass to 30% by mass, more preferably from 5% by mass to 20% by mass, relative to the total mass of the dispersion.

The content of titanium black particles in the titanium black dispersion in the second embodiment is preferably from 5% by mass to 60% by mass, more preferably from 10% by mass to 50% by mass, relative to the total mass of the dispersion.

The content of titanium black particles in the photosensitive resin composition in the second embodiment is preferably from 2.5% by mass to 30% by mass, more preferably from 5% by mass to 20% by mass, relative to the total mass of the composition.

The content of titanium black particles in the titanium black dispersion in the third embodiment is preferably from 5% by mass to 60% by mass, more preferably from 10% by mass to 50% by mass, relative to the total mass of the dispersion.

The content of titanium black particles in the photosensitive resin composition in the third embodiment is preferably from 2.5% by mass to 30% by mass, more preferably from 5% by mass to 20% by mass, relative to the total mass of the dispersion.

In the second embodiment, the dispersed objects including titanium black particles contain Si atoms, and the content ratio, based on weight, of Si atoms to Ti atoms (Si/Ti) in the dispersed objects is 0.05 or higher.

A material used for incorporating Si atoms into the dispersed objects in the second embodiment is described below. In order to incorporate Si atoms into the dispersed objects, a Si atom-containing substance such as silica may be used.

Examples of silica that can be used in the second embodiment include precipitated silica, fumed silica, colloidal silica, and synthetic silica. Silica appropriately selected from these may be used. Silica is available also as commercial products, and examples of commercial products that can be used include HS-101, HS-102, HS-103, HS-104, HS-105, HS-106, HS-107, HS-201, HS-202, HS-203, HS-204, HS-205, HS-301, HS-302, HS-303, HS-304, HS-305 (trade names, all manufactured by Nippon Steel Materials Co., Ltd.), HIPRESICA SS, HIPRESICA TS, HIPRESICA BS, HIPRESICA SP, HIPRESICA FQ (trade names, all manufactured by Ube Nitto Kasei Co., Ltd), CAB-O-SIL (registered trademark) LM-150, CAB-O-SIL (registered trademark) LM-150, CAB-O-SIL (registered trademark) S-17D (all manufactured by Cabot Japan K.K.), etc. Fine particle-type silica is preferable since silica particles that have particle diameters comparable to the thickness of the formed light-shielding film according to the present invention cause decrease in light-shielding property. Examples of fine particle-type silica include, but are not limited to: AEROSIL (registered trademark) 90, AEROSIL (registered trademark) 130, AEROSIL (registered trademark) 150, AEROSIL (registered trademark) 200, AEROSIL (registered trademark) 300, AEROSIL (registered trademark) 380, AEROSIL (registered trademark) OX 50, AEROSIL (registered trademark) EG 50, AEROSIL (registered trademark) TT 600, AEROSIL (registered trademark) 200 SP, AEROSIL (registered trademark) 300 SP, AEROPERL (registered trademark) 300/30, AEROSIL (registered trademark) R 972, AEROSIL (registered trademark) R 974, AEROSIL (registered trademark) R 104, AEROSIL (registered trademark) R 106, AEROSIL (registered trademark) R 202, AEROSIL (registered trademark) R 805, AEROSIL (registered trademark) R 812, AEROSIL (registered trademark) R 812 S, AEROSIL (registered trademark) R 816, AEROSIL (registered trademark) R 7200, AEROSIL (registered trademark) R 8200, AEROSIL (registered trademark) R 9200, AEROSIL (registered trademark) MOX 80, AEROSIL (registered trademark) MOX 170, AEROSIL (registered trademark) COK 84, AEROSIL (registered trademark) RY 50, AEROSIL (registered trademark) NY 50, AEROSIL (registered trademark) RY 200, AEROSIL (registered trademark) RY 200, AEROSIL (registered trademark) RX 50, AEROSIL (registered trademark) NAX 50, AEROSIL (registered trademark) RX 200, AEROSIL (registered trademark) RX 300, AEROSIL (registered trademark) R 504, AEROPERL (registered trademark) 300/30, VP AEROPERL (registered trademark) P 25/20M05; S6, MA1004, MA1006, MA1010, MA1013, MX030W, MX050W, MX100W, KE-E30, KE-E40, KE-E50, KE-E70, KE-E150, KE-P10, KE-P30, KE-P50, KE-P100, KE-P150, KE-P250 (trade names, all manufactured by JGC C&C.); HS-101, HS-102, HS-103, HS-104, HS-105, HS-106, HS-107, HS-201, HS-202, HS-203, HS-204, HS-205, HS-301, HS-302, HS-303, HS-304, HS-305 (trade names, manufactured by Nippon Steel Materials Co., Ltd.); HIPRESICA SS, HIPRESICA TS, HIPRESICA BS, HIPRESICA SP, HIPRESICA FQ (trade names, manufactured by Ube Nitto Kasei Co., Ltd.); and CAB-O-SIL (registered trademark) LM-150, CAB-O-SIL (registered trademark) LM-150, CAB-O-SIL (registered trademark) S-17D (all manufactured by Cabot Japan K.K.).

The following explanations are common to the first to third embodiments unless specifically indicated otherwise.

(B) Dispersant

Each of the titanium black dispersions and photosensitive resin compositions according to the first to third embodiments includes a dispersant.

Examples of dispersants in the first to third embodiments include polymeric dispersants (for example, polyamide amines and salts thereof, polycarboxylic acid and salts thereof, high-molecular-weight unsaturated acid esters, modified polyurethanes, modified polyesters, modified poly (meth)acrylates, (meth)acrylic copolymers, and naphthalene sulfonate formalin condensates), polyoxyethylene alkyl phosphoric esters, polyoxyethylene alkylamines, alkanol amines, pigment derivatives, etc.

Dispersants in the first to third embodiments can further be classified into straight-chain polymers, terminal-modified polymers, graft polymers, and block polymers, based on the structure thereof.

The dispersant in the first to third embodiments is adsorbed on the surfaces of the dispersed objects such as titanium black particles and optionally-used pigments, and works to prevent re-aggregation. Therefore, a preferable structure thereof may be a terminal-modified polymer, a graft polymer, or a block polymer, each of which has an anchor site for the surface of the pigment.

Further, the dispersant in the first to third embodiments has effect in terms of promoting adsorption onto a dispersing resin by modifying the surfaces of the dispersed objects.

Specific examples of dispersants that can be used in the first to third embodiments include: DISPERBYK 101 (polyamide amine phosphate), 107 (carboxylic acid ester), 110 (acid group-containing copolymer), 130 (polyamide), 161, 162, 163, 164, 165, 166, 170, and 180 (trade names, high-molecular copolymers) manufactured by BYK-Chemie GmbH; BYK-P104 and P105 (trade names, high-molecular-weight unsaturated polycarboxylic acid) manufactured by BYK-Chemie GmbH; EFKA4047, 4050, 4010, and 4165 (trade names, polyurethane compounds), EFKA 4330, 4340 (trade names, block copolymers), 4400, 4402 (trade names, modified polyacrylates), EFKA5010 (trade name, polyester amides), 5765 (trade name, high-molecular-weight polycarboxylate), EFKA6220 (trade name, fatty acid polyester), EFKA6745 (trade name, phthalocyanine derivative), and EFKA6750 (trade name, azo pigment derivative) manufactured by EFKA; AJISPER PB821 and PB822 (trade names) manufactured by Ajinomoto Fine-Techno Co., Inc.; FLOWLEN TG-710 (trade name, urethane oligomer) manufactured by Kyoeisha Chemical Co., Ltd; POLYFLOW No. 50E and No. 300 (trade names, acrylic copolymers) manufactured by Kyoeisha Chemical Co., Ltd.; DISPARLON KS-860, 873SN, 874, #2150 (trade names, aliphatic polycarboxylic acids), DISPARLON #7004 (trade name, polyether esters), DISPARLON DA-703-50, DA-705, and DA-725 (trade names) manufactured by Kusumoto Chemicals, Ltd.; DEMOL RN, N (trade names, naphthalenesulfonic acid formalin polycondensates), DEMOL MS, C, SN-B (trade names, aromatic sulfonic acid formalin polycondensates) manufactured by Kao Corporation; HOMOGENOL L-18 (trade name, high-molecular polycarboxylic acid) manufactured by Kao Corporation; EMULGEN 920, 930, 935, and 985 (trade names, polyoxyethylene nonyl phenyl ether) manufactured by Kao Corporation; ACETAMIN 86 (trade name, stearylamine acetate) manufactured by Kao Corporation; SOLSPERSE 5000 (trade name, phthalocyanine derivative), SOLSPERSE 22000 (trade name, azo pigment derivative), SOLSPERSE 13240 (trade name, polyester amine), SOLSPERSE 3000, 17000, 27000 (trade names, polymers having a functional moiety at a terminal thereof), SOLSPERSE 24000, 28000, 32000, and 38500 (trade names, graft polymers) manufactured by The Lubrizol Corporation; and NIKKOL T106 (trade name, polyoxyethylene sorbitan monooleate) and MYS-IEX (trade name, polyoxyethylene monostearate) manufactured by Nikko Chemicals Co., Ltd. Further examples include amphoteric dispersants such as HINOACT T-8000E (manufactured by Kawaken Fine Chemicals Co., Ltd.).

These dispersants may be used singly, or in combination of two or more thereof.

The acid value of the dispersant is in the range of preferably from 5.0 mgKOH/g to 200 mgKOH/g, more preferably from 10 mgKOH/g to 150 mgKOH/g, and further preferably from 60 mgKOH/g to 150 mgKOH/g.

When the acid value of the dispersant is 200 mgKOH/g or less, detachment of a pattern during development for forming a light-shielding film can more effectively be suppressed. When the acid value of the dispersant is 5.0 mgKOH/g or more, alkali developability is further improved. When the acid value of the dispersant is 60 mgKOH/g or more, precipitation of titanium black particles can further be suppressed, the number of coarse particles can further be decreased, and the stability of the titanium black dispersion or the photosensitive resin composition over time can further be improved.

In the first to third embodiments, the acid value of the dispersant can be calculated, for example, from the average content of acid groups in the dispersant. A resin having a desired acid value can be obtained by changing the content of monomer units containing an acid group that are constituent components of the dispersant.

The weight average molecular weight of the dispersant in the first to third embodiments is preferably from 10,000 to 300,000, more preferably from 15,000 to 200,000, further preferably from 20,000 to 100,000, and particularly preferably from 25,000 to 50,000, from the viewpoint of suppression of detachment of a pattern during development and developability at the time of forming a light-shielding film. The weight average molecular weight of dispersant can be measured by using, for example, GPC.

(Graft Copolymer)

In the first to third embodiments, it is preferable to use a graft copolymer (hereinafter sometimes referred to as "specific resin") as a dispersant. The dispersibility and storage stability can be further improved by using a graft copolymer as a dispersant.

The graft copolymer preferably has a graft chain in which the number of atoms except hydrogen atoms is in the range of from 40 to 10,000. Here, the graft chain refers to a portion from the main chain of the copolymer as the base to the terminal of a group branched from the main chain.

The specific resin is a dispersing resin capable of imparting dispersibility to titanium black particles. Since the specific resin has excellent dispersibility and affinity to solvent imparted by the graft chain, titanium black particles are provided with excellent dispersibility and excellent dispersion stability after a lapse of time. When a photosensitive resin composition is prepared, since the specific resin has affinity to a polymerizable compound or another optional resin that may further be used due to the presence of the graft chain, residues are less likely produced in alkaline development.

Further, the specific resin can be provided with a capability of serving as a resin that imparts developability for forming a pattern by alkaline development, by introducing an alkali-soluble partial structure, such as a carboxylic acid group, to the specific resin.

Therefore, as a result of the introduction of an alkali-soluble partial structure into the graft copolymer, the dispersing resin itself, which is important for dispersing titanium black particles, becomes to have an alkali solubility in the titanium black dispersion of each embodiment. A photosensitive resin composition that includes such a titanium black dispersion provides excellent light-shielding property of a light-exposed portion, and provides improved alkali developability of a portion that has not been exposed to light.

A longer graft chain enhances steric repulsion effects and improves the dispersibility. However, an excessively long graft chain decreases adsorption force to titanium black, and decreases the dispersibility. Thus, in the graft copolymer to be used in the first to third embodiments, the number of atoms except hydrogen atoms per graft chain is from 40 to 10,000, more preferably from 50 to 2,000, and further preferably from 60 to 500.

Examples of the polymer structure of the graft chain include poly(meth)acrylic, polyester, polyurethane, polyurea, polyamide, polyether, etc. In order to improve interaction of the graft moiety and the solvent and thereby increase dispersibility, the graft chain is preferably a graft chain having poly(meth)acrylic, polyester, or polyether, and is more preferably a graft chain having polyester or polyether.

The structure of a macromonomer having such a polymer structure as a graft chain is not particularly limited as long as the macromonomer has a substituent capable of reacting with a polymer main chain portion and satisfies the requirements of the embodiment. Preferably, a macromonomer having a reactive double bond group can suitably be used.

Examples of commercially-available macromonomers suitable for use in the synthesis of the specific resin include: AA-6 (trade name, manufactured by Toagosei Co., Ltd.), AA-10 (trade name, manufactured by Toagosei Co., Ltd.), AB-6 (trade name, manufactured by Toagosei Co., Ltd.), AS-6 (trade name, manufactured by Toagosei Co., Ltd.), AN-6 (trade name, manufactured by Toagosei Co., Ltd.), AW-6 (trade name, manufactured by Toagosei Co., Ltd.), AA-714 (trade name, manufactured by Toagosei Co., Ltd.), AY-707 (trade name, manufactured by Toagosei Co., Ltd.), AY-714 (trade name, manufactured by Toagosei Co., Ltd.), AK-5 (trade name, manufactured by Toagosei Co., Ltd.), AK-30 (trade name, manufactured by Toagosei Co., Ltd.), and AK-32 (trade name, manufactured by Toagosei Co., Ltd.); and BLENMER PP-100 (trade name, manufactured by NOF CORPORATION), BLENMER PP-500 (trade name, manufactured by NOF CORPORATION), BLENMER PP-800 (trade name, manufactured by NOF CORPORATION), BLENMER PP-1000 (trade name, manufactured by NOF CORPORATION), BLENMER 55-PET-800 (trade name, manufactured by NOF CORPORATION), BLENMER PME-4000 (trade name, manufactured by NOF CORPORATION), BLENMER PSE-400 (trade name, manufactured by NOF CORPORATION), BLENMER PSE-1300 (trade name, manufactured by NOF CORPORATION), and BLENMER 43PAPE-600B (trade name, manufactured by NOF CORPORATION). Of these, AA-6 (trade name, manufactured by Toagosei Co., Ltd.), AA-10 (trade name, manufactured by Toagosei Co., Ltd.), AB-6 (trade name, manufactured by Toagosei Co., Ltd.), AS-6 (trade name, manufactured by Toagosei Co., Ltd.), and AN-6 (trade name, manufactured by Toagosei Co., Ltd.), BLENMER PME-4000 (trade name, manufactured by NOF CORPORATION), etc are preferable.

The graft moiety (the portion having a graft chain) of the specific resin preferably includes at least a structural unit represented by any of Formulae (1) to (5).

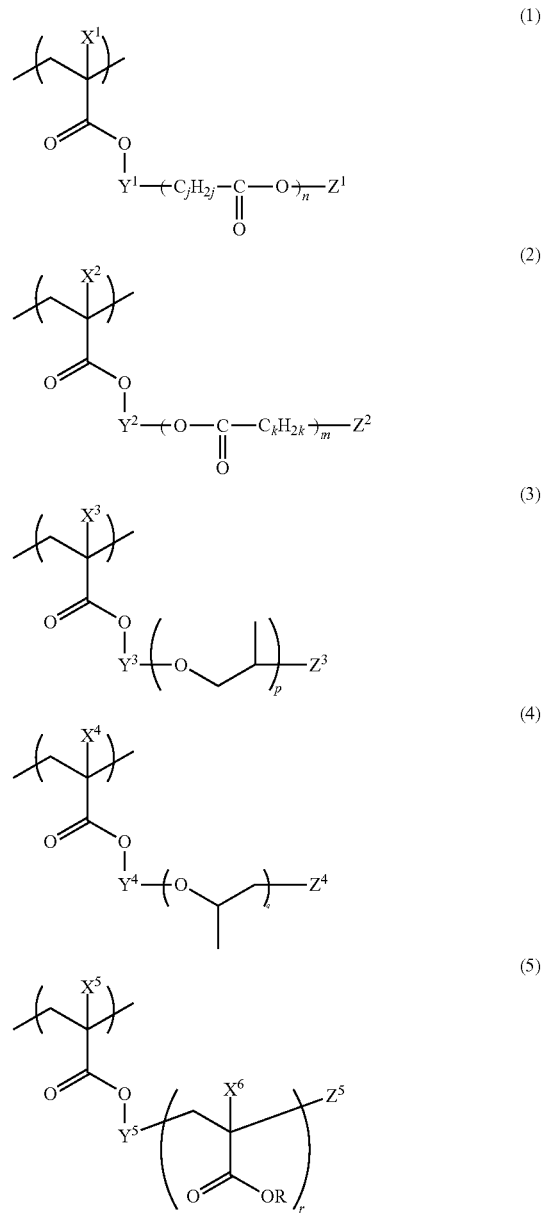

In Formulae (1) to (5), $X^1$, $X^2$, $X^3$, $X^4$, $X^5$, and $X^6$ each independently represents a hydrogen atom or a monovalent organic group. From the viewpoint of the limitations on synthesis, $X^1$, $X^2$, $X^3$, $X^4$, $X^5$, and $X^6$ each independently represent preferably a hydrogen atom or an alkyl group having from 1 to 12 carbon atoms, and each independently represent more preferably a hydrogen atom or a methyl group, particularly preferably a methyl group.

In Formulae (1) to (5), $Y^1$, $Y^2$, $Y^3$, $Y^4$, and $Y^5$ each independently represent a divalent linking group, and the linking group is not particularly restricted in terms of the structure thereof. Specific examples of the divalent linking group represented by $Y^1$, $Y^2$, $Y^3$, $Y^4$, or $Y^5$ include linking groups (Y-1) to (Y-20) shown below. In the structures shown below, A and B indicates the positions of bonding to the left end group and the right end group, respectively, in Formulae (1) to (5). Among the structures shown below, the divalent linking group is more preferably (Y-2) or (Y-13) from the viewpoint of ease of synthesis.

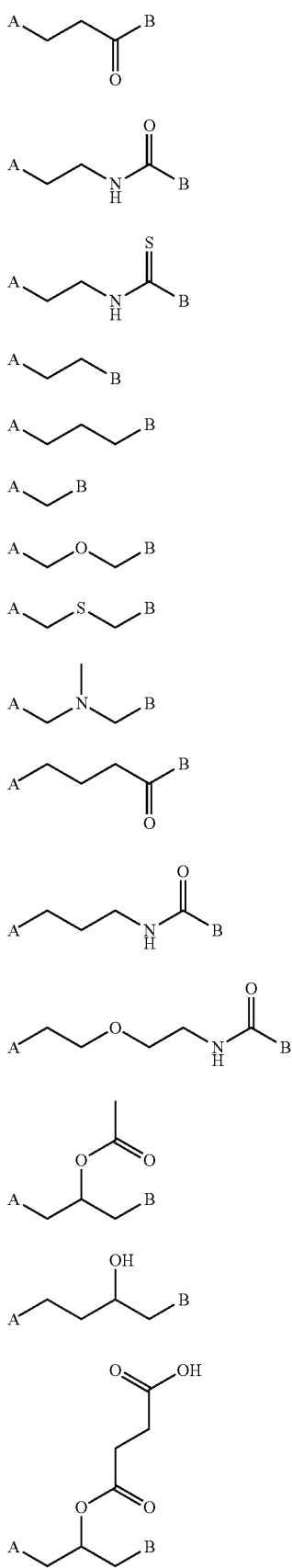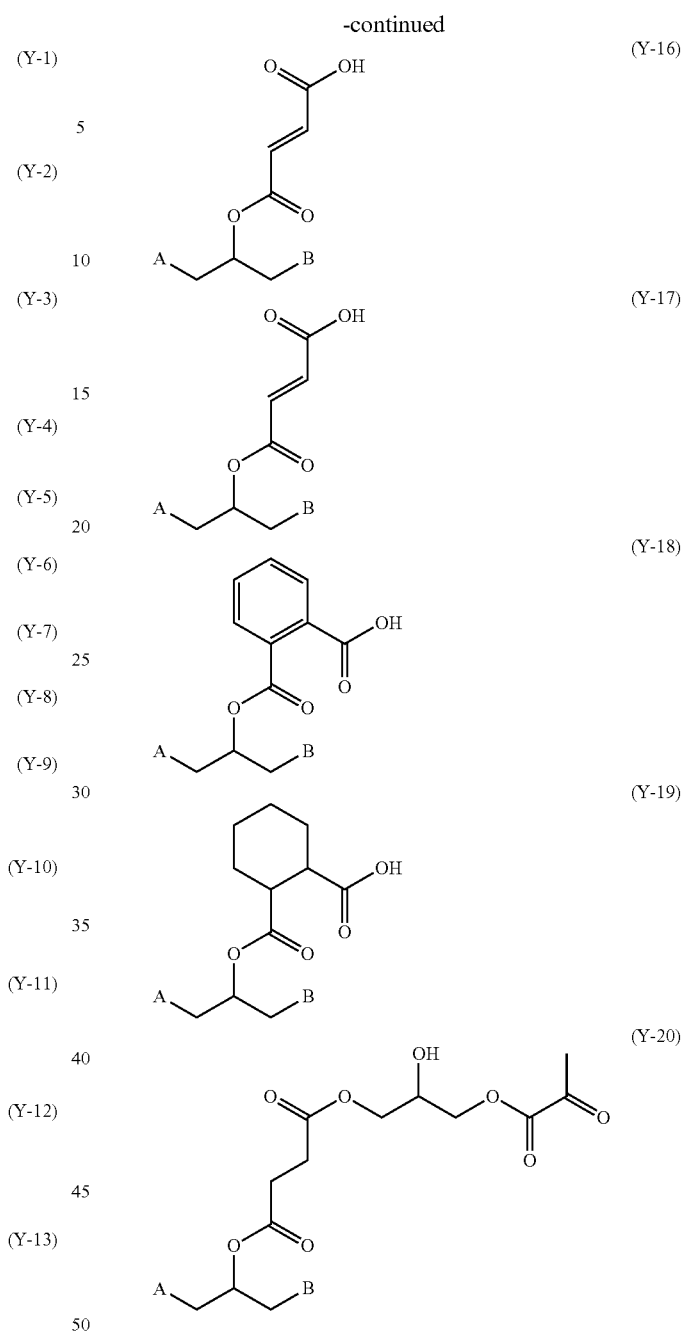

In Formulae (1) to (5), $Z^1$, $Z^2$, $Z^3$, $Z^4$, and $Z^5$ each independently represent a monovalent organic group. The structure of the organic group is not particularly limited. Specific examples thereof include an alkyl group, a hydroxyl group, an alkoxy group, an aryloxy group, a heteroaryloxy group, an alkylthio ether group, an arylthio ether group, a heteroaryl thioether group, and an amino group. From the viewpoint of, particularly, improvement in dispersibility, the organic groups represented by $Z^1$, $Z^2$, $Z^3$, $Z^4$, and $Z^5$ each preferably have a steric repulsion effect, and are each independently preferably an alkyl group having from 5 to 24 carbon atoms, and, particularly, are each independently more preferably a branched alkyl group having from 5 to 24 carbon atoms or a cyclic alkyl group having from 5 to 24 carbon atoms.

In Formulae (1) to (5), n, m, p, q, and r each represent an integer from 1 to 500. In Formula (1) and (2), j and k each independently represent an integer of from 2 to 8. From the viewpoints of dispersion stability and developability, j and k in Formulae (1) and (2) are each preferably an integer of from 4 to 6, most preferably 5.

In the specific resin, structural units represented by Formulae (1) to (5) are preferably contained in a range of from 10% by mass to 90% by mass, and more preferably contained in a range of from 30% by mass to 70% by mass, relative to the total mass of the specific resin. When structural units represented by Formulae (1) to (5) are contained in this range, the dispersibility of titanium black particles is high, and developability at the time of forming a light-shielding film is favorable.

In addition, the specific resin may contain two or more graft copolymers having different structures.

In Formula (5), R represents a hydrogen atom or a monovalent organic group, and the structure of the monovalent organic group is not particularly limited. R is preferably a hydrogen atom, an alkyl group, an aryl group, or a heteroaryl group, and more preferably a hydrogen atom or an alkyl group. When R represents an alkyl group, the alkyl group is preferably a straight-chain alkyl group having from 1 to 20 carbon atoms, a branched alkyl group having from 3 to 20 carbon atoms, or a cyclic alkyl group having from 5 to 20 carbon atoms, more preferably a straight-chain alkyl group having from 1 to 20 carbon atoms, and particularly preferably a straight-chain alkyl group having from 1 to 6 carbon atoms. In the specific resin, two or more types of R having different structures may be contained in mixture.

From the viewpoints of dispersion stability and developability, the structural unit represented by Formula (1) is more preferably a structural unit represented by the following Formula (1A).

From the viewpoints of dispersion stability and developability, the structural unit represented by Formula (2) is more preferably a structural unit represented by the following Formula (2A).

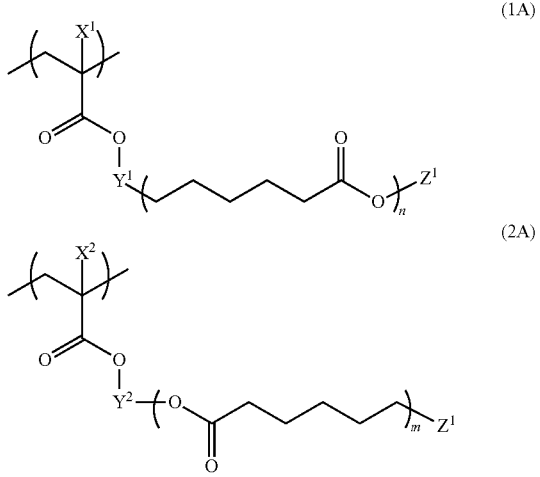

In Formula (1A), $X^1$, $Y^1$, $Z^1$, and n have the same definitions as those of $X^1$, $Y^1$, $Z^1$, and n in Formula (1), respectively, and preferable ranges thereof are also the same.

In Formula (2A), $X^2$, $Y^2$, $Z^2$, and m have the same definitions as those of $X^2$, $Y^2$, $Z^2$, and m in Formula (2), respectively, and preferable ranges thereof are also the same.

In addition to the graft moiety, a functional group capable of interacting with titanium black particles may be introduced into the specific resin.

Examples of the functional group capable of interacting with titanium black particles include an acid group, a basic group, a coordination group, and a reactive functional group, and these functional groups can be introduced into the specific resin by using a structural unit having an acid group, a structural unit having a basic group, a structural unit having a coordination group, and a reactive structural unit, respectively.

Examples of the acid group as a functional group capable of interacting with titanium black particles include a carboxylic acid group, a sulfonic acid group, a phosphoric acid group, and a phenolic hydroxyl group, and a particularly preferable example thereof is a carboxylic acid group, which has excellent adsorbability to titanium black particles and high dispersibility. The specific resin may have one type of, or two or more types of, these acid groups The introduction of the acid group also has an advantage in terms of improving the alkali developability of the specific resin.

When introduced as a copolymerization component in the specific resin, the content of structural units having an acid group is preferably from 0.1 mol % to 50 mol %, and, from the viewpoint of suppression of damage to image strength caused by alkaline development, particularly preferably from 1 mol % to 30 mol %, relative to the total structural units of the specific resin.

Examples of the basic group as a functional group capable of interacting with titanium black particles include a primary amino group, a secondary amino group, a tertiary amino group, a hetero ring having an N atom, and an amido group. A particularly preferable example is a tertiary amino group, which has excellent adsorbability to pigment and high dispersibility. One type of, or at least one type of, these basic groups may be incorporated into the specific resin.

When introduced as a copolymerization component in the specific resin, the content of structural units having a basic group is preferably from 0.01 mol % to 50 mol %, and, from the viewpoint of suppression of developability inhibition, particularly preferably from 0.01 mol % to 30 mol %, relative to the total structural units of the specific resin.

Examples of the coordination group and the reactive functional group as a functional group capable of interacting with titanium black particles include an acetylacetoxy group, a trialkoxysilyl group, an isocyanate group, an acid anhydride, and an acid chloride. A particularly preferable example is an acetylacetoxy group, which has excellent adsorbability to pigment and high dispersibility. The specific resin may have one type of, or at least one type of, these groups.

When introduced as a copolymerization component in the specific resin, the content of structural units having a coordination group or reactive structural units is preferably from 0.5 mol % to 50 mol %, and, from the viewpoint of suppressing developability inhibition, particularly preferably from 1 mol % to 30 mol %, relative to the total structural units of the specific resin.

When the specific resin in each embodiment has, besides the graft moiety, a functional group capable of interacting with titanium black particles, the specific resin may contain any of the various functional group capable of interacting with titanium black particles as described above.

The manner of the introduction of these functional groups is not particularly limited. However, it is preferable that such a functional group has been introduced into the specific resin by including at least one structural unit obtained from a monomer represented by any one of the following Formulae (i) to (iii) in the specific resin.

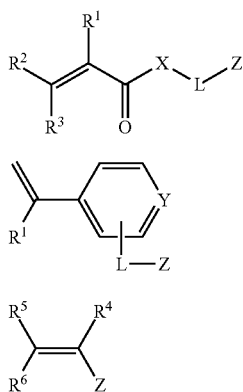

In Formulae (i) to (iii), $R^1$, $R^2$, and $R^3$ each independently represent a hydrogen atom, a halogen atom (e.g., a fluorine atom, a chlorine atom, or a bromine atom), or an alkyl group having from 1 to 6 carbon atoms (e.g., a methyl group, an ethyl group, or a propyl group).

$R^1$, $R^2$, and $R^3$ each independently represent more preferably a hydrogen atom or an alkyl group having from 1 to 3 carbon atoms, and each independently represent most preferably a hydrogen atom or a methyl group. $R^2$ and $R^3$ each represent particularly preferably a hydrogen atom.

X in Formula (1) represents an oxygen atom (—O—) or an imino group (—NH—), and preferably represents an oxygen atom.

Y in Formula (ii) represents a methine group or a nitrogen atom.

L in Formulae (i) to (ii) represents a single bond or a divalent linking group. Examples of the divalent linking group include divalent aliphatic groups (e.g., alkylene groups, substituted alkylene groups, alkenylene groups, substituted alkenylene groups, alkynylene groups, and substituted alkynylene groups), divalent aromatic groups (e.g., arylene groups and substituted arylene groups), divalent heterocyclyl groups, and combinations of any of these groups with at least one of an oxygen atom (—O—), a sulfur atom (—S—), an imino group (—NH—), a substituted imino group (—NR$^{31}$—, wherein R$^{31}$ represents an aliphatic group, an aromatic group, or a heterocyclyl group), or a carbonyl group (—CO—).

The divalent aliphatic group may have a cyclic structure or a branched structure. The number of carbon atoms in the aliphatic group is preferably from 1 to 20, more preferably from 1 to 15, and further preferably from 1 to 10. The aliphatic group is more preferably a saturated aliphatic group, as compared to an unsaturated aliphatic group. The aliphatic group may have a substituent. Examples of the substituent include a halogen atom, a hydroxyl group, an aromatic group, and a heterocyclyl group.

The number of carbon atoms in the divalent aromatic group is preferably from 6 to 20 carbon atoms, more preferably from 6 to 15 carbon atoms, and most preferably from 6 to 10 carbon atoms. The aromatic group may have a substituent. Examples of the substituent include a halogen atom, a hydroxyl group, an aliphatic group, an aromatic group, and a heterocyclyl group.

The divalent heterocyclyl group preferably has a five- or six-membered ring as a heterocyclic ring. To the heterocyclic ring, at least one of another heterocyclic ring, an aliphatic ring, or an aromatic ring may be condensed. The heterocyclyl group may have a substituent. Examples of the substituent include a halogen atom, a hydroxy group, an oxo group (=O), a thioxo group (=S), an imino group (=NH), a substituted imino group (=N—R$^{32}$, wherein R$^{32}$ represents an aliphatic group, an aromatic group, or a heterocyclyl group), an aliphatic group, an aromatic group, and a heterocyclyl group.

L is preferably a single bond, an alkylene group, or a divalent linking group containing an oxyalkylene structure. The oxyalkylene structure is more preferably an oxyethylene structure or an oxypropylene structure. L may contain a polyoxyalkylene structure containing a repeat composed of two or more oxyalkylene structures. The polyoxyalkylene structure is preferably a polyoxyethylene structure or a polyoxypropylene structure. The polyoxyethylene structure is represented by —(OCH$_2$CH$_2$)$_n$—, wherein n represents preferably an integer of 2 or greater, and more preferably an integer of from 2 to 10.

In Formulae (i) to (iii), Z represents a functional group capable of interacting with titanium black particles, which is separate from the graft moiety, and the functional group is preferably a carboxylic acid group or a tertiary amino group, and more preferably a carboxylic acid group.

In Formula (iii), $R^4$, $R^5$, and $R^6$ each independently represent a hydrogen atom, a halogen atom (e.g., fluorine, chlorine, or bromine), an alkyl group having from 1 to 6 carbon atoms (e.g., a methyl group, an ethyl group, or a propyl group), —Z, or -L-Z. Here, L and Z have the same definitions as those of L and Z described above, respectively, and preferable examples thereof are also the same.

$R^4$, $R^5$, and $R^6$ each independently represent preferably a hydrogen atom or an alkyl group having from 1 to 3 carbon atoms, and more preferably a hydrogen atom.

In the first to third embodiments, a compound in which R', $R^2$, and $R^3$ each independently represent a hydrogen atom or a methyl group, L represents an alkylene group or a divalent linking group containing an oxyalkylene structure, X represents an oxygen atom or an imino group, and Z represents a carboxylic acid group, is preferable as a monomer represented by Formula (i).

A compound in which $R^1$ represents a hydrogen atom or a methyl group, L represents an alkylene group, Z represents carboxylic acid group, and Y represents a methine group, is preferable as a monomer represented by Formula (ii).

A compound in which $R^4$, $R^5$, and $R^6$ each independently represent a hydrogen atom or a methyl group, L represents a single bond or an alkylene group, and Z represents carboxylic acid group, is preferable as a monomer represented by Formula (iii).

Representative examples of monomers (compounds) represented by Formulae (i) to (iii) are described below.

Examples of the monomers include: methacrylic acid; crotonic acid; isocrotonic acid; a reaction product of a compound having an addition-polymerizable double bond and a hydroxyl group in a molecule thereof (e.g., 2-hydroxyethyl methacrylate) and a succinic anhydride; a reaction product of a compound having an addition-polymerizable double bond and a hydroxyl group in a molecule thereof and a phthalic anhydride; a reaction product of a compound having an addition-polymerizable double bond and a hydroxyl group in a molecule thereof and a tetrahydroxyphthalic anhydride; a reaction product of a compound having an addition-polymerizable double bond and a hydroxyl group in a molecule thereof and a trimellitic anhydride; a reaction product of a compound having an addition-polymerizable double bond and a hydroxyl group in a molecule thereof and a pyromellitic anhydride; acrylic acid; acrylic acid dimer; acrylic acid oligomer; maleic acid; itaconic acid; fumaric acid; 4-vinylbenzoic acid; vinylphenol; and 4-hydroxyphenylmethacrylamide.

From the viewpoints of interaction with titanium black particles, dispersion stability, and permeability to a developer, the content of functional groups capable of interacting with titanium black particles, such as a monomer having an acidic group, in the specific resin is preferably from 0.05% by mass to 90% by mass, more preferably from 1.0% by mass to 80% by mass, and further preferably from 10% by mass to 70% by mass, relative to the specific resin.

For the purpose of improving various properties such as image strength, the specific resin contained in the titanium black dispersion of each embodiment may further include other structural units having various functions (such as a structural unit having, for example, a functional group having affinity for a dispersion medium used in the dispersion) as a copolymerization component, in addition to the graft moiety (the structural unit having a graft chain) and the structural unit having a functional group capable of interacting with titanium black particles, as long as the effects of the invention are not impaired.

Examples of the copolymerization component which can be copolymerized in the specific resin include radical polymerizable compounds selected from acrylic acid esters, methacrylic acid esters, styrenes, acrylonitriles, and methacrylonitriles.

These copolymerization components may be used singly, or in combination of two or more thereof. The content of these copolymerization components preferable for use in the specific resin is from 0 mol % to 90 mol %, and particularly preferably from 0 mol % to 60 mol %. Sufficient pattern formation can be achieved with a content within the above range.

Examples of solvents for use in the synthesis of the specific resin include ethylene dichloride, cyclohexanone, methyl ethyl ketone, acetone, methanol, ethanol, propanol, butanol, ethylene glycol monomethyl ether, ethylene glycol monoethyl ether, 2-methoxyethyl acetate, 1-methoxy-2-propanol, 1-methoxy-2-propyl acetate, N,N-dimethylformamide, N,N-dimethylacetamide, dimethylsulfoxide, toluene, ethyl acetate, methyl lactate, and ethyl lactate. These solvents may be used singly, or in mixture of two or more thereof.

Specific examples of the specific resin include Exemplary Compounds 1 to 53 shown below. The numbers added to each structural unit (main chain portion) indicate percent by mass.

Exemplary Compound 1

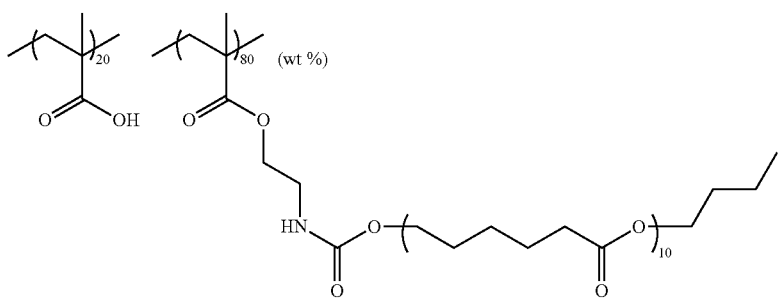

Exemplary Compound 2

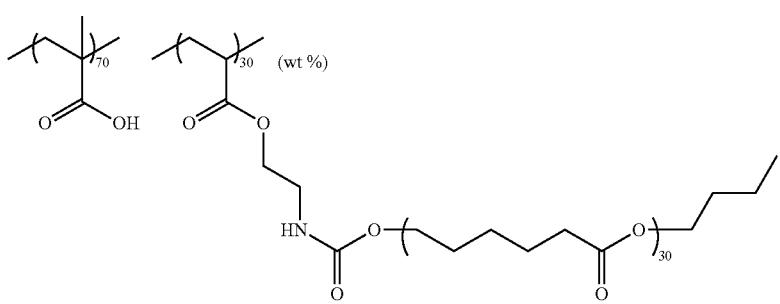

Exemplary Compound 3

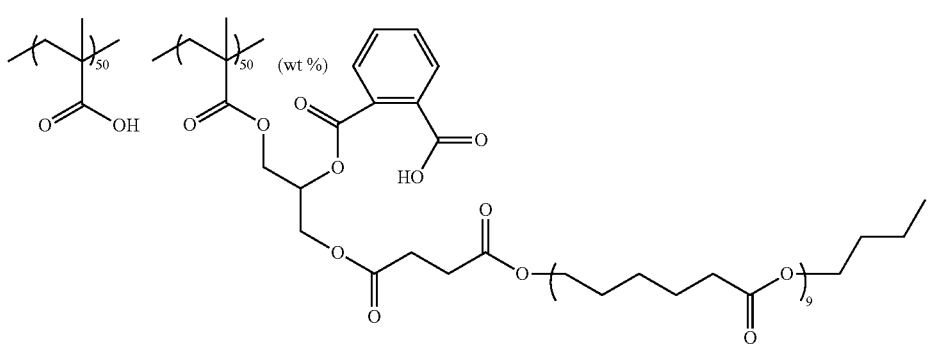

Exemplary Compound 4
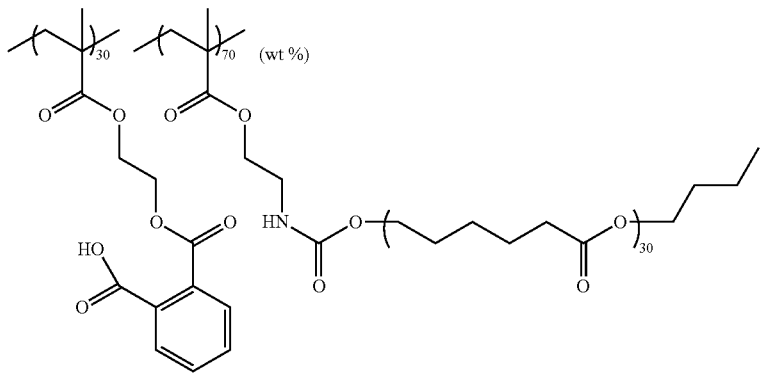
Exemplary Compound 5
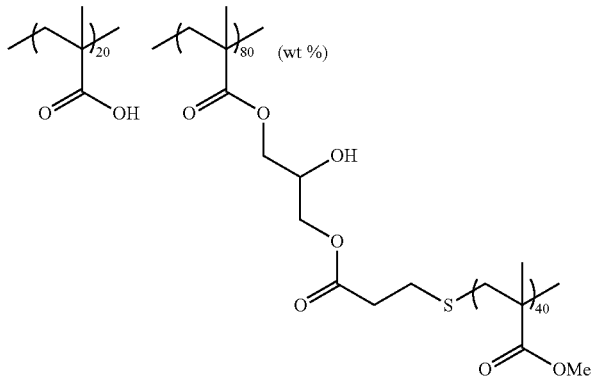
Exemplary Compound 6
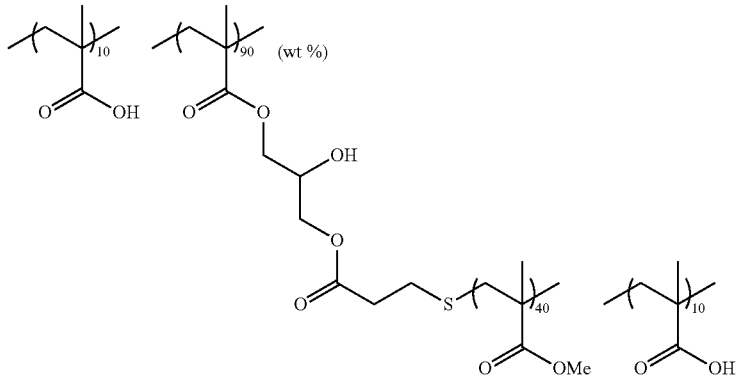

-continued
Exemplary Compound 7
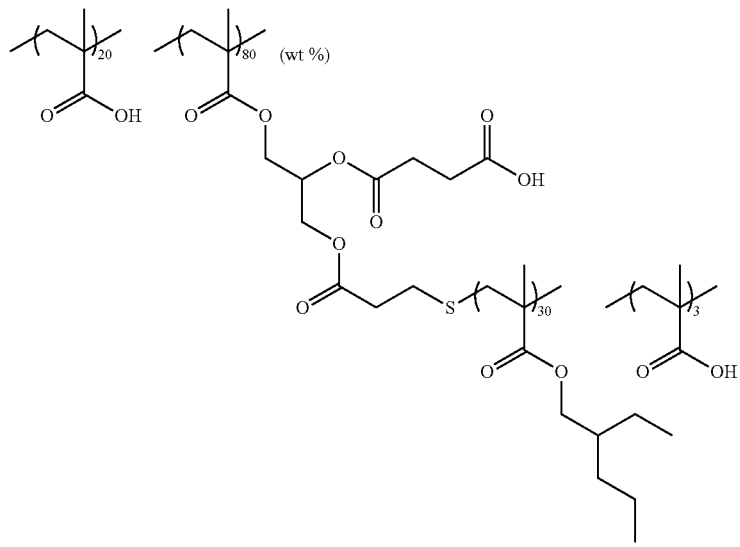
Exemplary Compound 8
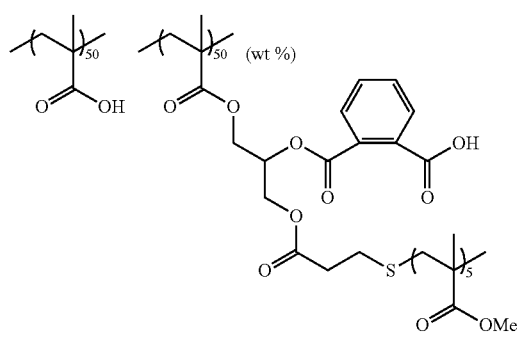
Exemplary Compound 9
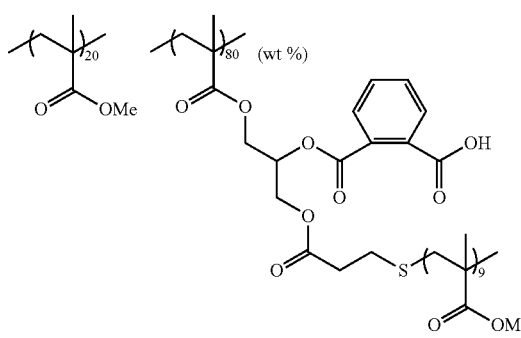
Exemplary Compound 10
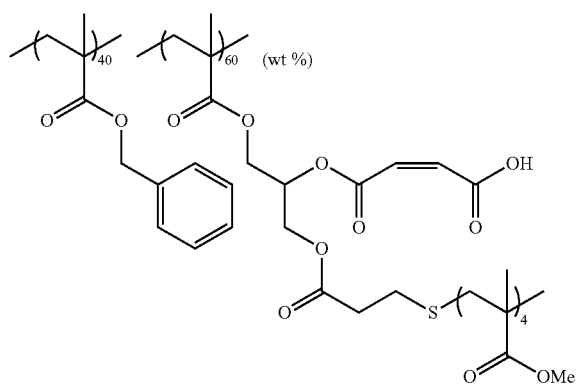
Exemplary Compound 11
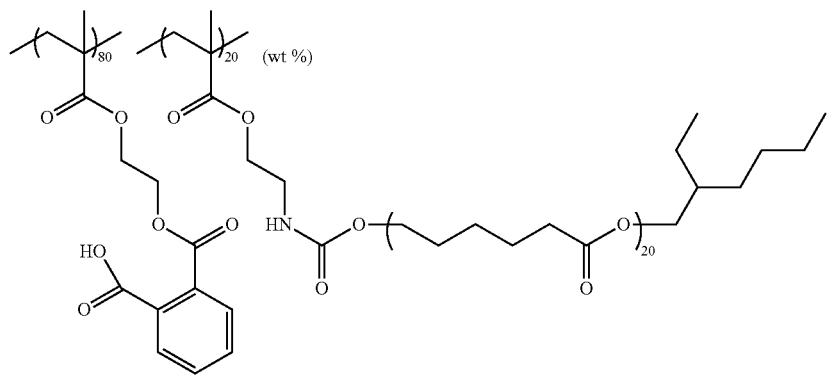

-continued
Exemplary Compound 12
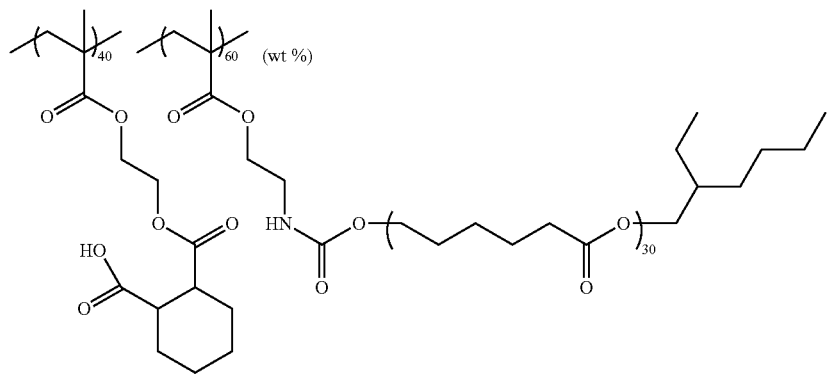
Exemplary Compound 13
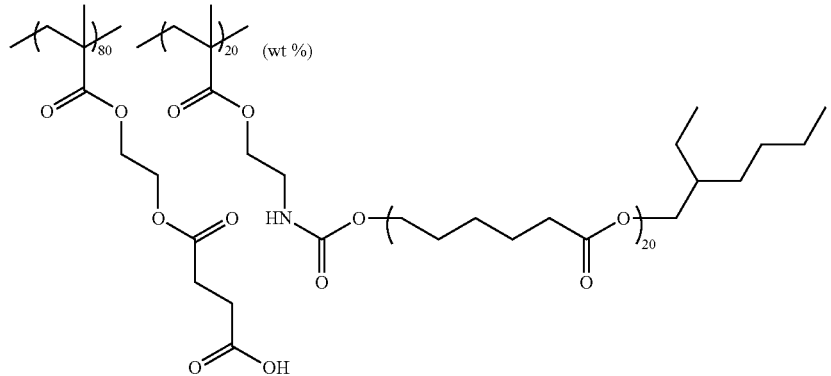
Exemplary Compound 14
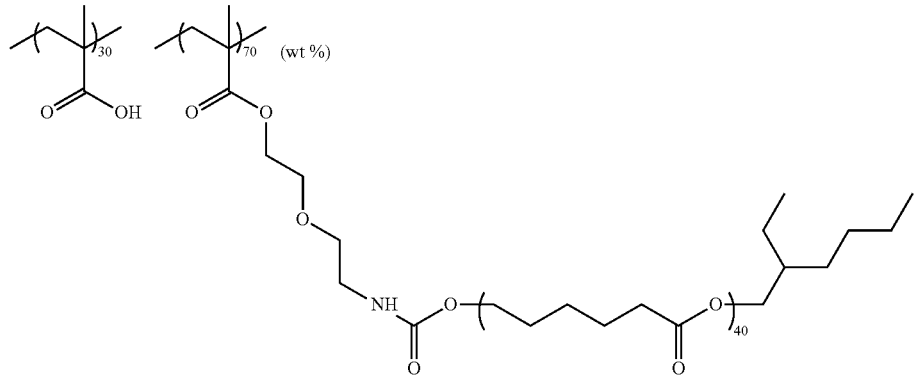
Exemplary Compound 15
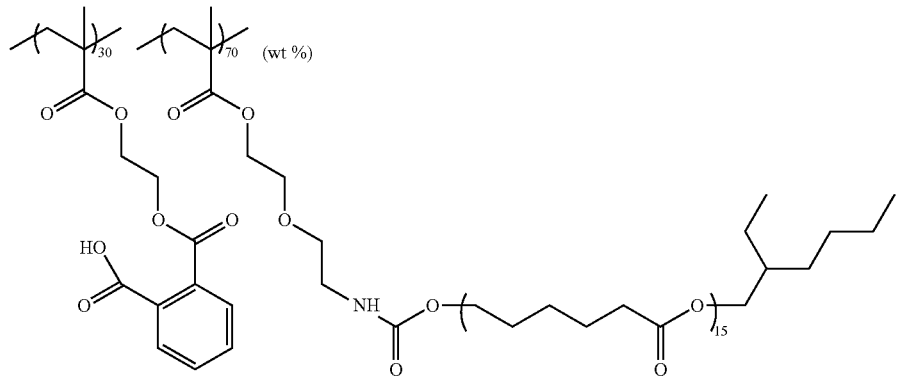

-continued
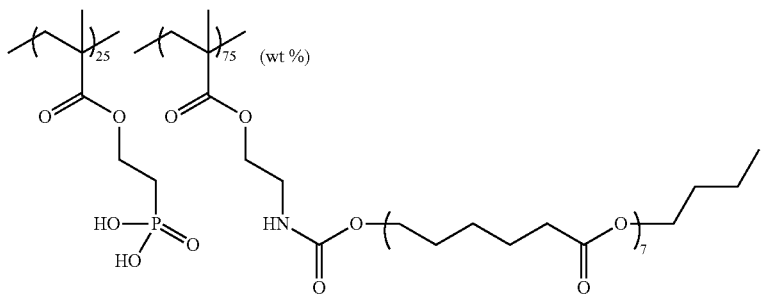
Exemplary Compound 16
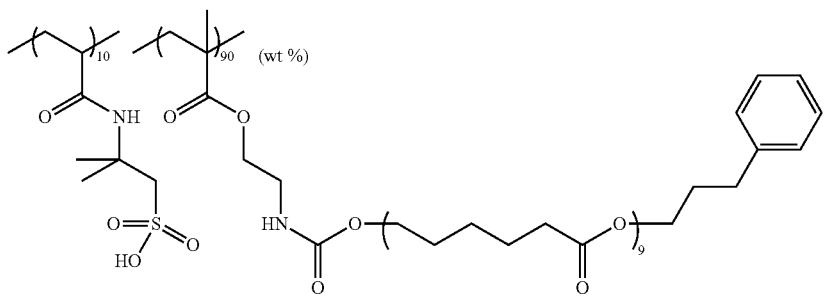
Exemplary Compound 17
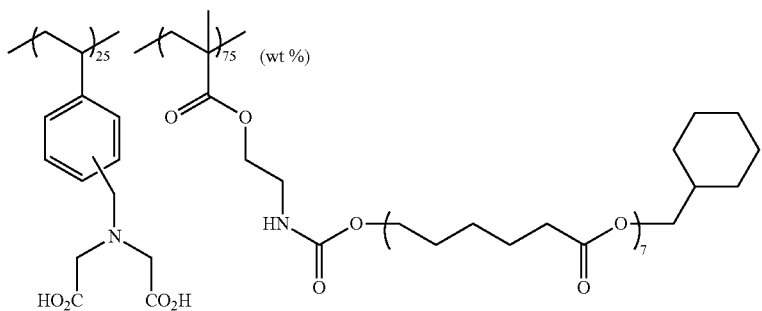
Exemplary Compound 18
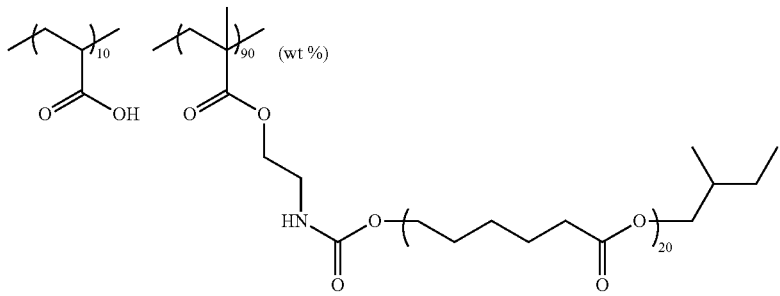
Exemplary Compound 19
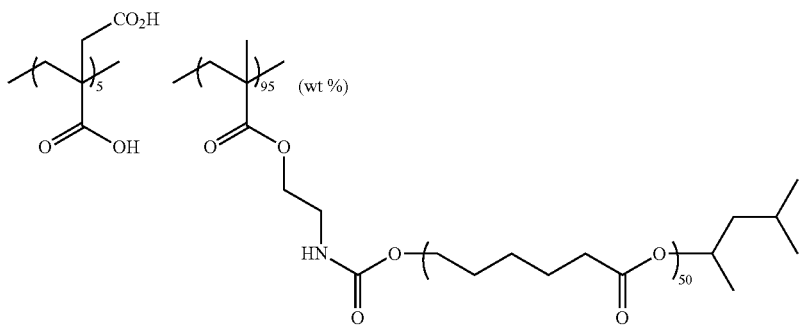
Exemplary Compound 20

-continued
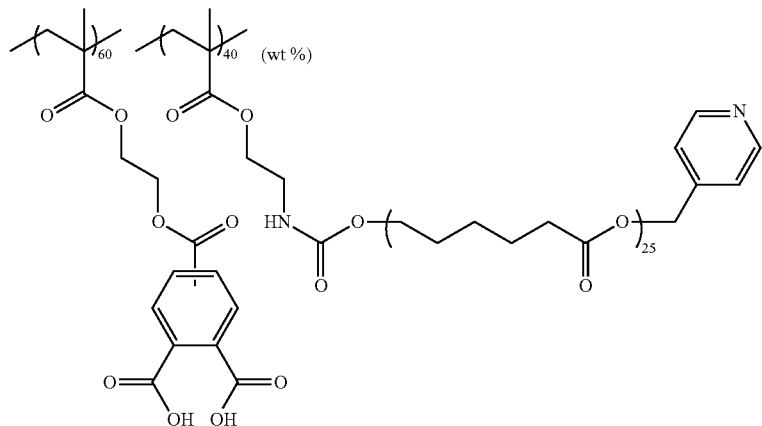
Exemplary Compound 21
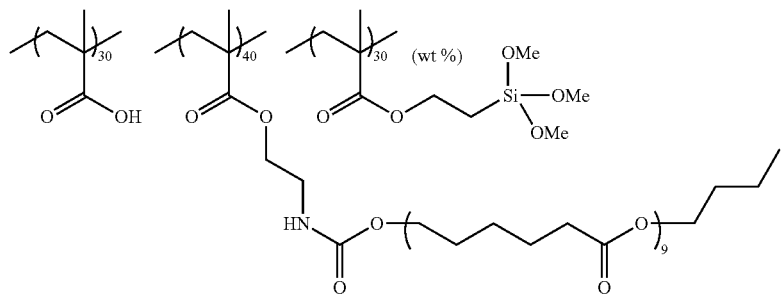
Exemplary Compound 22
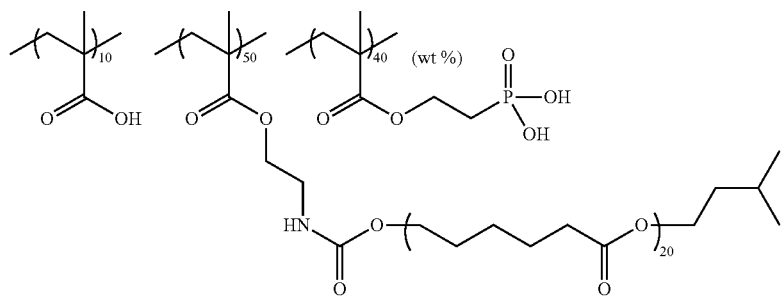
Exemplary Compound 23
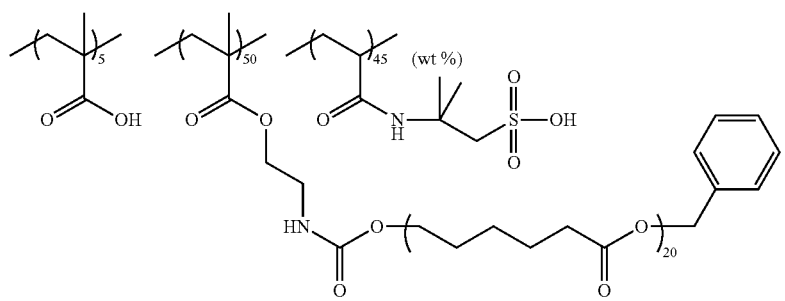
Exemplary Compound 24
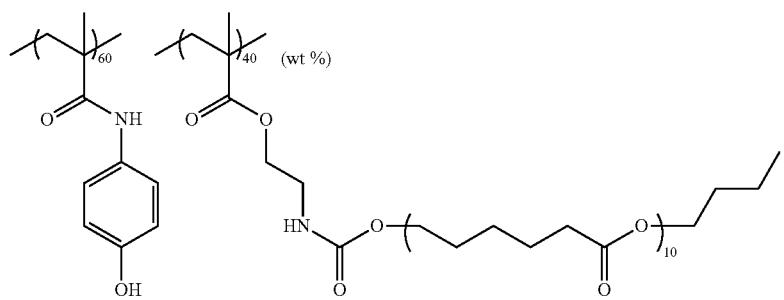
Exemplary Compound 25

-continued
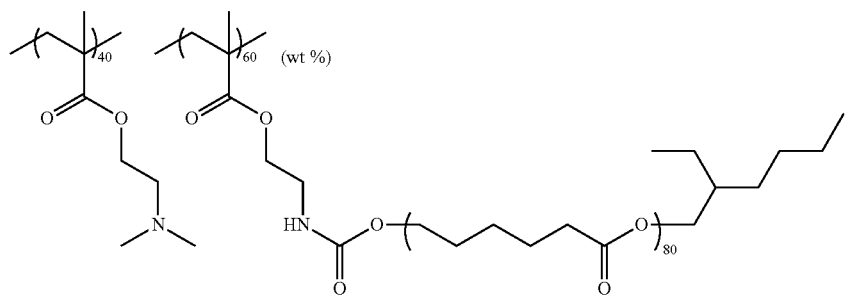
Exemplary Compound 26
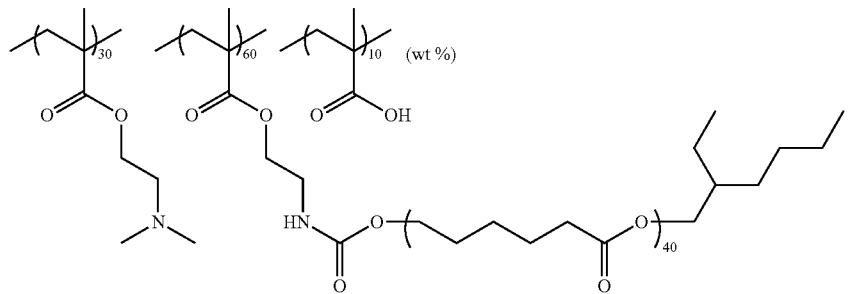
Exemplary Compound 27
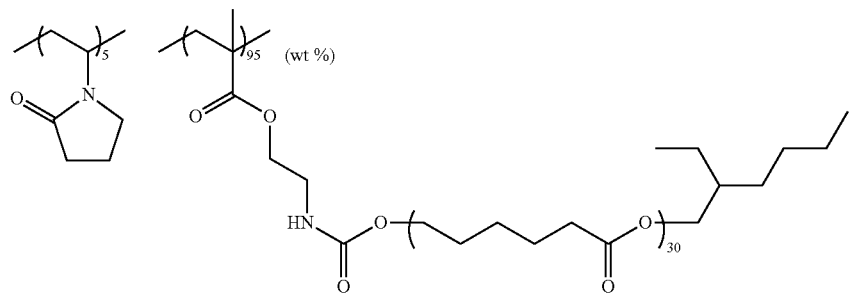
Exemplary Compound 28
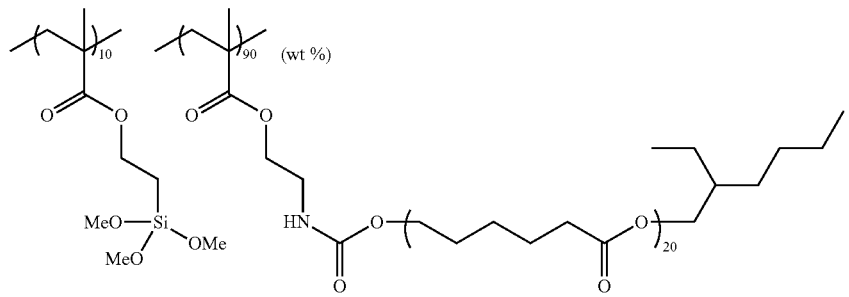
Exemplary Compound 29
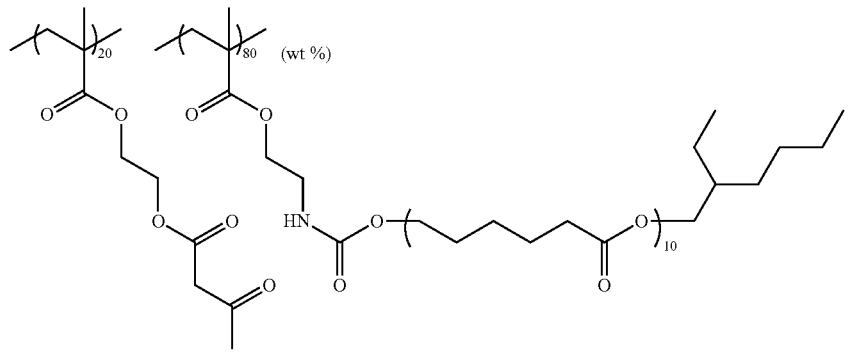
Exemplary Compound 30

-continued
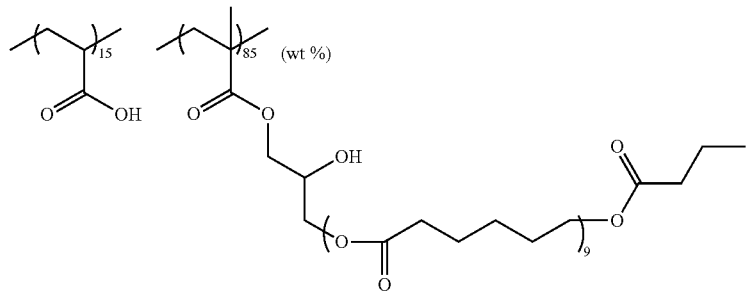
Exemplary Compound 31
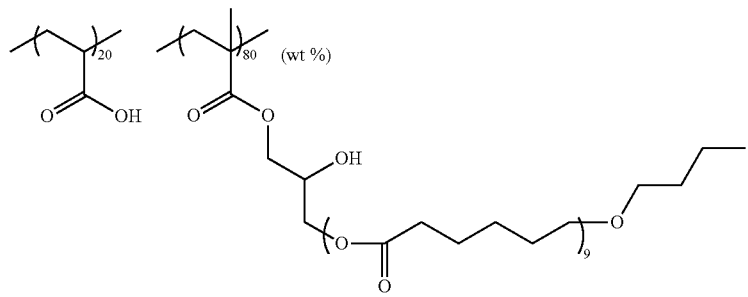
Exemplary Compound 32
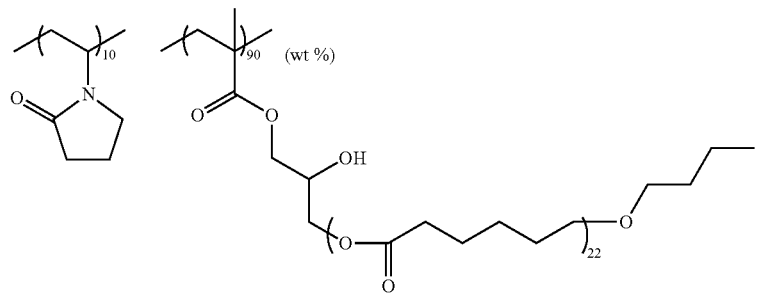
Exemplary Compound 33
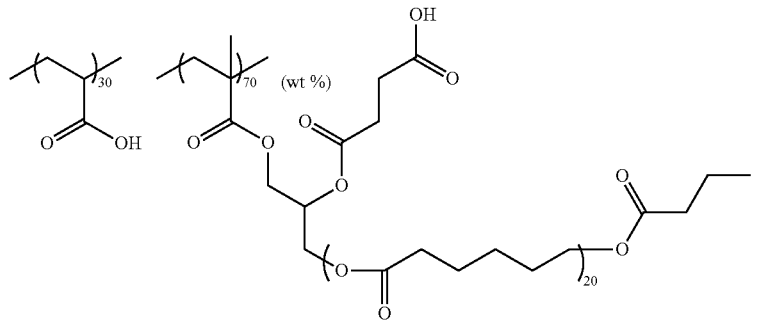
Exemplary Compound 34
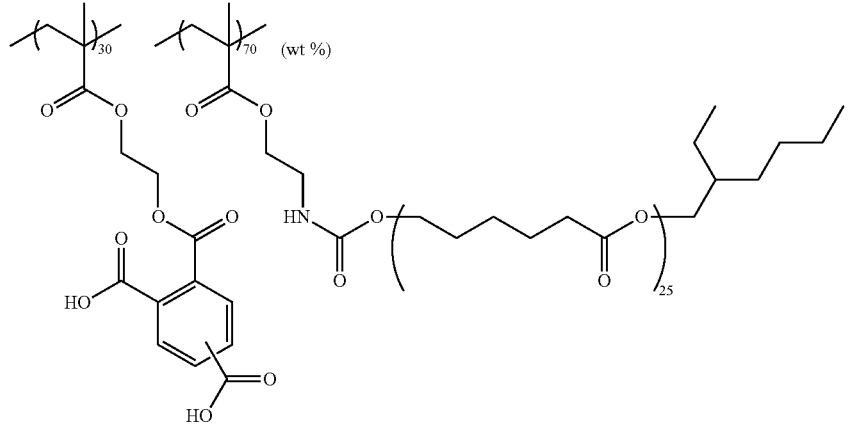
Exemplary Compound 35

-continued
Exemplary Compound 36
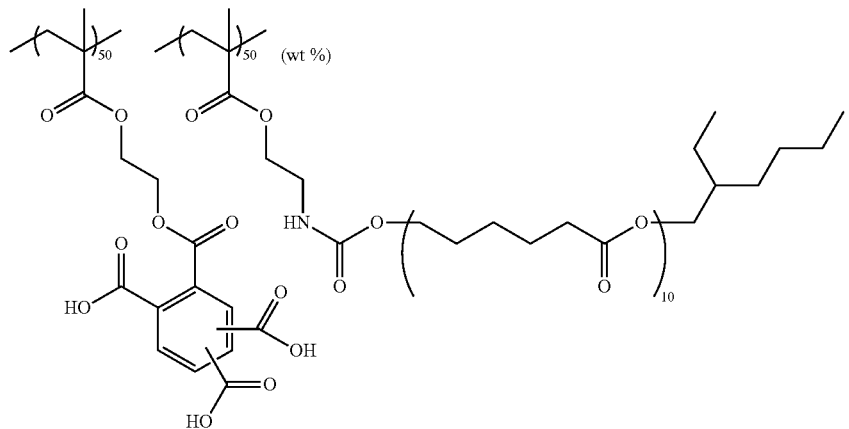
Exemplary Compound 37
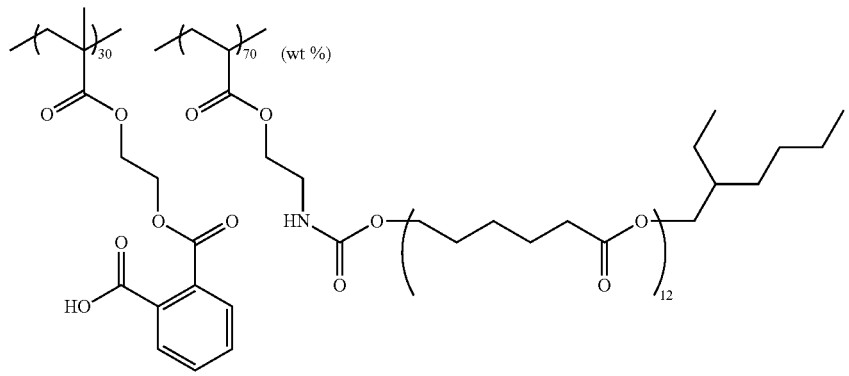
Exemplary Compound 38
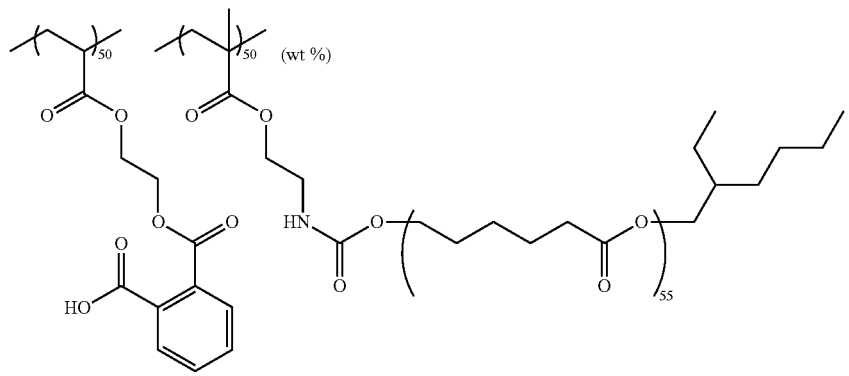
Exemplary Compound 39
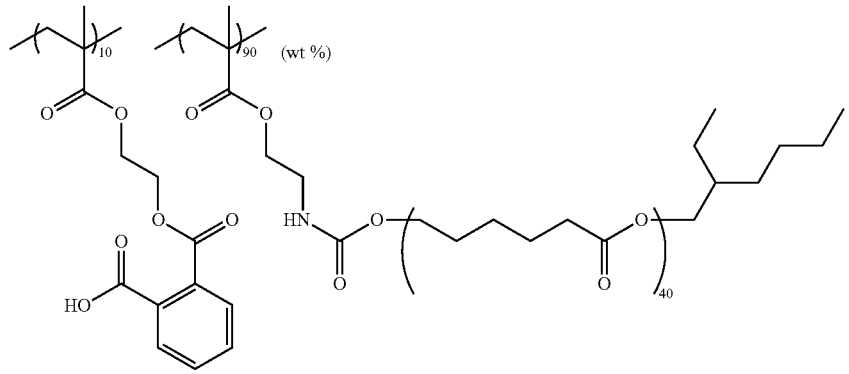

-continued
Exemplary Compound 40
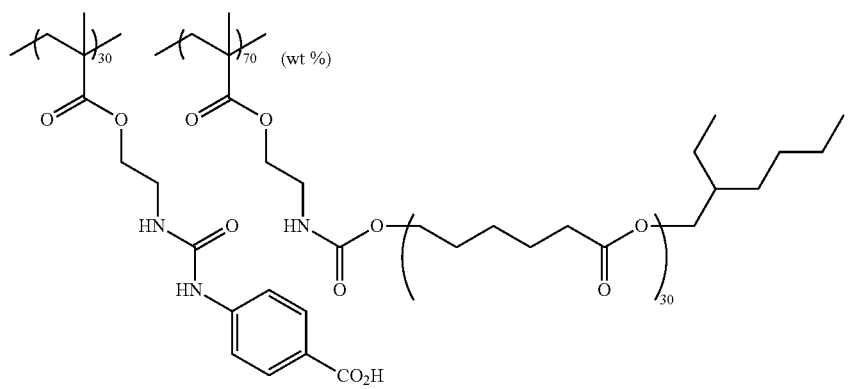
Exemplary Compound 41
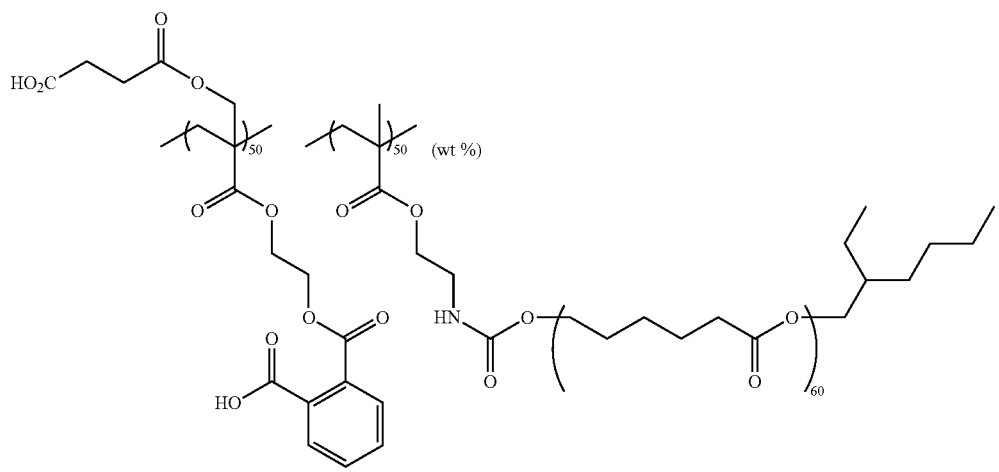
Exemplary Compound 42
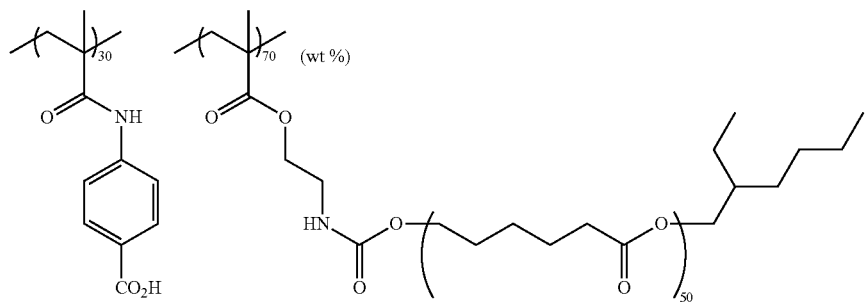

-continued
Exemplary Compound 43
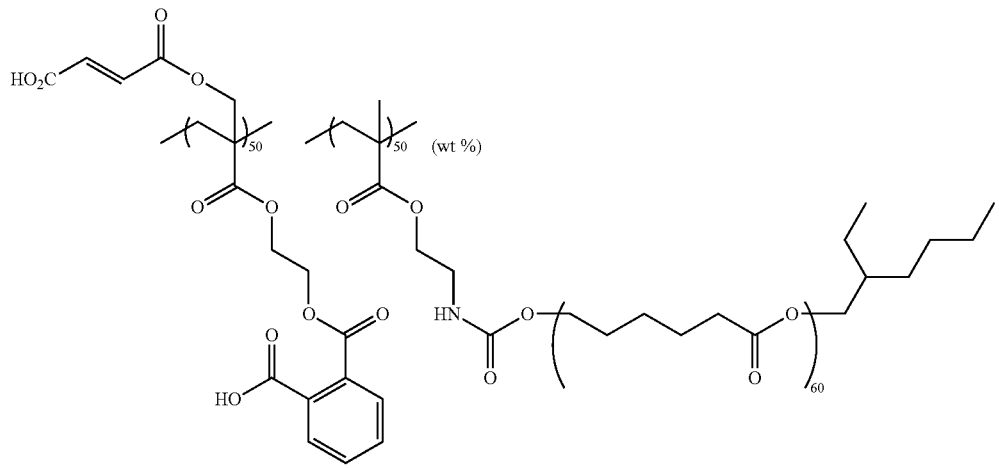
Exemplary Compound 44
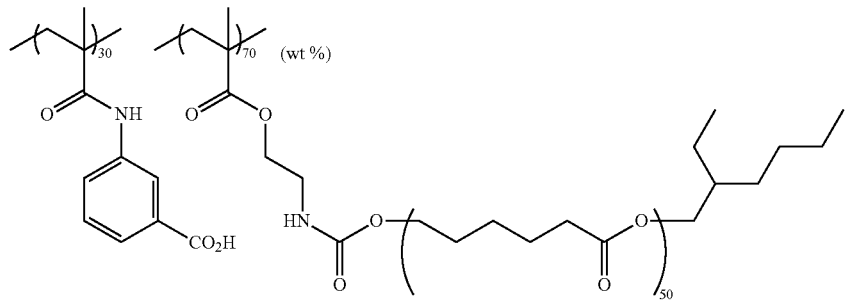
Exemplary Compound 45
Exemplary Compound 46
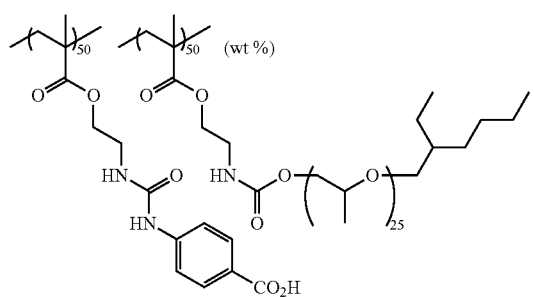
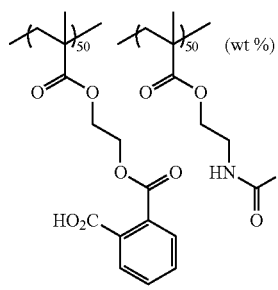
Exemplary Compound 47
Exemplary Compound 48
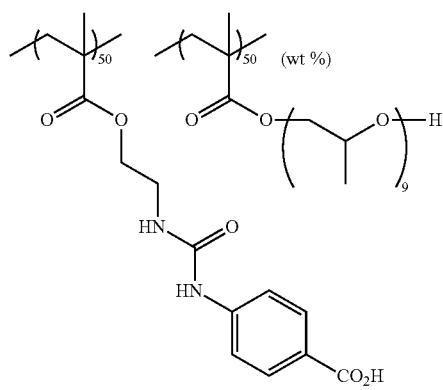
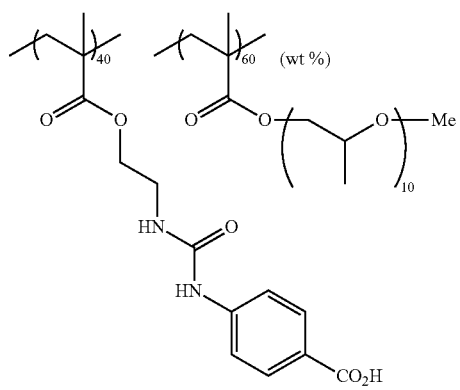

Exemplary Compound 49
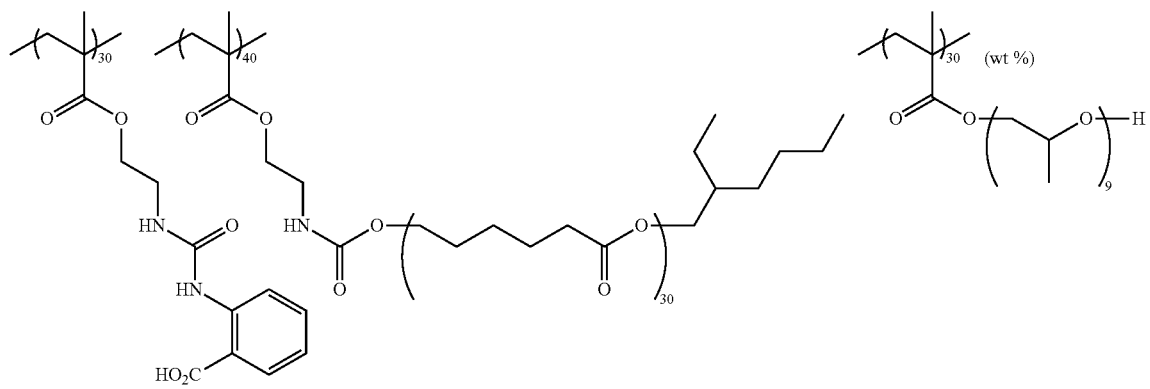
Exemplary Compound 50
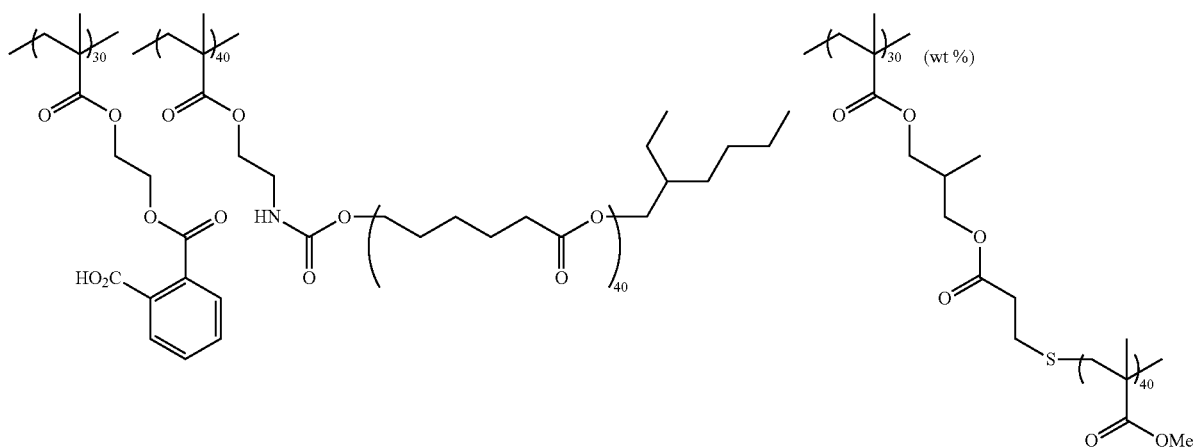
Exemplary Compound 51
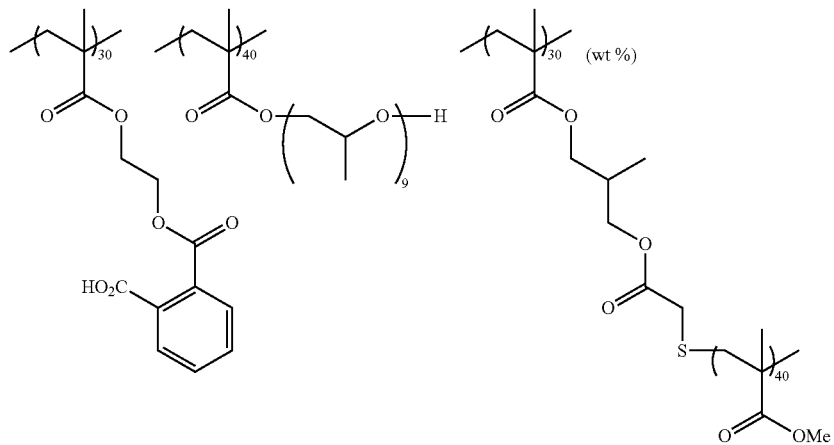

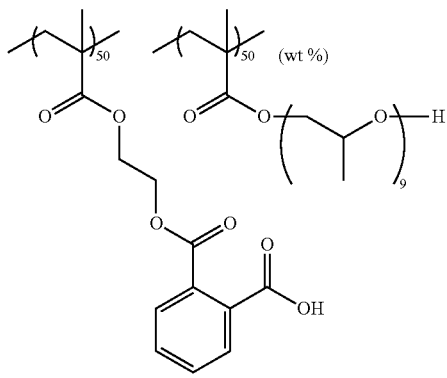

Exemplary Compound 52

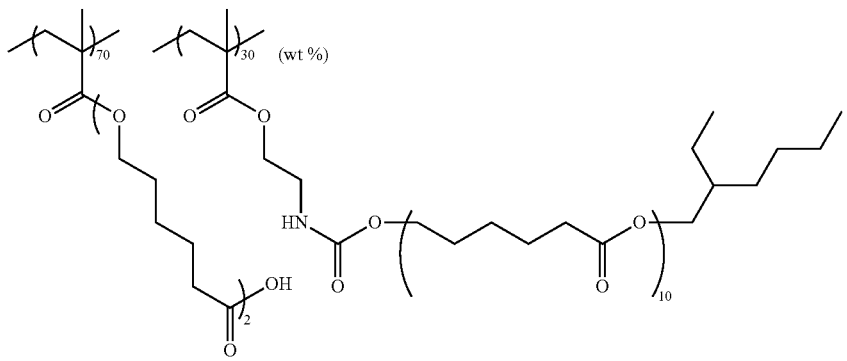

Exemplary Compound 53

The content of dispersant in the titanium black dispersion of each embodiment is preferably from 1% by mass to 90% by mass, more preferably from 3% by mass to 70% by mass, relative to the total solid mass of dispersed objects (including dispersed objects consisting of titanium black particles, and other coloring agents).

The content of dispersant in the photosensitive resin composition of each embodiments is preferably from 1% by mass to 90% by mass, more preferably from 3% by mass to 70% by mass, relative to the total solid mass of dispersed objects (including dispersed objects consisting of titanium black particles, and other coloring agents).

(C) Organic Solvent

The titanium black dispersions and the photosensitive resin compositions of the first to third embodiments include an organic solvent.

Examples of the organic solvent include, but are not limited to, acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxy methoxy ethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethyl sulfoxide, γ-butyrolactone, ethyl acetate, butyl acetate, methyl lactate, and ethyl lactate.

The organic solvent may be used singly, or in combination of two or more thereof. When two or more organic solvents are combined, a mixed solution composed of two or more selected from methyl 3-ethoxypropionate, ethyl 3-ethoxypropionate, ethylcellosolve acetate, ethyl lactate, diethylene glycol dimethyl ether, butyl acatate, methyl 3-methoxypropionate, 2-heptanone, cyclohexanone, ethyl carbitol acetate, butyl carbitol acetate, propylene glycol methyl ether, and propylene glycol methyl ether acetate is particularly preferable.

The amount of organic solvent contained in the titanium black dispersion is preferably from 10% by mass to 80% by mass, more preferably from 20% by mass to 70% by mass, and even more preferably from 30% by mass to 65% by mass, relative to the total amount of the dispersion.

The amount of organic solvent contained in the photosensitive resin composition is preferably from 10% by mass to 90% by mass, more preferably from 20% by mass to 80% by mass, even more preferably from 25% by mass to 75% by mass, relative to the total mass of the composition.

(D) Photopolymerizable Compound

The photosensitive resin compositions of the first to third embodiments include a photopolymerizable compound.

The photopolymerizable compound is preferably a compound that has at least one addition-polymerizable ethylenic unsaturated group, and that has a boiling point under normal pressure of 100° C. or higher.

Examples of the compound having at least one addition-polymerizable ethylenic unsaturated group and having a boiling point of 100° C. or higher under normal pressure include: monofunctional acrylates or methacrylates such as polyethylene glycol mono(meth)acrylate, polypropylene glycol mono(meth)acrylate, and phenoxyethyl (meth)acrylate; polyfunctional acrylates or methacrylates such as polyethylene glycol di(meth)acrylate, trimethylolethane tri(meth)acrylate, neopentyl glycol di(meth)acrylate, pentaerythritol tri (meth)acrylate, pentaerythritol tetra(meth)acrylate, dipentaerythritol hexa(meth)acrylate, hexanediol (meth) acrylate, trimethylolpropane tri(acryloyloxypropyl) ether, tri (acryloyloxyethyl) isocyanurate, a product obtained by addition of ethylene oxide or propylene oxide to a polyfunctional alcohol such as glycerine or trimethylolethane and subsequent (meth)acrylation thereof, a product obtained by poly (meth)acrylation of pentaerythritol or dipentaerythritol, urethane acrylates such as those described in Japanese Examined Patent Application Publication (JP-B) No. 48-41708, JP-B No. 50-6034, and JP-A No. 51-37193, polyester acrylates such as those described in JP-A No. 48-64183, JP-B No. 49-43191 and JP-B No. 52-30490, and epoxy acrylates, which are reaction products of epoxy resins and (meth)acrylic acid.

Further, photocurable monomers and oligomers described in Nihon Secchaku Kyoukaishi (Journal of the Adhesion Society of Japan), Vol. 20, No. 7, pp. 300 to 308 can also be used.

Compounds which are obtained by adding ethylene oxide or propylene oxide to a polyfunctional alcohol and (meth) acrylating the resultant, and which are described as Formulas (1) and (2) together with specific examples thereof in JP-A No. 10-62986, can also be used.

In particular, dipentaerythritol penta(meth)acrylate, dipentaerythritol hexa(meth)acrylate, and structures in which acryloyl groups of either of these compounds are linked to the dipentaerythritol via ethyleneglycol or propyleneglycol residues, are preferable. Oligomer types thereof can also be used.

Urethane acrylates such as those described in JP-B No. 48-41708, JP-A No. 51-37193, JP-B No. 2-32293, and JP-B No. 2-16765, and urethane compounds having an ethyleneoxide skeleton and described in JP-B Nos. 58-49860, 56-17654, 62-39417, and 62-39418, are also preferable. Photopolymerizable compositions having excellent photoresponsive speed can be obtained by using addition-polymerizable compounds having an amino structure or a sulfide structure in a molecule thereof, which are described in JP-A Nos. 63-277653, 63-260909, and 1-105238. Examples of commercially available products include: urethane oligomers UAS-10 and UAB-140 (tradenames, manufactured by NIPPON PAPER CHEMICALS CO., LTD.); UA-7200 (tradename, manufactured by Shin-Nakamura Chemical Co., Ltd.); DPHA-40H (tradename, manufactured by Nippon Kayaku Co., Ltd.); and UA-306H, UA-306T, UA-306I, AH-600, T-600, and AI-600 (tradenames, manufactured by Kyoei Co., Ltd.).

Ethylenic unsaturated compounds having an acid group are also preferable, and examples of commercially-available products thereof include TO-756 (tradename, manufactured by Toagosei Co., Ltd.), which is a trifunctional acrylate containing a carboxyl group, and TO-1382 (manufactured by Toagosei Co., Ltd.), which is a pentafunctional acrylate containing a carboxyl group.

The polymerizable compound used in each embodiment is more preferably a tetrafunctional or higher-functional acrylate compound.

The polymerizable compound may be used singly, or in combination of two or more thereof. When two or more photopolymerizable compounds are used in combination, the manner of the combination may be appropriately determined in accordance with the desired properties of the photosensitive composition. One preferable embodiment of the combination of photopolymerizable compounds is, for example, an embodiment in which two or more polymerizable compounds selected from the aforementioned polyfunctional acrylate compounds are combined, and one example thereof is a combination of dipentaerythritol hexaacrylate and pentaerythritol triacrylate.

The content of photopolymerizable compound in the photosensitive resin composition of each embodiment is preferably from 3 parts by mass to 55 parts by mass, and more preferably from 10 parts by mass to 50 parts by mass, relative to 100 parts by mass of the total solid content.

(E) Photopolymerization Initiator

The photosensitive resin compositions of the first to third embodiments include a photopolymerization initiator.

The photopolymerization initiator is s compound that is decomposed by light or heat to initiate and promote the polymerization of the photopolymerizable compound described above, and preferably shows absorption of light within a wavelength region of from 300 to 500 nm.

Specific examples of the photopolymerization initiator include organic halogenated compounds, oxydiazole compounds, carbonyl compounds, ketal compounds, benzoin compounds, organic peroxide compounds, azo compounds, coumarin compounds, azide compounds, metallocene compounds, organic borate compounds, disulfonate compounds, oxime ester compounds, onium salt compounds, and acylphosphine (oxide) compounds. Of these, oxide ester compounds are preferable.

More specific examples include polymerization initiators described in paragraphs [0081] to [0100] and [0101] to [0139] of JP-A No. 2006-78749.

The content of polymerization initiator in the photosensitive resin composition of each embodiment is preferably from 0.1% by mass to 30% by mass, more preferably from 1% by mass to 25% by mass, and even more preferably from 2% by mass to 20% by mass, relative to the total solid content of the photosensitive resin composition.

(F) Other Additives

The photosensitive resin composition of the first embodiment may further include a variety of additives in accordance with the purpose, in addition to the titanium black dispersion of the first embodiment, the photopolymerizable compound, and the photopolymerization initiator. The photosensitive resin composition of the second embodiment may further include a variety of additives in accordance with the purpose, in addition to the titanium black dispersion of the second embodiment, the photopolymerizable compound, and the photopolymerization initiator. The photosensitive resin composition of the third embodiment may further include a variety of additives in accordance with the purpose, in addition to the titanium black dispersion of the third embodiment, the photopolymerizable compound, and the photopolymerization initiator. Examples of additives that can be used in the first to third embodiments are described below.

(F-1) Binder Polymer

The photosensitive resin composition may further include a binder polymer, as necessary, for the purpose of, for example, improvement of film properties.

The binder polymer is preferably a linear organic polymer. A known linear organic polymer can be freely used as the "linear organic polymer". In order to enable development with water or a weakly alkaline aqueous solution, it is preferable to select a linear organic polymer that is soluble or swellable in water or in a weakly alkaline aqueous solution. The linear organic polymer may be selected and used in consideration of not only its function as a film-forming agent, but also its function as an agent for development with a developer such as water, a weakly alkaline aqueous solution or an organic solvent.

For example, use of a water-soluble organic polymer enables development with water. Examples of the linear organic polymer include radical polymerization products having a carboxylic acid group at a side chain thereof, such as those described in JP-A No. 59-44615, JP-B Nos. 54-34327, 58-12577 and 54-25957, and JP-A Nos. 54-92723, 59-53836 and 59-71048, more specifically a resin obtained by homopolymerization or copolymerization of a carboxyl group-containing monomer, a resin obtained by homopolymerizing or copolymerizing an acid anhydride-containing monomer, and subjecting acid anhydride units thereof to hydrolysis, half-esterification or half-amidation, a resin obtained by hydrolysis, half-esterification or half-amidation of a copolymer of monomers including an acid anhydride-containing monomer, and an epoxy acrylate obtained by modifying an epoxy resin with an unsaturated monocarboxylic acid and an acid anhydride. Examples of the carboxyl group-containing monomer include acrylic acid, methacrylic acid, itaconic acid, crotonic acid, maleic acid, fumaric acid, 4-carboxylstyrene, etc. Examples of the acid anhydride-containing monomer include maleic anhydride, etc.

An acidic cellulose derivative having a carboxylic acid group at a side chain thereof can be mentioned as another example. Besides, a product obtained by adding a cyclic acid anhydride to a hydroxyl group-containing polymer etc. are useful.

Acid group-containing urethane binder polymers, which are described in JP-B Nos. 7-120040, 7-120041, 7-120042, and 8-12424, JP-A Nos. 63-287944, 63-287947, 1-271741 and Japanese Patent Application No. 10-116232, are advantageous in terms of suitability for low light-exposure amount due to excellent strength thereof.

Acetal-modified polyvinyl alcohol binder polymers having acid groups, which are described in European Patent Nos. 993966 and 1204000 and JP-A No. 2001-318463, are preferable in that they provide an excellent balance between film strength and developability. Besides, polyvinyl pyrrolidone, polyethylene oxide, etc. are also useful as water-soluble linear organic polymers. An alcohol-soluble nylon, a polyether of 2,2-bis-(4-hydroxyphenyl)-propane and epichlorohydrin, etc. are also useful in terms of increasing the strength of a cured film.

In particular, among them, a copolymer of [benzyl (meth)acrylate/(meth)acrylic acid/other optional addition-polymerizable vinyl monomer(s)] and a copolymer of [allyl (meth)acrylate/(meth)acrylic acid/and other option addition-polymerizable vinyl monomer(s)] are preferable in that they provide excellent balance between film strength, sensitivity and developability.

The weight average molecular weight of the binder polymer used in the photosensitive resin composition of each embodiment is preferably from 1,000 to 300,000, more preferably from 1,500 to 250,000, even more preferably from 2,000 to 200,000, and particularly preferably from 2,500 to 100,000, from viewpoints of suppression of pattern detachment during development and developability. The number average molecular weight of the binder polymer is preferably 1000 or more, and more preferably 1500 to 250,000. The polydispersity (i.e., weight average molecular weight/number average molecular weight) of the binder polymer is 1 or greater, and more preferably from 1.1 to 10.

The binder polymer may be any of a random polymer, a block polymer, a graft polymer, or the like.

The binder polymer that can be used in each embodiment can be synthesized by a conventional known method. Examples of the solvent used for the synthesis include tetrahydrofuran, ethylene dichloride, cyclohexanone, etc. These solvents may be used singly, or in combination of two or more thereof.

Examples of the radical polymerization initiator used for the synthesis of the binder polymer include known compounds such as azo initiators and peroxide initiators.

Among various binder polymers, inclusion of a n alkaline-soluble resin having a double bond at a side chain improves both of the curability of a light-exposed region and the alkali developability of a region that has not been exposed to light.

The alkali-soluble binder polymer having a double bond at a side chain improves properties such as removability of non-image regions due to the possession of an acid group for imparting alkali solubility to the resin and at least one unsaturated double bond in the structure thereof. Binder resins having a partial structure are described in JP-A No. 2003-262958 in detail, and the compounds described therein can be in each embodiment.

The weight average molecular weight of the binder polymer can be measured by, for example, GPC.

The content of binder polymer in the photosensitive resin composition of each embodiment is preferably from 0.1% by mass to 7.0% by mass, more preferably from 0.3% by mass to 6.0% by mass, and even more preferably from 1.0 to 5.0% by mass, relative to the total solid content of the composition, from viewpoint of the balance between suppression of detachment of the light-shielding film and reduction of development residues.

(F-2) Colorant

In the first to third embodiments, the photosensitive resin composition may further include a colorant other than inorganic pigments, such as a known organic pigment or dye with a view to providing desired light-shielding property.

Examples of colorants that may additionally be used include an organic pigment such as an organic pigment selected from the pigments described in paragraphs [0030] to [0044] of JP-A No. 2008-224982, and pigments obtained by replacing Cl substituent(s) of C. I. Pigment Green 58 or C. I. Pigment Blue 79 by OH. Among them, pigments that can preferably be used include those listed below. However, pigments that can be applied to the first to third embodiments are not limited thereto.

C.I. Pigment Yellow 11, 24, 108, 109, 110, 138, 139, 150, 151, 154, 167, 180, 185,
C.I. Pigment Orange 36, 38, 62, 64,
C.I. Pigment Red 122, 150, 171, 175, 177, 209, 224, 242, 254, 255
C.I. Pigment Violet 19, 23, 29, 32,
C.I. Pigment Blue 15:1, 15:3, 15:6, 16, 22, 60, 66,
C.I. Pigment Green 7, 36, 37, 58
C.I. Pigment Black 1

There is no particular limitation on a dye that can be used as the colorant, and known dyes may be selected and used, as appropriate. Examples thereof include dyes described in JP-A No. 64-90403, JP-A No. 64-91102, JP-A No. 1-94301, JP-A No. 6-11614, Japanese Patent No. 2592207, U.S. Pat. No. 4,808,501, U.S. Pat. No. 5,667,920, U.S. Pat. No. 5,059,500, JP-A No. 5-333207, JP-A No. 6-35183, JP-A No. 6-51115, JP-A No. 6-194828, JP-A No. 8-211599, JP-A No. 4-249549, JP-A No. 10-123316, JP-A No. 11-302283, JP-A No. 7-286107, JP-A No. 2001-4823, JP-A No. 8-15522, JP-A No. 8-29771, JP-A No. 8-146215, JP-A No. 11-343437, JP-A No. 8-62416, JP-A No. 2002-14220, JP-A No. 2002-14221, JP-A No. 2002-14222, JP-A No. 2002-14223, JP-A No. 8-302224, JP-A No. 8-73758, JP-A No. 8-179120, JP-A No. 8-151531.

Examples of the chemical structure that the dye possesses include pyrazole azo, anilinoazo, triphenylmethane, anthraquinone, anthrapyridone, benzylidene, oxonol, pyrazolotriazolazo, pyridine azo, cyanine, phenothiazine, pyrrolopyrazolazomethine, xanthene, phthalocyanine, penzopyrane, indigo, and pyrromethene chemical structures.

In the photosensitive resin composition of each embodiment, from the viewpoint of achieving both of curability and light-shielding property when combined with the titanium black particles contained in the composition, the colorant is preferably at least one organic pigment selected from the group consisting of an orange pigment, a red pigment, or a violet pigment is preferable, and most preferably a combination with a red pigment.

Orange pigments, red pigments, and violet pigments for combined use with titanium black particles in each embodiment may be appropriately selected, for example, from various pigments that belong to "C.I. Pigment Orange", "C.I. Pigment Red", "CA. Pigment Violet" exemplified above, in accordance with the desired light-shielding property. From the viewpoint of improving the light-shielding property, C.I. Pigment Violet 29, C.I. Pigment Orange 36, 38, 62, 64, C.I. Pigment Red 177, 254, 255, etc are preferable.

(F-3) Sensitizer

The photosensitive resin composition of each embodiment may include a sensitizer in order to improve of the radical generation efficiency of the polymerization initiator and in order to shift the photosensitive wavelength towards the longer wavelength side.

A sensitizer that sensitizes the polymerization initiator used through an electron transfer mechanism or an energy transfer mechanism is preferable.

Preferable examples of the sensitizer include compounds described in paragraphs [0085] to [0098] of JP-A No. 2008-214395.

The content of sensitizer is preferably in the range of from 0.1 to 30% by mass, more preferably in the range of from 1 to 20% by mass, even more preferably in the range of from 2 to 15% by mass, relative to the total solid content of the photosensitive resin composition, from viewpoints of sensitivity and storage stability.

(F-4) Polymerization Inhibitor

The photosensitive resin composition of each embodiment preferably includes a small amount of a polymerization inhibitor in order to prevent unnecessary thermal polymerization of the polymerizable compound during the production or storage of the composition. A known thermal polymerization inhibitor may be used as the polymerization inhibitor, and specific examples thereof include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylene bis(4-methyl-6-t-butylphenol), and N-nitrosophenylhydroxyamine cerous salt.

The content of thermal polymerization inhibitor is preferably from about 0.01 to about 5% by mass relative to the total solid content of the photosensitive resin composition.

Further, if necessary, a higher fatty acid derivative, such as behenic acid or behenamide, or the like may be added such that the higher fatty acid derivative localizes on the surface of a coating film during a drying process after coating, in order to prevent polymerization inhibition due to oxygen. The content of higher fatty acid derivative is preferably from about 0.5 to about 10% by mass relative to the entire composition.

(F-5) Adhesion Promoter

The photosensitive resin composition of each embodiment may include an adhesion promoter in order to improve adhesiveness to a hard surface such as a support. Examples of the adhesion promoter include a silane coupling agent, a titanium coupling agent, etc.

γ-methacryloxypropyltrimethoxysilane, γ-methacryloxypropyltriethoxysilane, γ-acryloxypropyltrimethoxysilane, γ-acryloxypropyltriethoxysilane, γ-mercaptopropyltrimethoxysilane, γ-aminopropyltriethoxysilane, and phenyltrimethoxysilane are preferable examples of the silane coupling agent, and γ-methacryloxypropyltrimethoxysilane is preferable.

The content of adhesion promoter is preferably from 0.5% by mass to 30% by mass, and more preferably from 0.7% by mass to 20% by mass, relative to the total solid content of the photosensitive resin composition.

In the first and second embodiments, when a glass substrate is applied to a wafer level lens having a light-shielding film formed using the photosensitive resin composition, the photosensitive resin composition preferably includes an adhesion promoter from a viewpoint of sensitivity improvement.

(F-6) Surfactant

The photosensitive resin compositions of each of the first to third embodiments may include various surfactants from the viewpoint of further improving coatability. Examples of surfactants that can be used include various types of surfactants such as fluorosurfactants, nonionic surfactants, cationic surfactants, anionic surfactants, and silicone surfactants.

Inclusion of a fluorosurfactant in the photosensitive resin composition further improves the liquid properties (particularly, fluidity) of a coating liquid formed from the photosensitive resin composition, and further improves the uniformity of the coating thickness and liquid saving properties.

Specifically, in a case in which a film is formed using a coating liquid in which a photosensitive resin composition containing a fluorosurfactant is used, wettability of the coating liquid on a surface to be coated is improved due to a decrease in the interfacial tension between the surface to be coated and the coating liquid, as a result of which the coating properties on the surface to be coated is improved. Therefore, a film having a uniform thickness and reduced thickness unevenness can more favorably be formed even in a case in which the film having a small thickness of about several micrometers is formed with a small liquid amount. Inclusion of a fluorosurfactant in the photosensitive resin composition is effective in this point.

The fluorine content ratio in the fluorosurfactant is preferably from 3% by mass to 40% by mass, more preferably from 5% by mass to 30% by mass, and particularly preferably from 7% by mass to 25% by mass. A fluorosurfactant having a fluorine content ratio within the above range is effective in terms of the uniformity of the thickness of the coating film and in terms of liquid saving properties, and exhibits a favorable solubility in the photosensitive resin composition.

Examples of fluorosurfactants include: MEGAFACE F171, MEGAFACE F172, MEGAFACE F173, MEGAFACE F176, MEGAFACE F177, MEGAFACE F141, MEGAFACE F142, MEGAFACE F143, MEGAFACE F144, MEGAFACE R30, MEGAFACE F437, MEGAFACE F475, MEGAFACE F479, MEGAFACE F482, MEGAFACE F554, MEGAFACE F780, and MEGAFACE F781 (tradenames, manufactured by DIC Corporation); FLUORAD FC430, FLUORAD FC431, and FLUORAD FC171 (tradenames, manufactured by Sumitomo 3M Limited); SURFLON S-382, SURFLON SC-101, SURFLON SC-103, SURFLON SC-104, SURFLON SC-105, SURFLON SC1068, SURFLON SC-381, SURFLON SC-383, SURFLON S393, and SURFLON KH-40 (tradenames, manufactured by Asahi Glass Co., Ltd.); SOLSPERSE 20000 (tradename, manufactured by Lubrizol Japan Ltd.); etc.

Specific examples of nonionic surfactants include: glycerol, trimethylol propane, trimethylol ethane, and ethoxylates or propoxylates thereof (such as glycerol propoxylate or glycerin ethoxylate); polyoxyethylene lauryl ether; polyoxyethylene stearyl ether; polyoxyethylene oleyl ether; polyoxyethylene octyl phenyl ether; polyoxyethylene nonyl phenyl ether; polyethyleneglycol dilaurate; polyethyleneglycol distearate; sorbitan fatty acid esters (such as PLURONIC L10, L31, L61, L62, 10R5, 17R2, and 25R2 and TETRONIC 304, 701, 704, 901, 904, and 150R1 (tradenames, manufactured by BASF)); etc.

Specific examples of cationic surfactants include: phthalocyanine derivatives (tradename: EFKA-745 manufactured by Morishita Sangyo Kabushiki Gaisha); organosiloxane polymer KP341 (tradename, manufactured by Shin-Etsu Chemicals Co., Ltd.); (meth)acrylic (co)polymers POLYFLOW No. 75, No. 90, and No. 95 (tradenames, manufactured by Kyoeisha Chemical Co., Ltd. and Kyoeisha Yushi Kagaku Kogyo Co., Ltd); WO01 (tradename, manufactured by Yusho Co., Ltd.); etc.

Specific examples of anionic surfactants include WO04, WO05, and WO17 (tradenames, manufactured by Yusho Co., Ltd.), etc.

Examples of silicone surfactants include: TORAY SILICONE DC3PA, TORAY SILICONE SH7PA, TORAY SILICONE DC11PA, TORAY SILICONE SH21PA, TORAY SILICONE SH28PA, TORAY SILICONE SH29PA, TORAY SILICONE SH30PA, and TORAY SILICONE SH8400 (tradenames, manufactured by Dow Corning Toray Co., Ltd. and Toray Silicone Company, Ltd.); TSF-4440, TSF-4300, TSF-4445, TSF-4460, and TSF-4452 (tradenames, manufactured by Momentive Performance Materials Inc.); KP341, KF6001, and KF6002 (tradename, manufactured by Shin-Etsu Chemicals Co., Ltd.); BYK307, BYK323, and BYK330 (tradenames, manufactured by BYK-Chemie); etc.

The surfactant may be used singly, or in combination of two or more thereof.

The content of surfactant is preferably from 0.001% by mass to 2.0% by mass, more preferably from 0.005% by mass to 1.0% by mass, relative to the total mass of the photosensitive resin composition.

(F-7) Other Additives

The photosensitive resin composition in each of the first to third embodiments may further include a cosensitizer, for the purposes of further improving the sensitivity of the sensitizing dye or the initiator to actinic radiation, suppressing the inhibition of polymerization of the photopolymerizable compound due to oxygen, etc. Further, if necessary, the photosensitive resin composition may include a known additive such as a diluent, a plasticizer, or an oleophilizing agent in order to improve the properties of a cured film.

—Preparation of Titanium Black Dispersion of First Embodiment—

The manner of the preparation of the titanium black dispersion of the first embodiment is not particularly limited. The titanium black dispersion of the first embodiment can be prepared by, for example, subjecting titanium black particles, a dispersant, and an organic solvent to dispersing treatment using a stirrer, a homogenizer, a high-pressure emulsifier, a wet-grinder, a wet-disperser, or the like. However, the preparation method is not limited thereto.

The dispersing treatment may be carried out by carrying out dispersion treatment twice or more (multistage dispersion).

—Preparation of Photosensitive Resin Composition of First Embodiment—

The manner of the preparation of the photosensitive resin composition of the first embodiment is not particularly limited, either. The photosensitive resin composition of the first embodiment can be prepared by, for example, mixing the titanium black dispersion of the first embodiment, a photopolymerization initiator, a photopolymerizable compound, and optionally-used various additives.

—Preparation of Titanium Black Dispersion of Second Embodiment—

The manner of the preparation of the titanium black dispersion of the second embodiment is not particularly limited. The titanium black dispersion of the second embodiment can be prepared by, for example, subjecting titanium black particles, a dispersant, and an organic solvent to dispersing treatment using a stirrer, a homogenizer, a high-pressure emulsifier, a wet-grinder, a wet-disperser, or the like. However, the preparation method is not limited thereto.

The dispersing treatment may be carried out by carrying out dispersion treatment twice or more (multistage dispersion).

—Preparation of Photosensitive Resin Composition of Second Embodiment—

The manner of the preparation of the photosensitive resin composition of the second embodiment is not particularly limited, either. The photosensitive resin composition of the second embodiment can be prepared by, for example, mixing the titanium black dispersion of the second embodiment, a photopolymerizable compound, a photopolymerization initiator, and optionally-used various additives.

—Preparation of Titanium Black Dispersion—

The manner of the preparation of the titanium black dispersion of the third embodiment is not particularly limited, and the titanium black dispersion of the third embodiment can be prepared by, for example, dispersing titanium black particles, a dispersant, and an organic solvent using a stirrer, homogenizer, high-pressure emulsifier, wet-grinder, wet-disperser, or the like. However, the preparation method is not limited thereto.

The dispersing treatment may be carried out by carrying out dispersion treatment twice or more (multistage dispersion).

—Preparation of Photosensitive Resin Composition—

The manner of the preparation of the photosensitive resin composition of the third embodiment is not particularly limited, either. The photosensitive resin composition of the third embodiment can be prepared by, for example, mixing the titanium black dispersion of the third embodiment, a photopolymerization initiator, a photopolymerizable compound, and optionally-used various additives.

<Wafer Level Lens>

The wafer level lens of the first embodiment has a light-shielding film obtained by curing the photosensitive resin composition of the first embodiment, at a peripheral portion of a lens disposed on a substrate. Similarly, the wafer level lens of the second embodiment has a light-shielding film obtained by curing the photosensitive resin composition of the second embodiment, at a peripheral portion of a lens disposed on a substrate.

The wafer level lens is described below. The description is common to the first and second embodiments, unless specifically indicated otherwise.

FIG. 1 is a plan view showing an example of the configuration of a wafer-level lens array having plural wafer-level lenses.

As shown in FIG. 1, the wafer-level lens array includes a substrate 10, and lenses 12 arranged on the substrate 10. Although the plural lenses 12 are aligned on the substrate 10 two-dimensionally in FIG. 1, the plural lenses 12 may alternatively be aligned one-dimensionally on the substrate 10.

Figure 2:
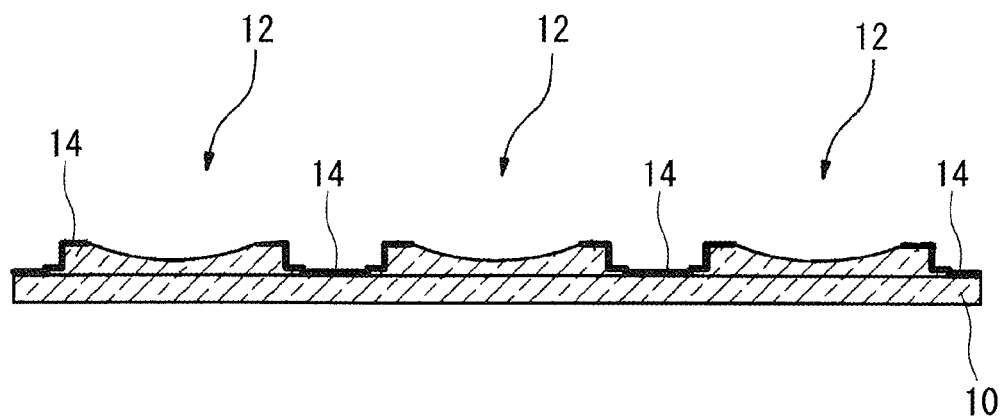
FIG. 2 is a cross-sectional view taken along the line A-A shown in FIG. 1.

FIG. 2 is a cross-sectional view taken along line A-A shown in FIG. 1.

As shown in FIG. 2, in the wafer-level lens array, a light-shielding film 14 is provided between the plural lenses 12 arranged on the substrate 10, and prevents light transmission at regions other than the lenses 12.

The wafer level lens of the first or second embodiment is composed of one lens 12 disposed on the substrate 10, and the light-shielding film 14 provided at a peripheral portion of the lens 12. The photosensitive resin composition of the first or second embodiment is used for the formation of the light-shielding film 14.

A structure of a wafer-level lens array in which plural lenses 12 are arranged two-dimensionally on a substrate 10 as shown in FIG. 1 is described below as an example.

The lenses 12 are generally made of the same material as that of the substrate 10, and have been integrally molded on the substrate 10, or molded as a separate structure and then fixed onto the substrate. Here, one example has been mentioned. However, the configuration of the wafer-level lens of the first or second embodiment is not limited configuration. Various configurations may be adopted; for example, the lenses may have a multi-layer structure, or may have been separated into lens modules by dicing.

The material for forming the lenses 12 is, for example, glass. Since there are may types of glass, and glass having high refractive index can be selected, glass is favorable as a material of a lens that is desired to have high optical power. Further, glass is advantages also in that glass has excellent thermal resistance, and tolerate reflow mounting onto an image pickup unit or the like.

Another example of the material for forming the lenses 12 is a resin. Resins exhibit excellent processability, and are therefore suitable for simple and inexpensive formation of lens faces using a mold or the like.

It is preferable to use an energy-curable resin for the formation of the wafer-level lens. The energy-curable resin may be either a thermally curable resin or a resin which is cured by irradiation of an actinic energy radiation (for example, heat, ultraviolet rays, or electron beam irradiation).

In consideration of reflow mounting of an image pickup unit, a resin having a relatively high softening point, for example 200° C. or higher, is preferable, and a resin having a softening point of 250° C. or higher is more preferable.

In the following, resins favorable as lens materials are described.

Examples of UV-curable resins include a UV-curable silicone resin, a UV-curable epoxy resin, and an acrylic resin. The epoxy resin may be an epoxy resin having a linear expansion coefficient of from 40 to 80 $[10^{-6}/K]$ and a refractive index of from 1.50 to 1.70, preferably from 1.50 to 1.65.

Examples of thermosetting resins include a thermosetting silicone resin, a thermosetting epoxy resin, a thermosetting phenol resin, and a thermosetting acrylic resin. For example, the silicone resin may be a silicone resin having a linear expansion coefficient of from 30 to 160 $[10^{-6}/K]$ and a refractive index of from 1.40 to 1.55. The epoxy resin may be an epoxy resin having a linear expansion coefficient of from 40 to 80 $[10^{-6}/K]$ and a refractive index of from 1.50 to 1.70, preferably from 1.50 to 1.65.

The phenol resin may be a phenol resin having a linear expansion coefficient of from 30 to 70 $[10^{-6}/K]$ and a refractive index of from 1.50 to 1.70. The acrylic resin may be an acrylic resin having a linear expansion coefficient of from 20 to 60 $[10^{-6}/K]$ and a refractive index of from 1.40 to 1.60, preferably from 1.50 to 1.60.

Commercially available products of these thermosetting resins may be used, specific examples of which include SMX-7852 and SMX-7877 (tradenames, manufactured by Fuji Polymer Industries Co., Ltd.), IVSM-4500 (tradename, manufactured by Toshiba Corporation), SR-7010 (tradename, manufactured by Dow Corning Toray Co., Ltd.), etc.

Examples of thermoplastic resins include a polycarbonate resin, a polysulfone resin, and a polyethersulfone resin. The polycarbonate may be polycarbonate having a linear expansion coefficient of from 60 to 70 $[10^{-6}/K]$ and a refractive index of from 1.40 to 1.70, preferably from 1.50 to 1.65. The polysulfone resin may be a polysulfone resin having a linear expansion coefficient of from 15 to 60 $[10^{-6}/K]$ and a refractive index of 1.63. The polyether sulfone resin may be a polyether sulfone resin having a linear expansion coefficient of from 20 to 60 $[10^{-6}/K]$ and a refractive index of 1.65.

In general, optical glass has a linear expansion coefficient of from 4.9 to 14.3 $[10^{-6}/K]$ at 20° C., and a refractive index of from 1.4 to 2.1 at a wavelength of 589.3 nm. Quartz glass has a linear expansion coefficient of from 0.1 to 0.5 $[10^{-6}/K]$, and a refractive index of about 1.45.

The curable resin composition that can be used for forming a lens preferably has a moderate fluidity before curing, from the viewpoint of moldability such as suitability for transfer of the mold shape. Specifically, a curable resin composition that is liquid at normal temperature, and has a viscosity of from about 1,000 mPa·s to about 50,000 mPa·s is preferable.

The curable resin composition that can be used for forming a lens preferably has such a thermal resistance as to prevent thermal deformation after curing even when subjected to a reflow process. From this viewpoint, the glass transition temperature of the cured product is preferably 200° C. or higher, more preferably 250° C. or higher, and particularly preferably 300° C. or higher. In order to impart such a high thermal resistance to the resin composition, it is necessary to restrain the motion at the molecular level. Examples of effective methods include (1) a method of increasing the cross-linking density per unit volume, (2) a method of using a resin having a robust ring structure (for example, an alicyclic structure such as cyclohexane, norbornane, or tetracyclododecane, an aromatic ring structure such as benzene or naphthalene, a cardo structure such as 9,9'-biphenyl fluorene, a resin having a spiro structure such as spirobiindane, specifically, for example, resins described in JP-A No. 9-137043, JP-A No. 10-67970, JP-A No. 2003-55316, JP-A No. 2007-334018, JP-A No. 2007-238883, etc.), (3) a method of uniformly dispersing a high-Tg material such as inorganic fine particles (described in, for example, JP-A 5-209027, JP-A 10-298265, etc.), etc. Two or more of these methods may be used in combination. The thermal resistance is preferably controlled within a range in which other characteristics such as fluidity, shrinkage ratio, and refractive index characteristics are not impaired.

From the viewpoint of the transfer accuracy of the shape, a curable resin composition that exhibits a low ratio of volume shrinkage due to curing reaction is preferable. The curing shrinkage ratio of the resin composition is preferably 10% or lower, more preferably 5% or lower, and particularly preferably 3% or lower.

Examples of the resin composition exhibiting a low curing shrinkage ratio include:

(1) a resin composition containing a high-molecular-weight curing agent (such as prepolymer) (described in, for example, JP-A No. 2001-19740, JP-A No. 2004-302293, JP-A No. 2007-211247, etc.; the number average molecular weight of the high-molecular-weight curing agent is preferably in the range of from 200 to 100,000, more preferably in the range of from 500 to 50,000, and particularly preferably in the range of from 1,000 to 20,000, and the value of "the number average molecular weight/the number of reactive groups for curing" of the curing agent is preferably in the range of from 50 to 10,000, more preferably in the range of from 100 to 5000, and particularly preferably in the range of from 200 to 3000);

(2) a resin composition containing a non-reactive material (such as organic/inorganic fine particles or a non-reactive resin) (described in, for example, JP-A No. 6-298883, JP-A No. 2001-247793, JP-A No. 2006-225434, etc.);

(3) a resin composition containing a low-shrinkage cross-linking reactive group, examples of which include a ring-opening polymerizable group (such as an epoxy group (described in, for example, JP-A No. 2004-210932), an oxetanyl group (described in, for example, JP-A No. 8-134405), an episulfide group (described in, for example, JP-A No. 2002-105110), or a cyclic carbonate group (described in, for example, JP-A No. 7-62065)), an ene/thiol curable group (described in, for example, JP-A No. 2003-20334), or a hydrosilylated curable group (described in, for example, JP-A No. 2005-15666);

(4) a resin composition containing a resin having a rigid skeleton (such as fluorene, adamantane, or isophorone) (described in, for example, JP-A No. 9-137043);

(5) a resin composition containing two types of monomer having respectively different polymerizable groups and forming an interpenetrating network structure (so-called IPN structure) (described in, for example, JP-A No. 2006-131868);

(6) a resin composition containing a swellable material (described in, for example, JP-A No. 2004-2719 and JP-A No. 2008-238417); etc. These resin compositions can be suitably used in the first and second embodiments. Combined use of plural curing-shrinkage reducing means from among the above (for example, combined use of a prepolymer containing a ring-opening polymerizable group and a resin composition containing fine particles) is preferable from the viewpoint of optimizing the properties.

It is preferable to use two or more resin compositions having different Abbe numbers, including a high Abbe-number resin and a low Abbe-number resin, for forming the wafer-level lens of the first or second embodiment.

The high Abbe-number resin preferably has an Abbe number (vd) of 50 or more, more preferably 55 or more, and particularly preferably 60 or more. The refractive index (nd) thereof is preferably 1.52 or higher, more preferably 1.55 or higher, and particularly preferably 1.57 or higher.

The resin contained in this resin composition is preferably an aliphatic resin, and particularly preferably a resin having an alicyclic structure (for example, a resin having a ring structure such as cyclohexane, norbornane, adamantane, tricyclodecane, or tetracyclododecane, specific examples of which include resins described in JP-A 10-152551, JP-A No. 2002-212500, JP-A No. 2003-20334, JP-A No. 2004-210932, JP-A No. 2006-199790, JP-A No. 2007-2144, JP-A No. 2007-284650, and JP-A No. 2008-105999).

The low Abbe-number resin preferably has an Abbe number (vd) of 30 or less, more preferably 25 or less, and particularly preferably 20 or less. The refractive index (nd) thereof is preferably of 1.60 or higher, more preferably 1.63 or higher, and particularly preferably 1.65 or higher.

Such a resin is preferably a resin having an aromatic structure, examples of which include a resin containing a structure such as 9,9'-diarylfluorene, naphthalene, benzothiazole, or benzotriazole. Specific examples thereof include resins described in JP-A No. 60-38411, JP-A No. 10-67977, JP-A No. 2002-47335, JP-A No. 2003-238884, JP-A No. 2004-83855, JP-A No. 2005-325331, JP-A No. 2007-238883, International Publication No. WO 2006/095610, and Japanese Patent No. 2537540.

It is also preferable that the resin composition used for the formation of the wafer-level lens includes an organic-inorganic composite material in which inorganic fine particles are dispersed in a matrix, in order to increase the refractive index or adjust the Abbe number.

Examples of the inorganic fine particles in the organic-inorganic composite material include oxide fine particles, sulfide fine particles, selenide fine particles, and telluride fine particles. More specific examples include zirconium oxide fine particles, titanium oxide fine particles, zinc oxide fine particles, tin oxide fine particles, niobium oxide fine particles, cerium oxide fine particles, aluminum oxide fine particles, lanthanum oxide fine particles, yttrium oxide fine particles, and zinc sulfide fine particles.

In particular, it is preferable that fine particles of lanthanum oxide, aluminum oxide, zirconium oxide, or the like are dispersed in the resin having a high Abbe number. It is preferable that fine particles of titanium oxide, tin oxide, zirconium oxide, or the like are dispersed in the resin having a low Abbe number.

Only one type of inorganic fine particles may be used singly, or two or more types of inorganic fine particles may be used in combination. The inorganic fine particles may be a composite of plural components.

For various purposes such as reduction of photocatalytic activity and reduction of water absorptivity, the inorganic fine particles may be doped with a metal other than the substance of the inorganic fine particles, the surfaces of the inorganic fine particles may be covered with a metal oxide, such as silica or alumina, other than the substance of the inorganic fine particles, and/or the surfaces of the inorganic fine particles may be modified with a silane coupling agent, a titanate coupling agent, an organic acid (such as a carboxylic acid, a sulfonic acid, a phosphoric acid, or a phosphonic acid), or a dispersant having an organic acid group.

When the number average particle size of the inorganic fine particles is excessively small, the properties of the material alter in some cases. When the difference in refractive index between the resin matrix and the inorganic fine particles is large, and the number average particle size of the inorganic fine particles is excessively large, effects of Rayleigh scattering are significant. Therefore, the number average primary particle size of the inorganic fine particles may usually be in the range of from 1 nm to 1,000 nm. However, since an excessively small number average primary particle size of the inorganic fine particles alters the properties of the material in some cases, and effects of Rayleigh scattering are significant when the number average primary particle size of the inorganic fine particles is large, the number average primary particle size of the inorganic fine particles is preferably from 1 nm to 15 nm, more preferably from 2 nm to 10 nm, and particularly preferably from 3 nm to 7 nm. Further, a narrower particle size distribution of the inorganic fine particles is more preferable. Although there are many ways of defining such monodispersed particles, the numerical range defined in JP-A No. 2006-160992 is an example of a preferable range of particle diameter distribution.

Here, the number average primary particle size can be measured by, for example, XRD (X-ray diffraction), small-angle X-ray scattering (SAXS), X-ray diffuse scattering (XDS), grazing-incidence small-angle X-ray scattering (GI-SAX), a scanning electron microscope (SEM), or a transmission electron microscope (TEM).

The refractive index of the inorganic fine particles at 22° C. and a wavelength of 589.3 nm is preferably from 1.90 to 3.00, more preferably from 1.90 to 2.70, and particularly preferably from 2.00 to 2.70.

In the organic-inorganic composite material, the content of inorganic fine particles relative to the resin serving as matrix is preferably 5% by mass or more, more preferably from 10 to 70% by mass, and particularly preferably from 30 to 60% by mass, from the viewpoint of transparency and provision of high refractive index.

Any of the UV-curable resin, the thermosetting resin, the thermoplastic resin, the high Abbe-number resin, or the low Abbe-number resin described as the material of the wafer-level lens in the above may be used as a resin for forming a matrix, which is used in the organic-inorganic composite material. Further examples include: a resin having a refractive index higher than 1.60, described in JP-A No. 2007-93893; a block copolymer composed of a hydrophobic segment and a hydrophilic segment, described in JP-A No. 2007-211164; a resin having, at a polymer terminal or at a side chain, a functional group capable of forming a chemical bond with inorganic fine particles, described in JP-A No. 2007-238929 and Japanese Patent Application Nos. 2008-12645, 2008-208427, 2008-229629, and 2008-219952, and a thermoplastic resin described in Japanese Patent Application Nos. 2008-197054 and 2008-198878.

If necessary, an additive such as a plasticizer or a dispersant may be added to the organic-inorganic composite material.

Preferable combinations of a resin serving as a matrix and inorganic fine particles include the following combinations.

In a case in which a high Abbe-number resin, such as those described above, is used to form a matrix, it is preferable to disperse fine particles of, for example, lanthanum oxide, aluminum oxide, or zirconium oxide as inorganic fine particles. In a case in which a low Abbe-number resin is used to form a matrix, it is preferable to disperse fine particles of, for example, titanium oxide, tin oxide, or zirconium oxide as inorganic fine particles.

In order to uniformly disperse fine particles in the resin composition, the fine particles are preferably dispersed using, for example, a dispersant containing a functional group having reactivity with a resin monomer for forming the matrix (described in, for example, working examples of JP-A No. 2007-238884), a block copolymer composed of a hydrophobic segment and a hydrophilic segment (described in, for example JP-A No. 2007-211164), or a resin having, at a polymer terminal or at a side chain, a functional group capable of forming a chemical bond with the inorganic fine particles (described in, for example, JP-A No. 2007-238929, JP-A No. 2007-238930, etc.), as appropriate.

Further, the resin composition used for the formation of the wafer-level lens may include an additive, as appropriate, examples of which include known release agents such as silicone-based release agents, fluorine-based release agents, and compounds containing a long-chain alkyl group, and antioxidants such as hindered phenol.

The resin composition used for the formation of the wafer-level lens may include a curing catalyst or an initiator, as necessary. Specific examples thereof include a compound that promotes a curing reaction (radical polymerization or ionic polymerization) by the action of heat or an actinic energy radiation, which are described in, for example, paragraphs [0065] to [0066] of JP-A No. 2005-92099. The addition amount of the curing reaction promoter varies depending on the type of catalyst or initiator, the difference in reactive sites for curing, or the like, and cannot be uniquely limited. In general, the content of curing reaction promoter is preferably approximately from 0.1 to 15% by mass, and more preferably approximately from 0.5 to 5% by mass, relative to the total solids content of the resin composition.

The resin composition used in the production of the wafer level lens of the first or second embodiment can be prepared by appropriately mixing the above-described ingredients. Separate addition of a solvent is unnecessary in a case in which the liquid low-molecular-weight monomer (reactive diluent) or the like is capable of dissolving other components. If this is not the case, the resin composition can be prepared by dissolving the components using a solvent. The solvent that can be used in the resin composition is not particularly limited as long as homogenous dissolution or dispersion can be carried out without precipitation of the composition, and the solvent may be appropriately selected. Specific examples of the solvent include ketones (such as acetone, methyl ethyl ketone, and methyl isobutyl ketone), esters (such as ethyl acetate and butyl acetate), ethers (such as tetrahydrofuran and 1,4-dioxane), alcohols (such as methanol, ethanol, isopropyl alcohol, butanol, and ethylene glycol), aromatic hydrocarbons (such as toluene and xylene), and water. When the resin composition includes a solvent, it is preferable to perform, after casting of the composition on a substrate and/or a mold and drying of the solvent, a mold shape transfer operation.

The substrate 10 may be formed from the same material as the molding material for forming the lenses 12. However, as long as the substrate 10 is formed from a material that is transparent to visible light, such as glass, the substrate 10 may be formed from a different material from the molding material of the lenses 12. In this case, the material for forming the substrate 10 is preferably a material having a linear expansion coefficient that is equal to or extremely close to that of the material forming the lenses 12. If the linear expansion coefficient of the material forming the lenses 12 is identical or close to that of the material forming the substrate 10, distortion or cracking of the lenses 12 that occurs during heating due to difference in linear expansion rate can be suppressed when reflow mounting of the wafer-level lenses on an image pickup unit is carried out.

Although not shown in FIGS. 1 and 2, an infrared filter (IR filter) may be formed on the light incidence side of the substrate 10.

The configuration and the production of the wafer-level lens is specifically described below with reference to FIGS. 3 to 8C, using an exemplary production method of a wafer-level lens array.

[Configuration and Production of Wafer Level Lens (1)]
—Formation of Lenses—

First, a method of forming lenses 12 on a substrate 10 is described with reference to FIG. 3 and FIGS. 4A to 4C. Elements having substantially the same function and action are denoted by the same reference numeral throughout the drawings, and overlapping descriptions therefor are sometimes omitted.

Figure 3:
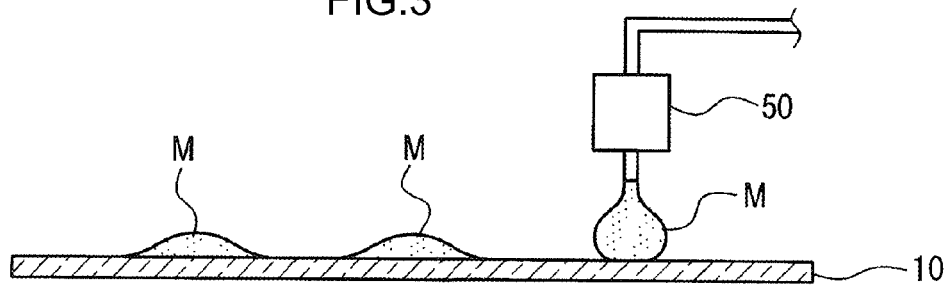
FIG. 3 is a view showing a state in which a molding material for forming a lens is supplied onto a substrate.
Figure 4A:
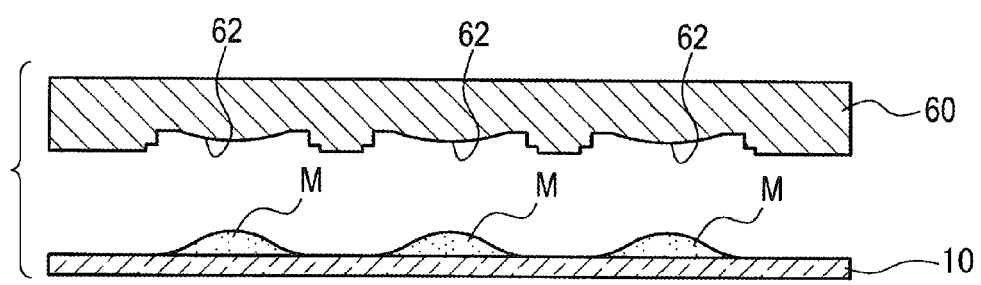
FIGS. 4A to 4C are schematic views showing a procedure of forming lenses on a substrate using a mold.
Figure 4B:
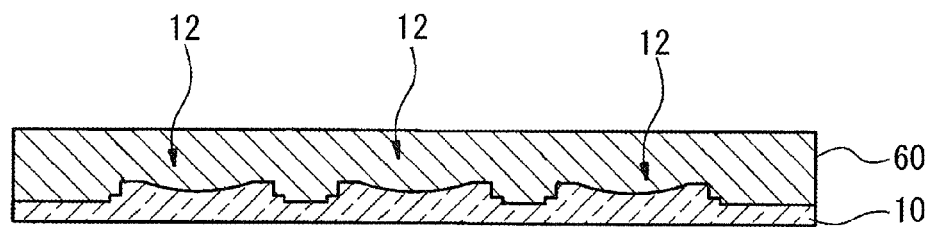
Figure 4C:
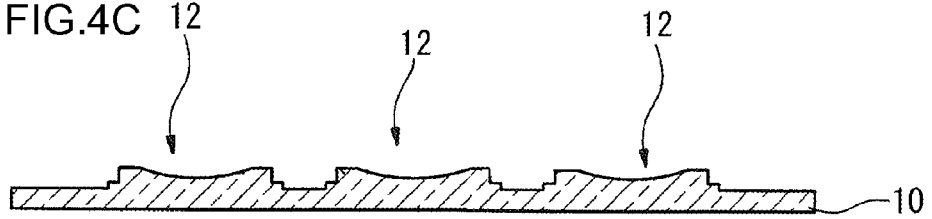

FIG. 3 is a view showing a state in which a molding material (designated by "M" in FIG. 3), which is a resin composition for lens formation, is supplied to a substrate 10. FIGS. 4A to C are views showing an procedure for forming the lenses 12 on the substrate 10 by using a mold 60.

As shown in FIG. 3, the molding material M is dripped on regions of the substrate 10 at which lenses 12 are to be formed, using a dispenser 50. Here, an amount of the molding material M corresponding to one lens 12 is supplied to each region to be supplied with the molding material.

After the molding material M is supplied to the substrate 10, a mold 60 for shaping lenses 12 is disposed at a side of the substrate 10 at which the molding material M has been supplied, as shown in FIG. 4A. The mold 60 is provided with depressed areas 62 for forming the shape of the lenses 12 by transfer, in accordance with the desired number of the lenses 12.

As shown in FIG. 4B, the mold 60 is pressed against the molding material M on the substrate 10, and the molding material M is deformed to conform to the shape of depressed areas 62. While the mold 60 is pressed against the molding material M, the molding material M is cured by irradiating heat or ultraviolet rays from the outside of the mold 60 in a case in which the molding material M is a thermosetting resin or a UV-curable resin.

After the molding material M is cured, the substrate 10 and the lenses 12 are separated from the mold 60, as shown in FIG. 4C.

—Formation of Light-Shielding Film—

Next, a method of forming a light-shielding film 14 at peripheral portions of the lenses 12 is described below with reference to FIGS. 5A to 5C.

Figure 5A:
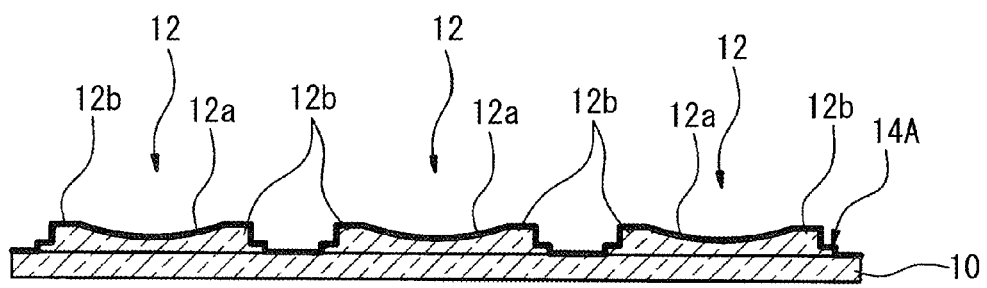
FIGS. 5A to 5C are schematic views showing a process of forming a patterned light-shielding film on a substrate on which lenses have been formed.
Figure 5B:
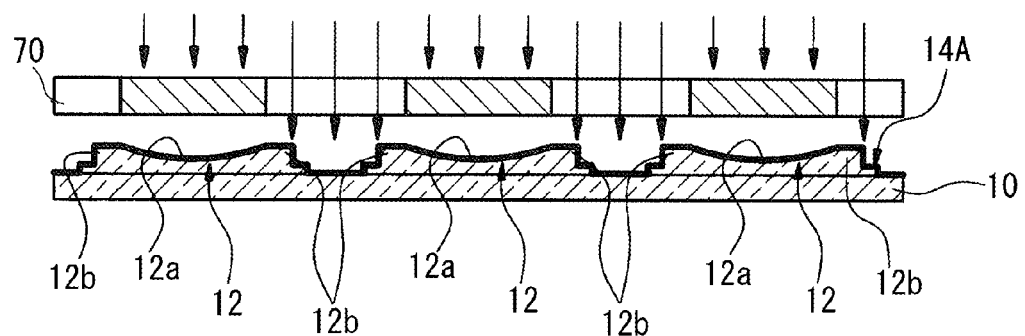
Figure 5C:
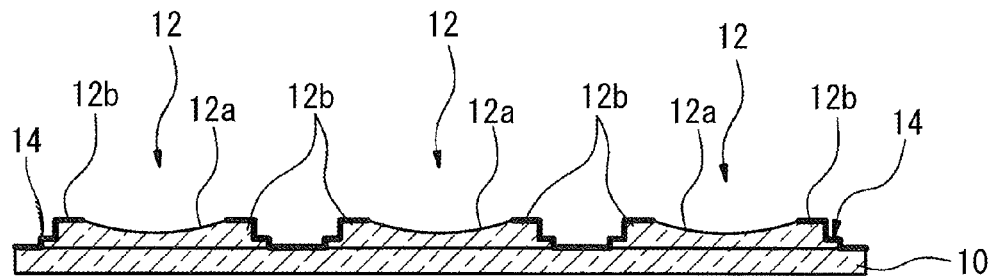

FIGS. 5A to 5C are schematic cross-sectional views showing a process of providing a light-shielding film 14 on the substrate 10 on which the lenses 12 have been formed.

The method for forming a light-shielding film 14 includes a light-shielding coating layer formation process of coating the photosensitive resin composition of the first or second embodiment on a substrate 10 to form a light-shielding coating layer 14A (see FIG. 5A), a light exposure process of patternwise exposing the light-shielding coating layer 14A to light through a mask 70 (see FIG. 5B), and a development process of developing the light-shielding coating layer 14A after the light exposure to remove uncured portions, thereby forming a patterned light-shielding film 14 (see FIG. 5C).

The formation of the light-shielding film 14 may be carried out before production of the lenses 12 or after production of the lenses 12, as desired. Here, a method of forming the light-shielding film 14 after the production of lenses 12 is described in detail.

Individual processes of the method for forming the light-shielding film 14 are described below.

<Light-Shielding Coating Layer Formation Process>

In the light-shielding coating layer formation process, as shown in FIG. 5A, the photosensitive resin composition is coated on a substrate 10, thereby forming a light-shielding coating layer 14A formed from the photosensitive resin composition and exhibiting a low light reflectance. Here, the light-shielding coating layer 14A is formed to completely cover a surface of the substrate 10 and the surfaces of lens faces 12a and lens periphery portions 12b of the lenses 12.

The substrate 10 that can be used in the present process is not particularly limited. Examples thereof include soda glass, alkali-free glass, PYREX (registered trademark) glass, quartz glass, transparent resins, etc.

As used herein, the substrate 10 refers to a structure including both the substrate 10 and the lens(es) 12 if the lens(es) 12 and the substrate 10 are integrally formed.

Further, an undercoat layer may be provided on the substrate 10, as necessary, in order to improve adhesion to an upper layer, to prevent diffusion of a material, or to flatten the surface of the substrate 10.

Various types of coating method such as slit coating, a spray coating method, an inkjet method, spin coating, cast coating, roll coating, and a screen printing method may be applied as a method for coating the photosensitive resin composition on the substrate 10 and the lenses 12.

The film thickness of the photosensitive resin composition immediately after coating thereof is preferably from 0.1 µm to 10 µm, more preferably from 0.2 µm to 5 µm, and still more preferably from 0.2 µm to 3 µm, from the viewpoints of film thickness uniformity of the coating film and ease of drying of the coating solvent.

Drying (pre-baking) of the light-shielding coating layer 14A coated on the substrate 10 may be carried out at a temperature of from 50° C. to 140° C. for from 10 seconds to 300 seconds using, for example, a hot plate or an oven.

The coating film thickness of the photosensitive resin composition after drying (hereinafter, referred to as "dry film thickness" in some cases) may be freely selected in consideration of desired performance such as light-shielding property, and is typically in the range of from 0.1 µm to less than 50 µm.

<Light Exposure Process>

In the light exposure process, the light-shielding coating layer 14A formed through the light-shielding coating layer formation process is subjected to patternwise light exposure. Although the patternwise light exposure may be scanning light exposure, it is preferable that the patternwise light exposure is conducted by light exposure through a mask 70 having a predetermined mask pattern, as shown in FIG. 5B.

In the light exposure in the present process, the patternwise light exposure of the light-shielding coating layer 14A may be carried out by light exposure through a predetermined mask pattern; as a result of the light exposure, only light-irradiated portions of the light-shielding coating layer 14A are cured. Here, a mask pattern with which the surfaces of the lens periphery portions 12b and the surface of the substrate 10 at a region between the lenses 12 are irradiated with light, is used. In this manner, the light irradiation causes curing of the light-shielding coating layer 14A only in the other region than the lens faces 12a, and the cured region forms light-shielding films 14. In regard to radiations that can be used for the light exposure, in particular, ultraviolet radiations such as g-line, h-line, and i-line are preferably employed. The light source for the radiation may be a single-wavelength light source, or a light source that emits light containing all wavelength components, such as a high-pressure mercury lamp.

<Development Process>

Subsequently, an alkali development treatment (development process) is carried out, thereby dissolving portions that have not been irradiated with light in the light exposure process—that is, uncured regions of the light-shielding coating layer 14A—are dissolved in an alkaline aqueous solution, and leaving only portions that have been cured by the light irradiation.

Specifically, the development of the light-shielding layer 14A, which has been exposed to light as shown in FIG. 5B, results in removal of only the portions of the light-shielding coating layer 14A that are formed on the lens faces 12a, and formation of the cured light-shielding film 14 at the other regions, as shown in FIG. 5C.

Examples of the alkali agent contained in the developer (alkaline aqueous solution) used in the development process include organic or inorganic alkali agents, and combinations thereof. In the light-shielding film formation in the first or second embodiment, an organic alkali developer is preferable from the viewpoint of suppression of damage to, for example, neighboring circuits.

Examples of the alkali agent used in the developer include organic alkaline compounds (organic alkali agents) such as aqueous ammonia, ethylamine, diethylamine, dimethylethanolamine, tetramethylammonium hydroxide, tetraethylammonium hydroxide, choline, pyrrole, piperidine, and 1,8-diazabicyclo-[5.4.0]-7-undecene; and inorganic compounds (inorganic alkali agents) such as sodium hydroxide, potassium hydroxide, sodium hydrogen carbonate, and potassium hydrogen carbonate. An alkaline aqueous solution in which an alkali agent is diluted with pure water so as to have a concentration of from 0.001% by mass to 10% by mass, preferably from 0.01% by mass to 1% by mass, is preferable for use as the developer.

The development temperature is usually from 20° C. to 30° C., and the development time is usually in the range of from 20 seconds to 90 seconds.

In a case in which a developer formed of such an alkaline aqueous solution is used, washing (rinsing) with pure water is generally carried out after unexposed portions of the coating film are removed by the developer. Specifically, after the development treatment, surplus developer is removed by sufficient washing with pure water, followed by drying.

If necessary, a curing process of curing the formed light-shielding film (light-shielding pattern) by heating (post-baking) and/or exposure to light may be carried out after the light-shielding coating layer formation process, light exposure process, and development process described above have been carried out.

The post-baking is a heat treatment conducted after development in order to complete the curing, and is usually a thermal curing treatment at from 100° C. to 250° C. The conditions thereof such as the temperature and time of the post-baking can be appropriately set in accordance with the material of the substrate or the lens. For example, when the substrate is glass, a range of from 180° C. to 240° C. is preferably employed from within the above-specified temperature range.

The post-baking treatment may be carried out by thermally curing the resultant light-shielding film 14 after development, in a continuous manner or batchwise manner using a heating device such as a hot plate, a convection oven (hot air circulation type dryer), or a high-frequency heater under the above-described conditions.

In the above procedure, although a case in which the shape of the lenses 12 is a concave shape is described as an example, the shape of the lenses is not particularly limited, and may be a convex shape or an aspheric shape. In the above procedure, although a wafer-level lens having plural lenses 12 formed on one side of the substrate 10 is described as an example, a configuration in which plural lenses 12 are formed on both sides of the substrate 10 may be adopted. In this case, a patterned light-shielding film 14 is formed on the region other than the lens faces, on both sides.

[Configuration and Production of Wafer-Level Lens (2)]

Figure 6:
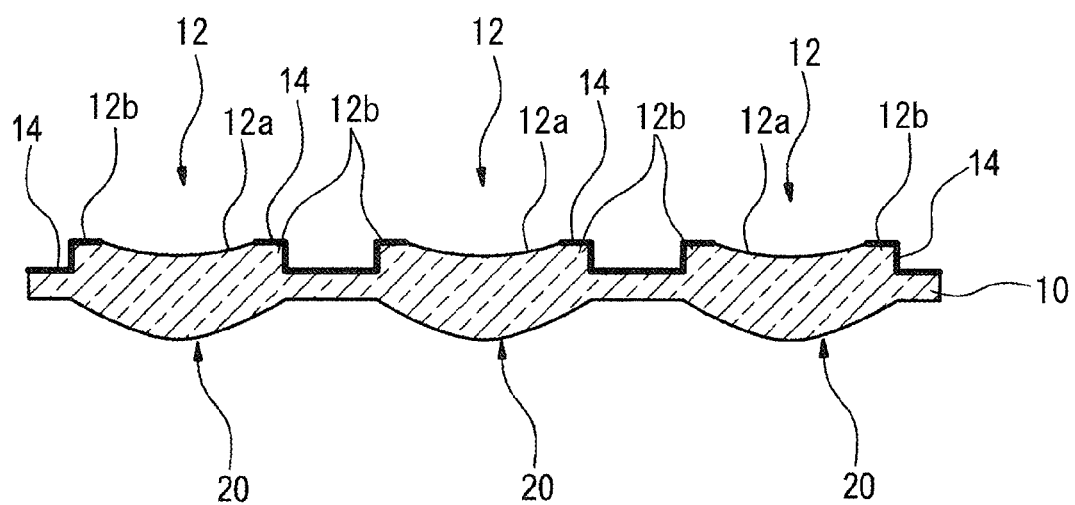
FIG. 6 is a cross-sectional view showing an example of a wafer level lens array.

FIG. 6 is a view showing another configuration example of the wafer-level lens array.

The wafer-level lens shown in FIG. 6 has a configuration (monolithic type) in which the substrate 10 and the lenses 12 are simultaneously molded using the same molding material.

When producing a wafer-level lens of this type, the molding material may be selected from the above-described molding materials. In this example, plural concave lenses 12 are formed on one side of the substrate 10 (upper side in FIG. 6), and plural convex lens 20 are formed on the other side of the substrate 10 (lower side in FIG. 6). The region other than the lens face 12a of the substrate 10, that is, the surface of the substrate 10 and the surfaces of the lens periphery portions 12b are provided with a patterned light-shielding film 14. The procedure described above may be applied as the patterning method for forming the light-shielding film 14.

[Configuration and Production of Wafer-Level Lens (3)]

Next, still another configuration example of the wafer-level lens array and a procedure for producing the same are described with reference to FIGS. 7A to 7C and FIGS. 8A to 8C.

Figure 7A:
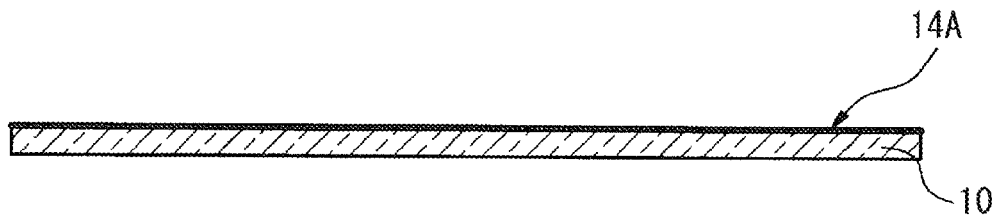
FIGS. 7A to 7C are schematic views showing another embodiment of a process of forming a light-shielding film.
Figure 7B:
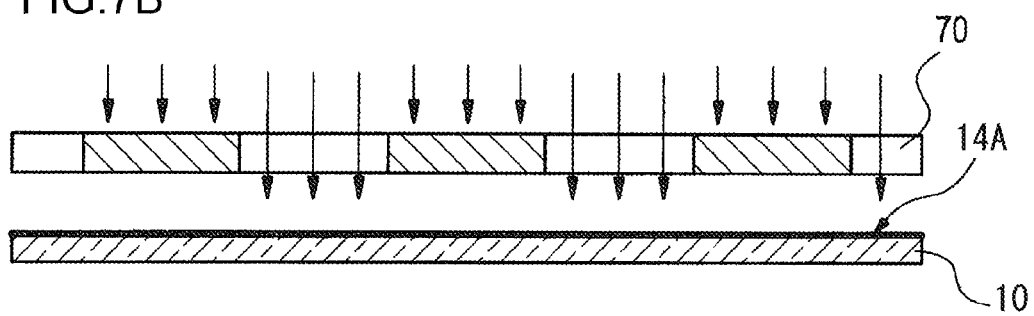
Figure 7C:
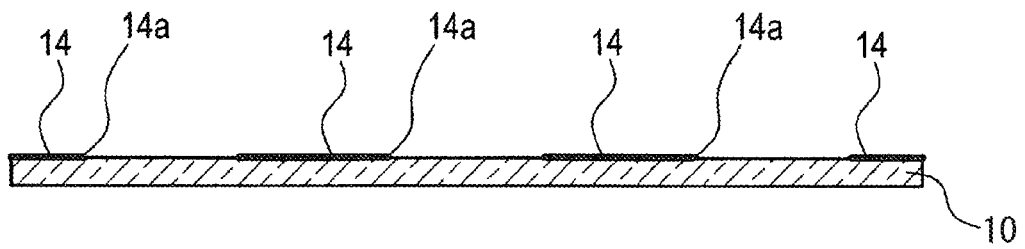

FIGS. 7A to 7C are schematic views showing another process of forming a patterned light-shielding film 14.

Figure 8A:
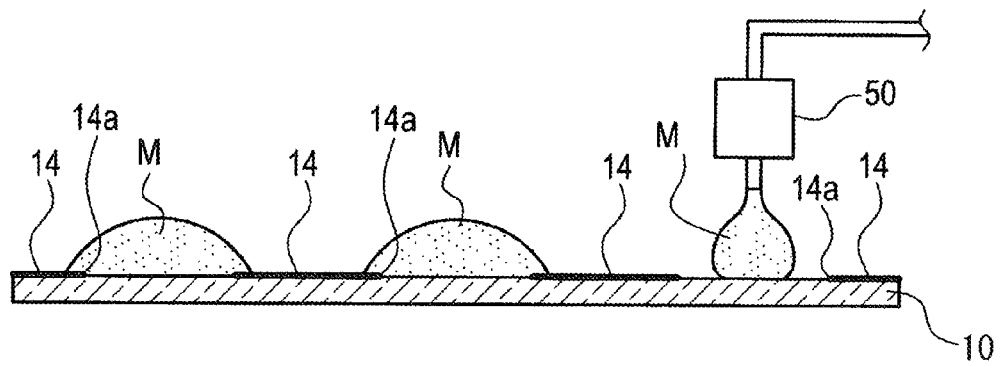
FIGS. 8A to 8C are schematic views showing a process of forming a lens on a substrate having a patterned light-shielding film.
Figure 8B:
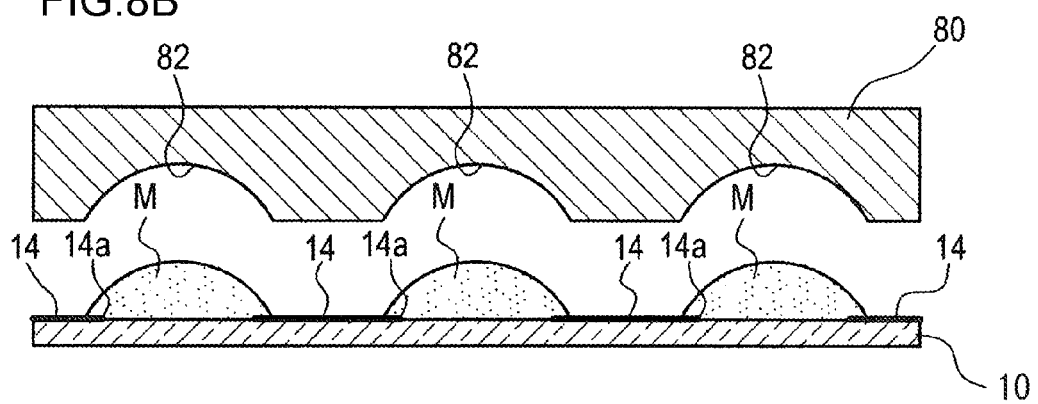
Figure 8C:
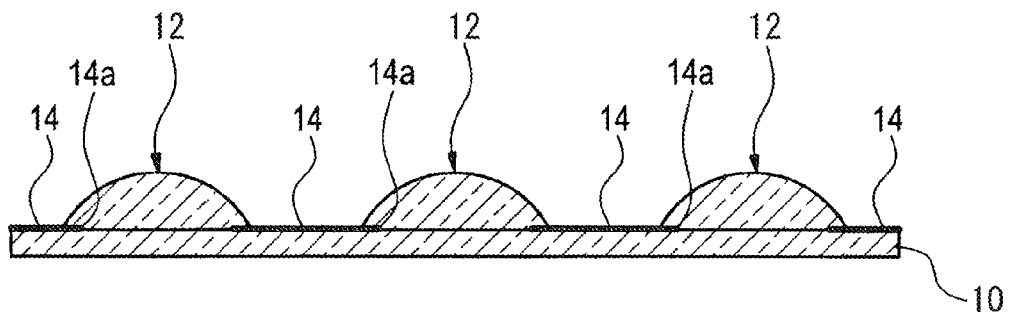

FIGS. 8A to 8C are schematic views showing a process of forming the lenses 12 after the formation of the patterned light-shielding film 14.

In the examples of the wafer-level lens array shown in FIGS. 3 to 6, a patterned light-shielding film 14 is formed on a substrate 10 provided with lenses 12. However, in the procedure described below, a patterned light-shielding film 14 is formed on a substrate 10, and thereafter lenses 12 are formed on the substrate 10 by molding.

—Formation of Light-Shielding Film—

First, as shown in FIG. 7A, a light-shielding coating layer formation process of forming a light-shielding coating layer 14A is carried out by coating the photosensitive resin composition on a substrate 10.

Then, drying of the light-shielding coating layer 14A coated on the substrate 10 is carried out at a temperature of from 50° C. to 140° C. for from 10 seconds to 300 seconds, using, for example, a hot plate or an oven. The dry film thickness of the photosensitive resin composition may be selected, as desired, in accordance with the desired performance such as light-shielding property, and is typically in the range of from 0.1 μm to less than 50 μm.

Then, as shown in FIG. 7B, a light exposure process of patternwise exposing the light-shielding coating layer 14A, which has been formed through the light-shielding coating layer formation process, to light through a mask 70 is carried out. The mask 70 has a predetermined mask pattern. In the light exposure in this process, the light-shielding coating layer 14 is patternwise exposed to light, thereby curing only portions of the light-shielding coating layer 14A that have been irradiated with light. Here, a mask pattern with which only the other region of the light-shielding coating layer 14A than portions that are to become lens apertures 14a of the lenses 12 when the lenses 12 are shaped in a subsequent process is irradiated with light, is used. In this manner, only the other region of the light-shielding coating layer 14A than the portions that are to become lens apertures 14a of the lenses 12 is cured by irradiation with light. As in the above-described procedure, ultraviolet lights such as g-line, h-line, and i-line are preferably employed as radiations that can be used for the light exposure.

Subsequently, an alkali development treatment (development process) is carried out. As a result, only the regions of the light-shielding coating layer 14A that correspond to the lens apertures 14a of the lenses 12, which are portions of the light-shielding coating layer 14A that have not been cured in the patternwise light exposure, are dissolved in an alkaline aqueous solution. In addition, the photo-cured light-shielding coating layer 14A in the other region than the portions corresponding to the lens apertures 14a of the lenses 12 remains on the substrate 10 to form a light-shielding film 14, as shown in FIG. 7C.

The alkali agent contained in the aqueous alkaline solution as the developer may be selected from the above-described alkali agents usable in the above-described procedure.

After the development treatment, surplus developer is removed by washing, followed by drying.

Also in this embodiment, a curing process of curing the formed light-shielding film by the above-described post-baking and/or light exposure may be carried out, if necessary, after the light-shielding coating layer formation process, the light exposure process, and the development process described above have been carried out.

Next, a process for producing a wafer level lens in which a light-shielding film 14 is formed first, and then lenses 12 are formed is described.

—Formation of Lens—

Next, a process of forming lenses 12 after the formation of the light-shielding film 14 is described.

As shown in FIG. 8A, a molding material M for forming lenses 12 is dripped on the substrate 10 on which the patterned light-shielding film 14 has been formed, using a dispenser 50. The molding material M is supplied to regions that partially include end portions of the light-shielding film 14 that are adjacent to lens apertures 14a of the lenses 12, so as to cover the regions corresponding to the lens apertures 14a of the lenses 12.

After the molding material M is supplied to the substrate 10, a mold 80 for forming lenses is disposed at a side of the substrate 10 at which the molding material M has been supplied, as shown in FIG. 8B. The mold 80 is provided with depressed areas 82 for transferring the shape of the lenses 12, in accordance with the desired number of the lenses 12.

The mold 80 is pressed against the molding material M on the substrate 10, thereby deforming the molding material M to conform to the shape of the depressed areas. In the state in which the mold 80 is pressed against the molding material M, the molding material M is cured by irradiating heat or ultraviolet rays from the outside of the mold in a case in which the molding material M is a thermosetting resin or a UV curable resin.

After the molding material M is cured, the substrate 10 and the lenses 12 are released from the mold 80, and wafer-level lenses having a patterned light-shielding film 14 formed on the substrate 10 is obtained, as shown in FIG. 8C.

As described above, the configuration of the patterned light-shielding film 14 provided on the wafer-level lens is not limited to the configuration shown in FIG. 5 in which the light-shielding film 14 is provided in the other region than the lens faces 12a of the lenses 12, and the configuration shown in FIG. 8C in which the light-shielding film 14 is provided in the other region than the lens apertures 14a of the lenses 12 may alternatively be adopted.

In the wafer-level lens, the light-shielding film 14 exhibiting a low light reflectance is formed in pattern on at least one surface of the substrate 10. The thus-formed light-shielding film sufficiently shields against light in the other region than the lens faces 12a or lens apertures 14a of the lenses 12, and suppresses the generation of reflected light. Accordingly, when the wafer-level lens is applied to an image pickup module equipped with an image pickup device (e.g., a solid-state image pickup device), occurrence of problems in image pickup such as ghost or flare caused by reflected light can be prevented.

Further, since the light-shielding film 14 is disposed on a surface of the substrate, there is no need to attach another light-shielding member to the wafer-level lens, as a result of which an increase in production costs can be suppressed.

In a configuration in which a structure having an irregular surface is provided around the lens such as the configuration disclosed in International Publication No. WO 2008/102648, the light incident on the structure is reflected or diverged, which may cause a problem such as ghost. In consideration of this, a configuration may be adopted in which a patterned light-shielding film 14 is provided in the other region than the lens faces 12a of the lenses 12 as shown in FIG. 5; this configuration enables shielding of light in the other region than the lens faces 12a, thereby improving optical performance.

The titanium black dispersion and photosensitive resin composition of the third embodiment as described above may be used for formation of a light-shielding film which is provided on the back side of a silicon substrate having an image pickup device section on the front surface thereof, and which shields against infrared light (i.e., for formation of a light-shielding film that shields against infrared light incident from the back side of a silicon substrate which is a base substrate of a solid-state image pickup device), without particular limitation.

Among the structures of solid-state image pickup devices, the structure of a solid-state image pickup device according to the structure K described below is a structure with high necessity to shield against infrared light incident from the back side and to reduce development residues on the metal electrode.

For this reason, the titanium black dispersion and photosensitive resin composition of the third embodiment, which exert effects in terms of enhanced ability to shield against infrared light and reduction of residues, are particularly favorable for the formation of a light-shielding film of a solid-state image pickup device according to the structure K described below.

<<Light-Shielding Film>>

The light-shielding film of the third embodiment is formed using the photosensitive resin composition of the third embodiment.

Therefore, the light-shielding film of the third embodiment has excellent ability to shield against infrared light.

In addition, occurrence of residues in the neighborhood of the light-shielding film of the third embodiment (the region on the silicon substrate at which the light-shielding film is not formed) is suppressed.

The film thickness of the light-shielding film is not particularly limited, and is preferably from 0.1 μm to 10 μm, more preferably from 0.3 μm to 5.0 μm, and particularly preferably from 0.5 μm to 3.0 μm, from viewpoint of further effectively obtaining the effects of the third embodiment. The pattern size of the light-shielding film is not particularly limited, and is preferably 1000 μm or less, more preferably 500 μm or less, and particularly preferably 300 μm or less, from viewpoints of further effectively obtaining the effects of the third embodiment. The lower limit of the pattern size is desirably 1 μm.

The spectral characteristics of the light-shielding film of the third embodiment are not particularly limited. The ratio of the optical density ($OD_{1200}$) of the light-shielding film at a wavelength of 1200 nm and the optical density ($OD_{365}$) of the light-shielding film at a wavelength of 365 nm [$OD_{1200}/OD_{365}$] is preferably from 0.5 to 3, from viewpoint of further improving the ability to shield against infrared light, from the viewpoint of the balance in light-shielding ability between the visible-light region and the infrared region, etc.

Optical density (OD) is obtained by measuring the transmittance of the obtained film using a UV-3600 (trade name) manufactured by Shimadzu Corporation, and converting the obtained transmittance (% T) according to the following equation B.

$$OD\ value = -Log(\%\ T/100) \quad \text{Equation B}$$

In the third embodiment, an optical density at a wavelength of λ nm is represented by "$OD_\lambda$".

From the viewpoint of the balance in light-shielding ability between the visible-light region and the infrared region, and from the viewpoint of effectively obtaining the effects of the third embodiment, the optical density of the light-shielding film preferably satisfies the following conditions:

$[OD_{1200}/OD_{365}]$ is more preferably from 1.0 to 2.5, and particularly preferably from 1.3 to 2.0;

The optical density ($OD_{1200}$) of the light-shielding film at a wavelength of 1200 nm is preferably from 1.5 to 10, and more preferably from 2 to 10;

The optical density ($OD_{365}$) of the light-shielding film at a wavelength of 365 nm is preferably from 1 to 7, and more preferably from 2 to 6;

The optical density of the light-shielding film in the wavelength region of from 900 nm to 1300 nm is preferably from 2 to 10, more preferably from 2 to 9, and particularly preferably from 2 to 8;

The ratio $[OD_{900}/OD_{365}]$ of the light-shielding film is preferably from 1.0 to 2.5, and more preferably from 1.1 to 2.5;

The ratio $[OD_{1100}/OD_{365}]$ of the light-shielding film is preferably from 0.6 to 2.5, and more preferably from 0.7 to 2.5; and The ratio $[OD_{1300}/OD_{365}]$ of the light-shielding film is preferably from 0.4 to 2.3, and more preferably from 0.5 to 2.0.

A specific example of the light-shielding film of the third embodiment described above may be the light-shielding film described above as an application of the titanium black dispersion and the photosensitive resin composition of the third embodiment.

<<Method for Producing Light-Shielding Film>>

The method for producing a light-shielding film of the third embodiment includes coating the photosensitive resin composition of the third embodiment on one side of a silicon substrate having an image pickup device section on the other side, to form a photosensitive layer (hereinafter sometimes referred to as "photosensitive layer formation process"), patternwise exposing the photosensitive layer to light (hereinafter sometimes referred to as "light exposure process"), and developing the photosensitive layer after the light exposure to form a pattern (hereinafter sometimes referred to as "development process").

According to the method for producing a light-shielding film of the third embodiment, a light-shielding film having excellent ability to shield against infrared light can be formed, and residues (hereinafter sometimes referred to as "development residues") in a region other than regions on in which the light-shielding film is formed can be reduced when the light-shielding film is formed.

Individual processes of the method for producing a light-shielding color filter of the third embodiment is described below.

—Photosensitive Layer Formation Process—

In the photosensitive layer formation process, the photosensitive resin composition of the third embodiment is coated on a silicon substrate to form a photosensitive layer.

Various coating methods, such as slit coating, an inkjet method, spin coating, cast coating, roll coating, and a screen printing method, may be employed as a method for coating the photosensitive resin composition of the third embodiment on the silicon substrate.

The coating film thickness (dry thickness) of the photosensitive resin composition is preferably from 0.35 µm to 3 µm, and more preferably from 0.50 µm to 2.5 µm, from the viewpoints of resolution and developability.

The photosensitive resin composition coated on the silicon substrate is usually dried under conditions of from 70° C. to 130° C. for from 2 minutes to 4 minutes, thereby forming a photosensitive layer.

—Light Exposure Process—

In the light exposure process, the photosensitive layer formed in the photosensitive layer formation process is patternwise exposed to light, for example through a mask, so as to cure the photosensitive layer. When the exposure to light is carried out through a mask, only the portions of the coating film that have been irradiated with light are cured.

The light exposure is preferably carried out by irradiation with a radiation. Preferable examples of radiations that can be used for the light exposure include, in particular, ultraviolet rays such as g-rays, h-rays or i-rays. A high pressure mercury lamp is more preferable. The irradiation intensity is preferably from 5 mJ to 3000 mJ, more preferably from 10 mJ to 2000 mJ, and most preferably from 10 mJ to 1000 mJ.

—Development Process—

Subsequent to the light exposure process, the photosensitive layer after exposure to light is developed, for example by alkali development treatment, to form a pattern. In the development process, regions of the photosensitive layer that have not been irradiated in the light exposure process are dissolved in, for example, an aqueous alkali solution, as a result of which only the light-irradiated regions are left.

The developer is preferably an organic alkali developer from the viewpoint of avoiding damage to, for example, underlying circuits. The development temperature is usually from 20° C. to 30° C., and the development time is usually from 20 seconds to 240 seconds.

An example of the developer is an aqueous alkaline solution obtained by diluting an organic alkaline compound with pure water to a concentration of from 0.001 to 10% by mass, preferably from 0.01 to 1% by mass. Examples of organic alkaline compounds that can be used include ammonia water, ethylamine, diethylamine, dimethylethanolamine, tetramethylammonium hydroxide, tetraethylammonium hydroxide, choline, pyrrole, piperidine, 1,8-diazabicyclo-[5,4,0]-7-undecene, etc. When an aqueous alkaline solution is used as a developer, washing (rinsing) with pure water is carried out after the development.

If necessary, the method for producing a light-shielding film of the third embodiment may further include a curing process of curing the developed pattern by heating and/or light exposure, in addition to the photosensitive layer formation process, the light exposure process, and the development process described above.

<<Solid-State Image Pickup Device>>

The solid-state image pickup device of the third embodiment has the light-shielding film of the third embodiments.

That is, since the solid-state image pickup device of the third embodiment includes a light-shielding film formed using the photosensitive resin composition of the third embodiment, noise generated by infrared light incident on the silicon substrate (base substrate of solid-state image pickup device) from the opposite side to a side provided with an image pickup device section and noise generated by residues are reduced.

The structure of the solid-state image pickup device of the third embodiment is not particularly limited so long as an image pickup device section (specifically, an image pickup device section composed of plural image pickup devices aligned, for example, in a matrix pattern) is provided on one side of a silicon substrate, and the light-shielding film of the third embodiment is provided on the other side of the silicon substrate.

The image pickup device may be a CCD or a CMOS.

In particular, a structure of a solid-state image pickup device which has a metal electrode for connection to a mounting substrate (hereinafter sometimes referred to as "circuit substrate") on the opposite side to a side on which an image pickup device section is formed, and which is described in JP-A No. 2009-99591 and JP-A No. 2009-158863, is a favorable structure of the solid-state image pickup device of the third embodiment.

That is, one favorable structure of the solid-state image pickup device of the third embodiment (sometimes referred to as "structure K" in the present specification) is a solid-state image pickup device which includes:

a silicon substrate having an image pickup device section on one side thereof (hereinafter sometimes referred to as "first main face");

a metal electrode provided on the other side of the silicon substrate (hereinafter sometimes referred to as "second main face") and electrically connected to the image pickup device section; and a light-shielding film of the third embodiment provided on the side of the silicon substrate on which the metal electrode is provided, and patterned to expose at least a part of the metal electrode.

First, a conventional solid-state image pickup device in which a wire bonding method is used is described below, for comparison with the structure K.

So far, solid-state image pickup devices have been connected to a circuit substrate by a wire bonding method. Specifically, solid-state image pickup devices have been disposed on a circuit substrate, and electrodes for connection provided on the image pickup device section side of the silicon substrate have been connected to electrodes for connection provided on the circuit substrate, by using wires. In this structure in which a wire bonding method is adopted, bonding regions have large areas; thus, downsizing of camera modules is difficult with this structure.

In contrast, the solid-state image pickup device having the structure K is connected to a mounting substrate (hereinafter sometimes referred to as "circuit substrate") by using a connection material such as solder ball, rather than a wire.

Connection of the solid-state image pickup device of the structure K to the circuit substrate is carried out by arranging the solid-state image pickup device and the circuit substrate in directions such that the metal electrode and a connection electrode on the circuit substrate face each other, and connecting the metal electrode and the connection electrode to each other by using a connection material (see, for example, FIGS. 9 and 10 discussed below).

As in the solid-state image pickup device of the structure K, use of a solid-state image pickup device of which a metal electrode on the back side is connected to the circuit substrate (without using any wire) allows a wire bonding space to be omitted, and enables remarkable downsizing of a camera module (see, for example, Toshiba Corporation news release "*Keitai-denwa-you CMOS camera module naiseikaniyoru CMOS image sensor jigyouno kyoukani tsuite*" (Reinforcement of CMOS image sensor business through in-house manufacturing of CMOS camera module for cellular phones), [online], Oct. 1, 2007, [searched on Nov. 12, 2009], internet <URL:http://www.toshiba.co.jp/about/press/2007_10/pr_j0102.htm>).

However, when a solid-state image pickup device that is connected to the circuit substrate via a metal electrode on the back side is used, a gap (for example, gap S in FIG. 9) is likely to be generated between the solid-state image pickup device and the circuit substrate due to the thickness of metal electrode or the size of the connection material (such as solder balls 160), and infrared light tends to be incident upon the silicon substrate through this gap.

Further, in the case of, for example, the camera module 300 described below, although a light-shielding electromagnetic shield 144 is provided, it is extremely difficult, in terms of processing accuracy, to completely remove the gap S between the light-shielding electromagnetic shield 144 and the circuit substrate 170, due to the effect of variations of the volumes of solder balls 160 or the like.

For the reasons described above, the structure of a solid-state image pickup device that is to be connected to a circuit substrate via a metal electrode provided on the back side is a structure for which the necessity to shield against infrared light incident from the back side of the silicon substrate is particularly high.

Accordingly, in such a structure, the effects of the third embodiment (effects in terms of improvement in the ability to shield against infrared light and reduction of noise generated by infrared light) are exerted more effectively.

Further, the solid-state image pickup device having a metal electrode on the back side thereof has a structure for which the connectability between the metal electrode and the connection material for connection to the circuit substrate is required.

Accordingly, in such a structure, the effects of the third embodiment (the effect in terms of reduction of residues and the effect in terms of reduction of noise generated by the residues) are exerted further effectively.

The structure K may further include a protective insulating layer, such as a solder resist layer, at the lower side (a side nearer to the silicon substrate) of the light-shielding film but at the upper side (a side farther from the silicon substrate) of the metal electrode.

In other words, the structure K may have a configuration which has:

a protective insulating layer provided on the second main face on which the metal electrode has been formed, and patterned to expose at least a part of the metal electrode; and the light-shielding film provided to cover the protective insulating layer, and patterned to expose at least a part of the metal electrode.

In the structure K, "electrically connected" encompasses direct connection as well as indirect connection through, for example, a peripheral circuit.

Specific examples of the structure K are described below with reference to FIGS. 9 and 10. However, the third embodiment is not limited to the specific examples described below.

Figure 9:
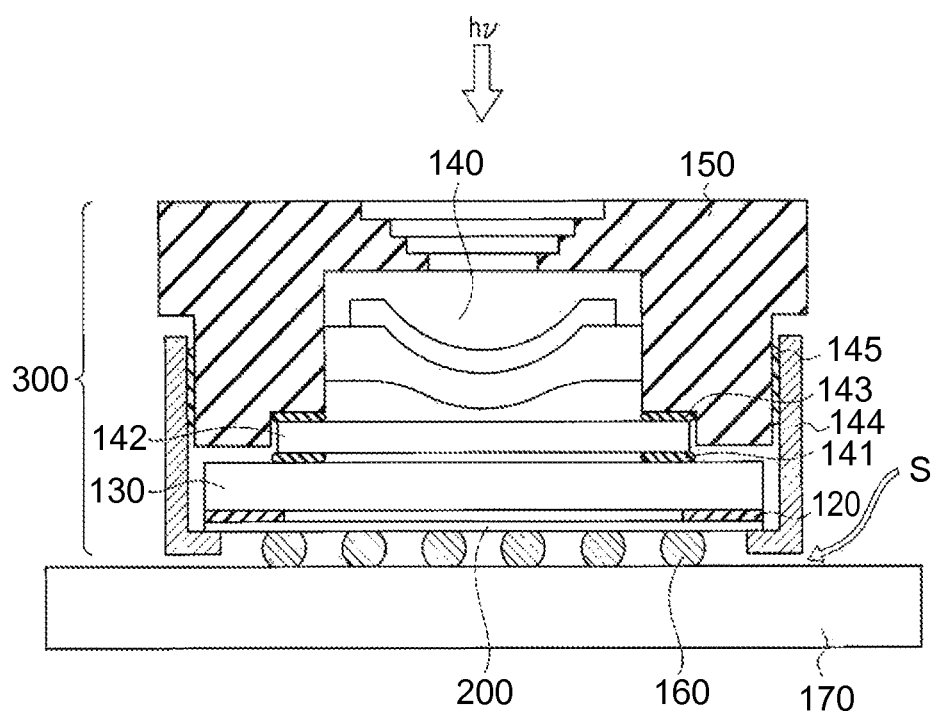
FIG. 9 is a schematic cross-sectional view illustrating a configuration of a camera module equipped with a solid-state image pickup device according to one example of the third embodiment.
Figure 10:
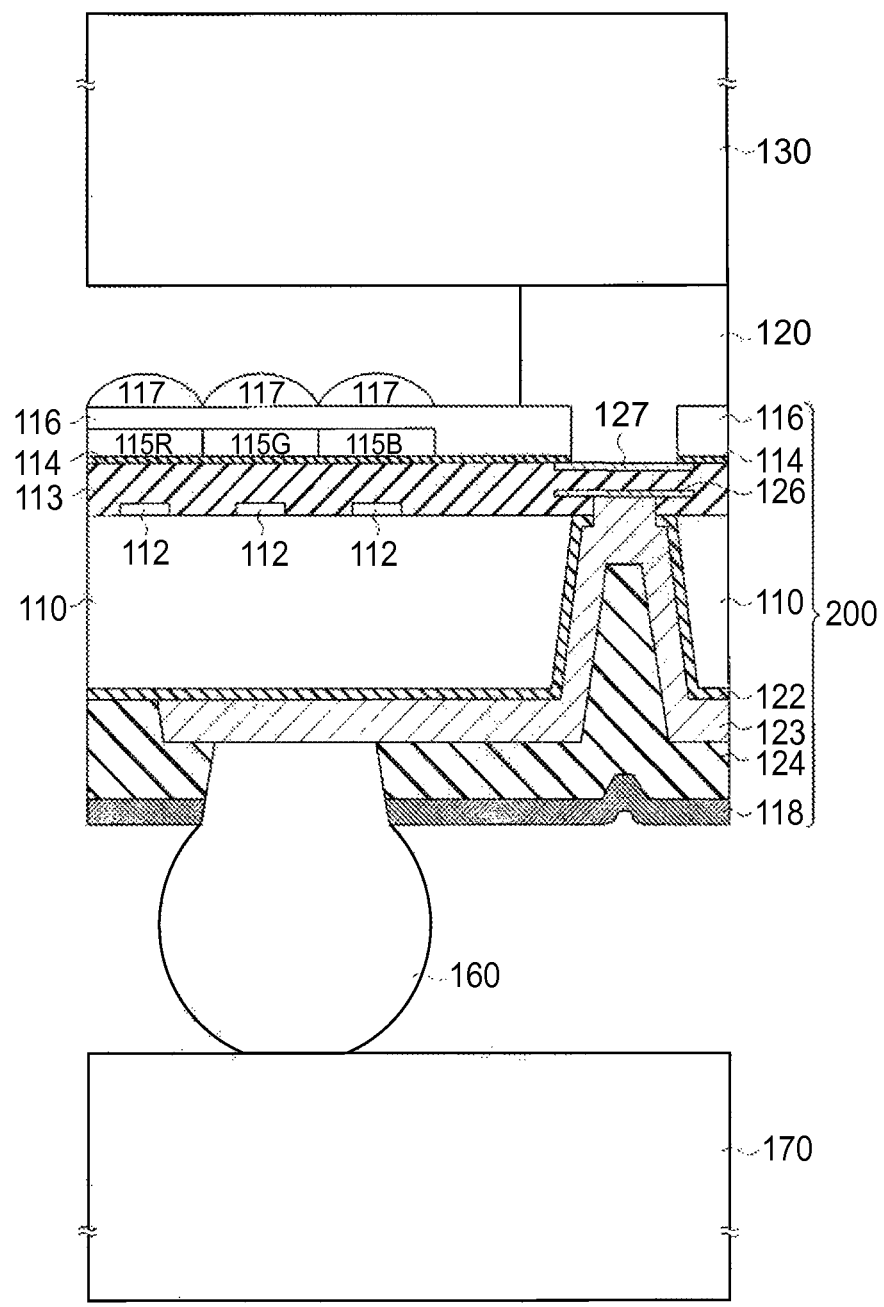
FIG. 10 is a schematic cross-sectional view illustrating a solid-state image pickup device according to one example of the third embodiment.

Elements common to FIGS. 9 and 10 are designated by a common reference character.

In the description, "on", "above" and "upper side" refers to a side farther from a silicon substrate 110, and "under", "below" and "lower side" refers to a side nearer to the silicon substrate 110.

FIG. 9 is a schematic cross-sectional view illustrating the configuration of a camera module having a solid-state image pickup device according to a specific example of the structure K.

A camera module 300 shown in FIG. 9 is connected to a circuit substrate 170 as a mounting substrate via solder balls 160 as a connection material.

Specifically, the camera module 300 includes a solid-state image pickup device substrate 200 that has an image pickup device section on the first main face of a silicon substrate, a glass substrate 130 (light-transmitting substrate) disposed above the first main face of the solid-state image pickup device substrate 200, an infrared cut-off filter 142 disposed above the glass substrate 130, a lens holder 150 which is disposed above the glass substrate 130 and the infrared cut-off filter 142 and which accommodates an image pickup lens 140 in the interior thereof, and a light-shielding electromagnetic shield 144 disposed to surrounds the periphery of the solid-state image pickup device substrate 200 and the glass substrate 130. Respective elements are adhered through adhesives 120, 141, 143, and 145.

The camera module 300 is configured to allow incident light hv from the outside to transmit through the image pickup lens 140, the infrared cut-off filter 142 and the glass substrate 130 in this order, and then to reach the image pickup device section of the solid-state image pickup device substrate 200.

The camera module 300 is connected, at the second main face of the solid-state image pickup device substrate 200, to the circuit substrate 170 via the solder balls 160 (connection material).

FIG. 10 is an enlarged cross-sectional view illustrating the solid-state image pickup device substrate 200 illustrated in FIG. 9.

The solid-state image pickup device substrate 200 includes a silicon substrate 110 as a base material, image pickup devices 112, an interlayer insulating film 113, a base layer 114, a color filter 115R, a color filter 115G, a color filter 115B, an overcoat 116, micro lenses 117, a light-shielding film 118, an insulating film 122, a metal electrode 123, a solder resist layer 124, an internal electrode 126, and a device-face electrode 127.

The solder resist layer 124 may be omitted.

First, the configuration of the first main face side of the solid-state image pickup device substrate 200 is described mainly.

As shown in FIG. 10, an image pickup device section is provided in which plural image pickup devices 112, such as CCDs or CMOSs, are disposed two-dimensionally on the first main face side of a silicon substrate 110, which is a base material of the solid-state image pickup device substrate 200.

The interlayer insulating film 113 is formed on the image pickup devices 112 in the image pickup device section, and a base layer 114 is formed on the interlayer insulating film 113. Further, a red color filter 115R, a green color filter 115G, and a blue color filter 115B (hereinafter sometimes collectively referred to as "color filters 115") are disposed on the base layer 114 so as to respectively correspond to the image pickup devices 112.

A light-shielding film (not shown) may be provided on the boundary regions between the red color filter 115R, the green color filter 115G, and the blue color filter 115B and a region surrounding the image pickup device section. The light-shielding film can be produced by using, for example, a known black color resist.

The overcoat 116 is formed on the color filters 115, and the micro lenses 117 are formed on the overcoat 116 so as to respectively correspond to the image pickup devices 112 (color filters 115).

In addition, a peripheral circuit (not shown) and the internal electrode 126 are provided in the vicinity of the image pickup device section at the first main face side, and the internal electrode 126 is electrically connected to the image pickup device 112 through the peripheral circuit.

The device-face electrode 127 is formed on the internal electrode 126 with the interlayer insulating film 113 interposed therebetween. A contact plug (not shown) is provided in a region of the interlayer insulating film 113 positioned between the internal electrode 126 and the device-face electrode 127, and electrically connects these electrodes. The device-face electrode 127 is used for electric voltage application, signals reading, etc. via the contact plug and the internal electrode 126.

The base layer 114 is formed on the device-face electrode 127. The overcoat 116 is formed on the base layer 114. The base layer 114 and the overcoat 116 formed on the device-face electrode 127 are removed to form an opening, as a result of which a pad opening portion is formed, and a part of the device-face electrode 127 is exposed.

The configuration of the first main face side of the solid-state image pickup device substrate 200 is as described above.

At the first main face side of the solid-state image pickup device substrate 200, an adhesive 120 is provided around the image pickup device section, and the solid-state image pickup device substrate 200 and the glass substrate 130 are adhered to each other via the adhesive 120.

The silicon substrate 110 has a through hole that penetrates through the silicon substrate 110, and a through electrode that is a part of the metal electrode 123 is provided in the through hole. The through hole electrically connects the image pickup device section and the circuit substrate 170.

Next, the configuration of the second main face side of the solid-state image pickup device substrate 200 is mainly described below.

At the second main face side, the insulating film 122 is formed on the second main face and the inner wall of the through hole.

The metal electrode 123, which is patterned to spread over a region of the second main face of the silicon substrate 110 and the inside of the through hole, is provided on the insulating film 122. The metal electrode 123 is an electrode for connection between the image pickup device section of the solid-state image pickup device substrate 200 and the circuit substrate 170.

The through electrode is a portion of the metal electrode 123 that is formed inside the through hole. The through electrode penetrates through the silicon substrate 110 and a part of the interlayer insulating film to reach the lower side of the internal electrode 126, and the through electrode is electrically connected to the internal electrode 126.

Further, at the second main face side, the solder resist layer 124 (protective insulating film) which covers the second main face provided with the metal electrode 123, and which has an opening at which a part on the metal electrode 123 is exposed, is provided.

Moreover, at the second main face side, a light-shielding film 118 which covers the second main face provided with the solder resist layer 124, and which has an opening at which a part of the metal electrode 123 is exposed, is provided.

As the light-shielding film 118, the light-shielding film of the third embodiment is used.

As a result, infrared light incident from the second main face side (back surface side) to the silicon substrate 110 can be shielded. In addition, development residues are suppressed in the opening of the light-shielding film 118 (a region at which the metal electrode 123 is exposed). Therefore, the connection between the metal electrode 123 and the solder ball 160, and the connection between the image pickup device section having the image pickup devices 112 and the circuit substrate 170, are favorably maintained.

Although the light-shielding film 118 is patterned to cover part of the metal electrode 123 and to expose the other part thereof in FIG. 10, the light-shielding film 118 may alternatively be patterned to expose the entire metal electrode 123, and the same applies to patterning of the solder resist layer 124.

The solder resist layer 124 may be omitted, and the light-shielding film 118 may be directly formed on the second main face provided with the metal electrode 123.

A solder ball 160 as a connection member is provided on the exposed metal electrode 123, and the metal electrode 123 of the solid-state image pickup device substrate 200 is electrically connected to a connection electrode (not shown) of the circuit substrate 170 via this solder ball 160.

The above description explains the configuration of the solid-state image pickup device substrate 200. Elements, other than the light-shielding film 118, of the solid-state image pickup device substrate 200 can be formed by a known method such as a method described in paragraphs [0033] to [0068] of JP-A No. 2009-158863 or a method described in paragraphs [0036] to [0065] of JP-A No. 2009-99591.

The formation of the light-shielding film 118 may be carried out according to the method for producing a light-shielding film of the third embodiment.

The interlayer insulating film 113 is formed, for example, as a $SiO_2$ film or a SiN film by sputtering, chemical vapor deposition (CVD) or the like.

The color filters 115 (115R, 115G, 115B) are formed by, for example, photolithography using a known color resist.

The overcoat 116 and the base layer 114 are formed by, for example, photolithography using a known resist for forming an organic interlayer film.

The micro lens 117 is formed by, for example, photolithography using a styrenic resin or the like.

The solder resist layer 124 is formed by, for example, photolithography using a known solder resist containing a phenol resin, a polyimide resin, or an amine resin.

The solder ball 160 is formed using, for example, Sn—Ag, Sn—Cu, Sn—Ag—Cu, or the like as Sn—Pb (eutectic), 95 Pb—Sn (lead-rich high-melting soldering), or Pb-free soldering. The solder ball 160 is formed, for example, in the form of a sphere having a diameter of from 100 μm to 1000 μm (preferably a diameter of from 150 μm to 700 μm).

The internal electrode 126 and the device-face electrode 127 are formed, for example, as metal electrodes of Cu or the like by chemical mechanical polishing (CMP) or by photolithography and etching.

The metal electrode 123 is formed as, for example, a metal electrode of Cu, Au, Al, Ni, W, Pt, Mo, a Cu compound, a W compound, a Mo compound, or the like by sputtering, photolithography, etching, and electrolytic plating. The metal electrode 123 may have a single layer structure or a laminate structure composed of two or more layers.

The film thickness of the metal electrode 123 is, for example, from 0.1 μm to 20 μm (preferably from 0.1 μm to 10 μm).

The silicon substrate 110 is not particularly limited, and a silicon substrate of which the thickness has been decreased by grinding down the back surface of the substrate may be used. The thickness of the substrate is not limited. For example, a silicon wafer having a thickness of from 20 to 200 μm (preferably from 30 to 150 μm) may be used.

The though hole of the silicon substrate 110 is formed by, for example, photolithography and RIE (reactive ion etching).

In the above, the solid-state image pickup device substrate 200, which is a specific example of the structure K, has been described with reference to FIGS. 9 and 10. However, the structure K is not limited to the configuration illustrated in FIGS. 9 and 10, and the configuration thereof is not particularly limited so long as the configuration has a metal electrode and the light-shielding film at the back face side.

EXAMPLES

The present invention is described more specifically below, with reference to examples. However, the invention is not limited to the following examples as long as the gist of the invention is retained. Unless specifically indicated otherwise, "part" is based on mass. Further, room temperature refers to 25° C.

Examples of First Embodiment

Synthesis of Dispersant 1

600.0 g of ε-caprolactone and 22.8 g of 2-ethyl-1-hexanol were introduced into a 500 mL three-neck flask, and were stirred and dissolved while flowing nitrogen thereinto. 0.1 g of monobutyl tin oxide was added into the flask, and the contents of the flask were heated to 100° C. After 8 hours, it was confirmed by gas chromatography that the raw materials had disappeared, and the contents of the flask were cooled to 80° C. 0.1 g of 2,6-di-t-butyl-4-methylphenol was added into the flask, and 27.2 g of 2-methacryloyloxyethyl isocyanate was further added thereto. After 5 hours, it was confirmed by $^1$H-NMR that the raw materials had disappeared, and, thereafter, the contents of the flask were cooled to room temperature, as a result of which 200 g of a precursor M1 (having the following structure) in the solid state was obtained. It was confirmed by $^1$H-NMR, IR, and mass spectrometry that the obtained substance was M1.

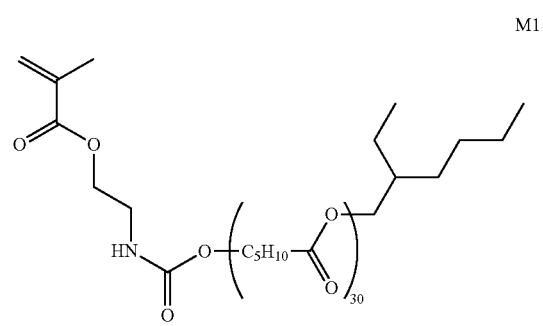

M1

30.0 g of the precursor M1, 70.0 g of NK ester CB-1, 2.3 g of dodecylmercaptan and 233.3 g of propylene glycol monomethyl ether acetate were added into a nitrogen-replaced three-neck flask, and were stirred with a stirrer (three-one motor manufactured by Shinto Scientific Co., Ltd.), and were heated to a temperature of 75° C. while flowing nitrogen into the flask. 0.2 g of dimethyl 2,2'-azobis(2-methylpropionate) ("V-601" (tradename) manufactured by Wako Pure Chemical Industries, Ltd.) was added thereto, and stirring under heating was carried out at 75° C. for 2 hours. After 2 hours, 0.2 g of V-601 was further added thereto, and stirring under heating was carried out for 3 hours, as a result of which a 30% solution of the following dispersant 1 was obtained.

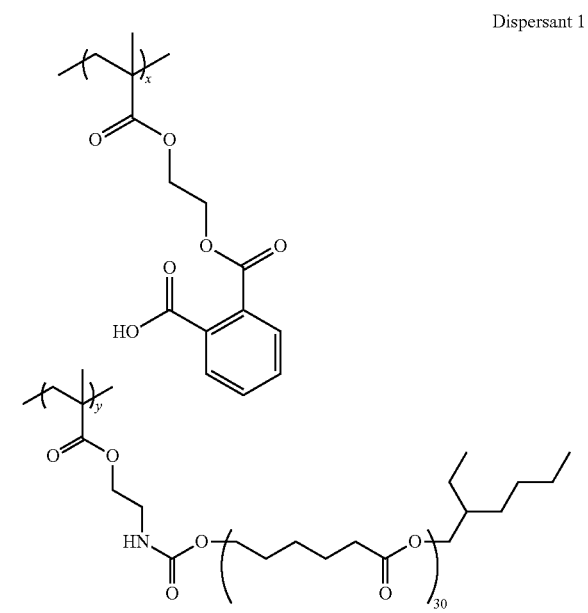

Dispersant 1

The composition ratio, acid value, and weight average molecular weight (Mw) of the dispersant 1 were as follows.

Here, the weight average molecular weight is a value measured using a gel permeation chromatograph (GPC) and calculated as a polystyrene-equivalent value. The measurement using a GPC was carried out using a HLC-8020 GPC (trade name, manufactured by Tosoh Corporation) and using TSKgel SuperHZM-H, TSKgel SuperHZ4000, and TSKgel SuperHZ200 (trade names, manufactured by Tosoh Corporation) as columns.

Composition ratio: x=35 (% by mass), y=65 (% by mass)
Acid value: 80 mgKOH/g
Mw: 30,000

Example 1-1, Comparative Example 1-1

Production of Titanium Black 100 g of titanium oxide MT-150A (trade name, manufactured by Tayca Corporation) having an average particle diameter of 15 nm, 25 g of silica particles AEROPERL (registered trademark) 300/30 having a BET surface area of 300 $m^2/g$ (manufactured by Evonik Industries AGd.), and 100 g of a dispersant DISPERBYK190 (trade name: manufactured by BYK-Chemie GmbH) were weighed out, 71 g of ion exchange water was added thereto, and the resultant mixture was treated for 20 minutes using a MAZERSTAR KK-400W manufactured by Kurabo Industries Ltd. at an orbital rotation number of 1360 rpm and a spin rotation number of 1047 rpm, as a result of which a uniform mixture aqueous solution was obtained. This aqueous solution was filled into a quartz container, and heated under an oxygen atmosphere at 920° C. using a small Rotary kiln (manufactured by Motoyama Co., Ltd.). Then, the atmosphere was replaced with nitrogen, and nitridation reduction treatment was carried out by flowing an ammonia gas at 100 mL/min at 920° C. for 5 hours. After completion of the nitridation reduction treatment, the recovered powder was ground with a mortar, as a result of which a powdery titanium black T having an average particle diameter of 30 nm or less and specific a surface area of 73 $m^2/g$ was obtained.

<Preparation of Titanium Black Dispersions 1-A and 1-B>

The ingredients listed in the following composition 1-1 were mixed for 15 minutes using a stirrer (EUROSTAR (trade name) manufactured by IKA Laboratory), to obtain a dispersion 1-a.

(Composition 1-1)

| | |
|---|---|
| Titanium black T (titanium black having an average particle diameter of 30 nm or less): | 25 parts |
| The 30% solution of the dispersant 1: | 25 parts |
| Propylene glycol monomethyl ether acetate (PGMEA) (solvent): | 50 parts |

The resultant dispersion 1-a was subjected to dispersing treatment using an ULTRA APEX MILL UAM015 (trade name) manufactured by Kotobuki Industries Co., Ltd., under the following conditions.

<Dispersion Conditions>

| | |
|---|---|
| Bead diameter: | diameter of 0.05 mm |
| Filling ratio of beads: | 75 vol % |
| Circumferential velocity of mill: | 8 m/sec |
| Amount of mixed liquid to be dispersed: | 500 g |
| Circulating flow rate (pump supply amount): | 13 kg/hour |
| Temperature of liquid to be treated: | from 25 to 30° C. |
| Cooling water: | tap water |
| Volume of circular path of bead mill: | 0.15 L |
| Number of passes: | 90 passes |

As a result of the above, a dispersion 1-A of Example 1-1 was obtained.

A dispersion 1-b was prepared which had the same composition as the dispersion 1-a of Example 1-1, except that the titanium black T used in Example 1-1 was replaced by "13M-T" (trade name) manufactured by Mitsubishi Materials Corporation. The dispersion 1-b was subjected to the same dispersing treatment as in Example 1-1, as a result of which a dispersion 1-B of Comparative Example 1-1 was obtained.

<Evaluation of Titanium Black Dispersions 1-A and 1-B>

Each of the obtained titanium black dispersions 1-A and 1-B was diluted 500-fold with propylene glycol monomethyl ether acetate (hereinafter sometimes abbreviated to PGMEA), and dripped on a carbon thin film and dried, and photographs for morphological observation of titanium black particles (dispersed objects) contained in each dispersion were taken by a TEM (manufactured by Hitachi High-Technologies.). The projection areas of the outer surfaces of 400 particles were obtained from the photographs obtained, the diameters of circles corresponding to the areas were calculated, and the frequency distribution thereof was evaluated.

Images of 400 particles were, sampled from the TEM photographs, the projection areas of the outer surfaces of the individual particles thereof were obtained, the diameters of circles corresponding to the areas were calculated, and the average value thereof was taken as an average particle diameter of the titanium black particles (dispersed objects) contained in each dispersion liquid.

As a result, the average particle diameter of the titanium black particles contained in the titanium black dispersion 1-A of Example 1-1 was 22 nm, and the proportion of particles having particle diameters of 30 nm or less in the total titanium black particles was 93%.

The average particle diameter of the titanium black particles contained in the titanium black dispersion 1-B of Comparative Example 1-1 was 50 nm, and the proportion of particles having particle diameters of 30 nm or less in the total titanium black particles was 4.2%.

Example 1-2, Comparative Example 1-2

1A. Preparation of Black Curable Composition

Photosensitive Resin Composition

A black curable composition 1-A of Example 1-2 was prepared by mixing the ingredients of the following composition 1-2 by using a stirrer.

(Composition 1-2)

| | |
|---|---|
| Benzyl methacrylate/methyl methacrylate/hydroxyethyl methacrylate/acrylic acid copolymer (50/15/5/30[molar ratio]) [binder polymer]: | 1.6 parts |
| Dipentaerythritol hexaacrylate [polymerizable compound]: | 2.0 parts |
| Pentaerythritol triacrylate [polymerizable compound]: | 1.0 parts |
| Polymerization initiator having the following structure [photopolymerization initiator]: | 0.3 parts |

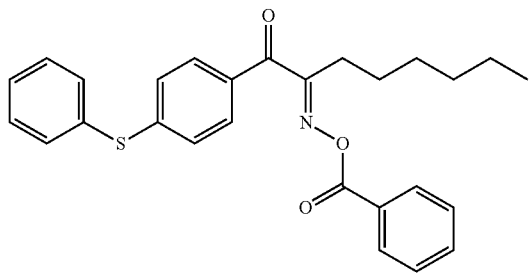 [SMILES: CCCCCC/C(=N\OC(=O)c1ccccc1)C(=O)c1ccc(Sc2ccccc2)cc1]

| | |
|---|---|
| IRGACURE OXE01 (manufactured by BASF Japan Ltd.) | |
| Titanium black dispersion 1-A: | 24 parts |
| Propylene glycol monomethyl ether acetate (PGMEA): | 10 parts |
| Ethyl 3-ethoxypropionate (EEP): | 8 parts |

A black curable composition 1-B of Comparative Example 1-2 was prepared in the same manner as in the preparation of the black curable composition 1-A, except that the titanium black dispersion 1-A from among the ingredients of the composition 1-2 was replaced by the titanium black dispersion 1-B.

2A. Formation of Light-Shielding Film for Wafer Level Lens

The black curable composition 1-A or 1-B obtained above was coated on a glass wafer (CORNING1737 (trade name), manufactured by Corning Incorporated) as a substrate by spin coating, and heated on a hot plate at 120° C. for 2 minutes, to obtain a black curable composition coating layer.

Then, the resultant coating layer was exposed to light through a photomask having a hole pattern of 50 μm at exposure amounts varied from 100 mJ/cm$^2$ at an increment of 100 mJ/cm$^2$, using an i-ray stepper.

The coating layer after exposure to light was subjected to paddle development at 23° C. for 60 seconds using a 0.3% aqueous solution of tetramethyl ammonium hydroxide. Thereafter, the coating layer was rinsed by spin shower, and further washed with pure water, as a result of which patterned light-shielding films formed from the black curable compositions of Example 1-2 and Comparative Example 1-2 were obtained.

Example 1-3, Comparative Example 1-3

Patterned light-shielding films were formed in the same manner as in Example 1-2 and Comparative Example 1-2, respectively, except that a flat plate having a thickness of 1 mm and obtained by curing "SR-7010" (trade name) manufactured by Dow Corning Toray Co., Ltd., which is a thermosetting resin, by heat treatment at 210° C. for 1 hour was used as a substrate, in place of the glass wafer, which was used in Example 1-2 and Comparative Example 1-2 as a substrate.

The thermosetting resin used in the present example can be used also as a material for forming a lens.

<Evaluation>

In the formation of each of the patterned light-shielding films obtained in Examples 1-2 and 1-3 and Comparative Examples 1-2 and 1-3, an exposure amount with which detachment ceases to occur was determined using an optical microscope. Here, the smaller the exposure amount obtained is, the more effective the adhesion between the light-shielding film and the substrate is.

The particle diameters (nm) of dispersed objects in each of the patterned light-shielding films (cured films) obtained in Examples 1-2 and 1-3 and Comparative Examples 1-2 and 1-3 were measured as follows.

A cross-section of the substrate on which the film had been formed was observed by a scanning electron microscope (S-3400N (trade name) manufactured by Hitachi High-Technologies Corporation) and an energy-dispersive X-ray analyzer (GENESIS (trade name) manufactured by EDAX), thereby obtaining photographs for morphological observation and elemental maps of Ti and Si. For 400 particles in which Ti element was detected, the projection areas of the outer surfaces were obtained from the photographs obtained, the diameters of circles corresponding to the areas were calculated, and the frequency distribution thereof was evaluated.

As a result, in each of the light-shielding films formed in Examples 1-2 and 1-3, the proportion of particles having particle diameters of 30 nm or less in the dispersed objects contained in the light-shielding film was 90%.

Further, in each of the light-shielding films formed in Comparative Examples 1-2 and 1-3, the proportion of particles having particle diameters of 30 nm or less in the dispersed objects contained in the light-shielding film was 6%.

Developed regions of the patterned light-shielding films obtained in Examples 1-2 and 1-3 and Comparative Examples 1-2 and 1-3 (exposure amounts are shown in Tables 1 and 2) were observed using a scanning electron microscope (S-4800 (trade name), manufactured by Hitachi High-Technologies Corporation), and the presence or absence of development residues on the substrate was evaluated.

When residues of 10 nm or larger were not observed on the glass substrate, it is indicated that the light-shielding film is favorable as a light-shielding film for a wafer level lens. The results obtained are shown in Tables 1 and 2.

TABLE 1

| | Black curable composition | Particle diameter of titanium black | | Presence or absence of development residues on glass substrate | | | | |
|---|---|---|---|---|---|---|---|---|
| | | Average particle diameter | Proportion of dispersed objects having particle diameters of 30 nm or less (%) | 100 mJ/cm$^2$ | 200 mJ/cm$^2$ | 300 mJ/cm$^2$ | 400 mJ/cm$^2$ | 500 mJ/cm$^2$ |
| Example 1-2 | 1-A | 22 nm | 90 | Residues were not observed | Residues were not observed | Residues were not observed | Residues were not observed | Residues were not observed |
| Comparative Example 1-2 | 1-B | 50 nm | 6 | Pattern formation was impossible | Residues were present | Residues were present | Residues were present | Residues were not observed |

TABLE 2

| | Black curable composition | Particle diameter of titanium black | | Presence or absence of development residues on resin substrate | | | | |
|---|---|---|---|---|---|---|---|---|
| | | average particle diameter | Proportion of the dispersed objects having particle diameters of 30 nm or less (%) | 100 mJ/cm$^2$ | 200 mJ/cm$^2$ | 300 mJ/cm$^2$ | 400 mJ/cm$^2$ | 500 mJ/cm$^2$ |
| Example 1-3 | 1-A | 22 nm | 90 | Residues were not observed | Residues were not observed | Residues were not observed | Residues were not observed | Residues were not observed |
| Comparative Example 1-3 | 1-B | 50 nm | 6 | Pattern formation was impossible | Residues were present | Residues were present | Residues were present | Residues were not observed |

As demonstrated in Tables 1 and 2, the black curable composition 1-A of Examples exhibited excellent curability at any of the exposure amounts, as compared to the black curable composition 1-B of Comparative Examples. Further, when light-shielding films were formed using the black curable composition 1-A of Examples, development residues were not observed in any of the case in which the glass substrate was used and the case in which the resin substrate was used.

Example 1-4

On the substrate on which the patterned light-shielding film had been formed in the same manner as in Example 1-3, a curable resin layer was formed using a curable resin composition having the following composition 1-3. A quartz mold having a lens shape was used to transfer the shape to the curable resin layer, and the curable resin layer was cured with an exposure amount of 400 mJ/cm$^2$ using a high pressure mercury lamp, as a result of which a wafer level lens array having plural wafer level lenses was produced.

(Composition 1-3)

| | |
|---|---|
| N-vinylpyrrolidone: | 35 parts |
| Epoxy acrylate (epoxy ester 80 MF (trade name), manufactured by Kyoeisha Chemical Co., LTD.): | 40 parts |
| Pentaerythritol tetraacrylate: | 20 parts |
| IRGACURE 907 (trade name, manufactured by BASF Japan Ltd.): | 5 parts |

The wafer level lens array produced was cut, a lens module was produced thereon, and image pickup devices and a sensor substrate were attached thereto, thereby producing an image pickup unit.

The wafer level lens obtained in Example 1-4 was free of residues on the lens apertures, and had excellent light transmission properties; moreover, the uniformity of the coating surface of the light-shielding layer region was high, and the light-shielding property of the wafer level lens was high.

When an image was obtained using the image pickup unit provided with the wafer level lens, the image quality was excellent.

Example 1-5

A patterned light-shielding layer was formed in the same manner as in Example 1-2, and a wafer level lens array provided with the light-shielding layer was produced in the same manner as in Example 1-4, except that the black curable composition 1-A prepared in Example 1-2 was coated on a silicon wafer provided with lenses.

The wafer level lens array produced was cut, a lens module was produced thereon, and image pickup devices and a sensor substrate were attached thereto, thereby producing an image pickup unit.

The wafer level lens obtained in Example 1-5 was free of residues on the lens apertures, and had excellent light transmission properties; moreover, the uniformity of the coating surface of the light-shielding layer region was high, and the light-shielding property of the wafer level lens was high.

When an image was obtained using the image pickup unit provided with the wafer level lens, the image quality was excellent.

Examples of Second Embodiment

Example 2-1-1, Comparative Example 2-1

Preparation of Titanium Black Dispersions 2-A-1 and 2-B

The ingredients listed in the following composition 2-1 were mixed for 15 minutes using a stirrer (EUROSTAR (trade name) manufactured by IKA Laboratory), to obtain a dispersion 2-a.

(Composition 2-1)

| | |
|---|---|
| Titanium black obtained by the following process: | 25 parts |
| 30% solution of the dispersant 1 described above: | 25 parts |
| Propylene glycol monomethyl ether acetate (PGMEA) (solvent): | 50 parts |

The resultant dispersion 2-a was subjected to dispersing treatment using ULTRA APEX MILL UAM015 (trade name) manufactured by Kotobuki Industries Co., Ltd., under the following conditions.

—Preparation of Titanium Black 2-A-1—

100 g of titanium oxide MT-150A (trade name, manufactured by Tayca Corporation) having an average particle diameter of 15 nm, 25 g of silica particles AEROPERL (registered trademark) 300/30 having a BET surface area of 300 $m^2/g$ (manufactured by Evonik Industries AGd.), and 100 g of a dispersant DISPERBYK190 (trade name: manufactured by BYK-Chemie GmbH) were weighed out, 71 g of ion exchange water was added thereto, and the resultant mixture was treated for 20 minutes using MAZERSTAR KK-400W manufactured by Kurabo Industries Ltd. at an orbital rotation speed of 1360 rpm and a spin rotation speed of 1047 rpm, as a result of which a uniform mixture aqueous solution was obtained. This aqueous solution was filled in a quartz container, and heated under an oxygen atmosphere at 920° C. using a small Rotary kiln (manufactured by Motoyama Co., Ltd.). Then, the atmosphere was replaced with nitrogen, and nitridation reduction treatment was carried out by flowing an ammonia gas at 100 mL/min at 920° C. for 5 hours. After completion of nitridation reduction treatment, the recovered powder was ground with a mortar, as a result of which a powdery titanium black 2-A-1 having a specific a surface area of 73 $m^2/g$ was obtained. The titanium black 2-A-1 was dispersed under the following conditions, to obtain a titanium black dispersion 2-A-1 of Example 2-1-1. In addition, the average particle diameter of the titanium black particles was obtained as follows: photographs for morphological observation of titanium black particles (dispersed objects) contained in each dispersion were taken by a transmission electron microscope (TEM) manufactured by Hitachi High-Technologies Corporation, the projection areas of the outer surfaces of 400 particles were obtained from the photographs obtained, the diameters of circles corresponding to the areas were calculated, and an average value thereof was obtained.

<Dispersion Conditions>

| | |
|---|---|
| Bead diameter: | diameter of 0.05 mm |
| Filling ratio of beads: | 75 vol % |
| Circumferential velocity of mill: | 8 m/sec |
| Amount of mixed liquid to be dispersed: | 500 g |
| Circulating flow rate (pump supply amount): | 13 kg/hour |
| Temperature of liquid to be treated: | from 25 to 30° C. |
| Cooling water: | tap water |
| Volume of circular path of bead mill: | 0.15 L |
| Number of passes: | 90 passes |

A dispersion 2-b was prepared which had the same composition as the dispersion 2-a of Example 2-1-1, except that the titanium black used in Example 2-1-1 was replaced by "13M-T" (trade name) manufactured by Mitsubishi Materials Corporation. The dispersion 2-b was subjected to the same dispersing treatment as in Example 2-1-1, as a result of which a dispersion 2-B of Comparative Example 2-1-1 was obtained.

Example 2-1-2, Example 2-1-3

Titanium blacks 2-A-2 and 2-A-3 were obtained in the same manner as described above, except that the addition amounts of silica particles used for the preparation of the titanium black 2-A-1 were changed to 30 g and, 12.5 g, respectively.

In addition, titanium black dispersions 2-A-2 [Example 2-1-2] and, 2-A-3 [Example 2-1-3] were obtained in the same manner as in Example 2-1-1, except that the obtained titanium blacks 2-A-2 and 2-A-3, respectively, were used instead of the titanium black 2-A-1.

Comparative Example 2-1-2, Comparative Example 2-1-3

Titanium blacks 2-A-4 and 2-A-5 were obtained in the same manner as described above, except that the addition amounts of the silica particles used for the preparation of the titanium black 2-A-1 were changed to 10 g and 0 g (i.e., not added), respectively.

In addition, titanium black dispersions 2-A-4 [Comparative Example 2-1-2] and 2-A-5 [Comparative Example 2-1-3] were obtained in the same manner as in Example 2-1-1, except that the obtained titanium blacks 2-A-4 and 2-A-5, respectively, were used instead of the titanium black 2-A-1.

<Evaluation of Titanium Black Dispersions>

Each of the obtained titanium black dispersions 2-A-1 to 2-A-5 and 2-B was heated to 700° C. under an oxygen atmosphere using a small Rotary kiln (manufactured by Motoyama Co., Ltd.), maintained in this state for 30 minutes, and cooled, thereby obtaining 2 g of powder. The resultant powder was placed on a tungsten plate having a thickness of 0.2 mm, which was then placed in a vacuum chamber provided with an electron beam heating mechanism, and subjected to heat treatment by electron beam heating at 1000° C. for 30 seconds at a degree of vacuum of $10^{-5}$ Torr or less. The amount of Si atoms and the amount of Ti atoms of the powder that had been subjected to the heat treatment were obtained using a field emission scanning electron microscope S-4800 (trade name, manufactured by Hitachi High-Technologies Corporation), a Si(Li) detector, and an INCA Energy PentaFETx3 (trade name, Manufactured by Oxford Corp.), and the Si/Ti ratio was calculated.

As a result, the content ratios of Si atoms to Ti atoms (Si/Ti ratios) in the dispersed objects of the titanium black dispersions 2-A-1, 2-A-2, 2-A-3, 2-A-4, 2-A-5, and 2-B were 0.07, 0.4, 0.05, 0.048, 0, and 0, respectively.

These results are shown in Tables 3 to 4 below.

Example 2-2-1, Comparative Example 2-2-1

3A. Preparation of Black Curable Composition

Photosensitive Resin Composition

A black curable composition 2-A-1 of Example 2-2-1 was prepared by mixing the ingredients of the following composition 2-2 by using a stirrer.

(Composition 2-2)

| | |
|---|---|
| Benzyl methacrylate/methyl methacrylate/hydroxyethyl methacrylate/acrylic acid copolymer (50/15/5/30 [molar ratio]) [binder polymer]: | 1.6 parts |
| Dipentaerythritol hexaacrylate [polymerizable compound]: | 2.0 parts |
| Pentaerythritol triacrylate [polymerizable compound]: | 1.0 parts |
| Polymerization initiator having the following structure [photopolymerization initiator]: | 0.3 parts |

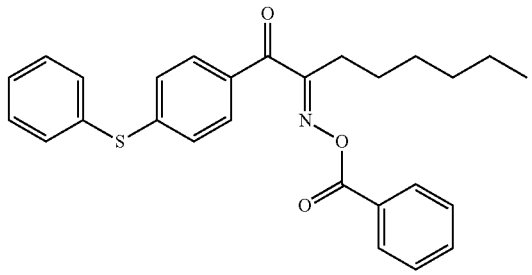 [SMILES: CCCCCC/C(=N\OC(=O)c1ccccc1)C(=O)c1ccc(Sc2ccccc2)cc1]

| | |
|---|---|
| IRGACURE OXE01 (manufactured by BASF Japan Ltd.) | |
| The titanium black dispersion 2-A-1: | 24 parts |
| Propylene glycol monomethyl ether acetate (PGMEA): | 10 parts |
| Ethyl 3-ethoxypropionate: | 8 parts |

In addition, a black curable composition 2-B of Comparative Example 2-2-1 was prepared in the same manner as in the preparation of the black curable composition 2-A-1, except that the titanium black dispersion 2-A-1 from among the components of the composition 2-2 was replaced by the titanium black dispersion 2-B.

Examples 2-2-2, 2-2-3

Titanium black dispersions 2-A-2 [Example 2-2-2] and 2-A-3 [Example 2-2-3] were obtained in the same manner as in the case of the black curable composition 2-A-1, except that the titanium black dispersion 2-A-1 used in Example 2-2-1 was replaced by the titanium black dispersions 2-A-2 and 2-A-3, respectively.

Comparative Examples 2-2-2, 2-2-3

A black curable composition 2-A-4 [Comparative Example 2-2-2] and a black curable composition 2-A-5 [Comparative Example 2-2-3] were obtained in the same manner as in the preparation of the black curable composition 2-A-1, except that the titanium black dispersion 2-A-1 used for Example 2-2-1 was replaced by the titanium black dispersions 2-A-4 and 2-A-5.

<Evaluation of Black Curable Compositions>

Each of the obtained titanium black dispersions 2-A-1 to 2-A-5 and 2-B were heated to 700° C. under an oxygen atmosphere using a small Rotary kiln (manufactured by Motoyama Co., Ltd.), maintained in this state for 30 minutes, and cooled, thereby obtaining 2 g of powder. The resultant powder was placed on a tungsten plate having a thickness of 0.2 mm, which was then placed in a vacuum chamber provided with an electron beam heating mechanism, and subjected to heat treatment by electron beam heating at 1000° C. for 30 seconds at a degree of vacuum of $10^{-5}$ Torr or less. The amount of Si atoms and the amount of Ti atoms of the powder that had been subjected to the heat treatment were obtained using a S-4800 (trade name, manufactured by Hitachi High-Technologies Corporation) and an INCA Energy PentaFETx3 (trade name, Manufactured by Oxford Corp.), and the Si/Ti ratio was calculated.

As a result, the same results as the Si/Ti ratios of the dispersed objects in the respective dispersions (the vales described in Tables 3 and 4) were obtained as the Si/Ti ratios of the dispersed objects in the respective black curable compositions.

4A. Formation of Light-Shielding Films for Wafer Level Lenses

Each of the black curable compositions 2-A-1 to 2-A-5 and 2-B obtained above was coated on a glass wafer (CORNING 1737 (trade name), manufactured by Corning Incorporated) as a substrate by spin coating, and thereafter heated on a hot plate at 120° C. for 2 minutes, to obtain a black curable composition coating layer.

Then, the resultant coating layer was exposed to light through a photomask having a hole pattern of 50 μm at exposure amounts varied from 100 mJ/cm² at an increment of 100 mJ/cm², using an i-ray stepper.

The coating layer after exposure to light was subjected to paddle development at 23° C. for 60 seconds using a 0.3% aqueous solution of tetramethyl ammonium hydroxide. Thereafter, the coating layer was rinsed by spin shower, and further washed with pure water, as a result of which patterned light-shielding films formed from black curable compositions of Examples 2-2-1 to 2-2-3 and Comparative Examples 2-2-1 to 2-2-3 were obtained.

Example 2-3-1, Comparative Example 2-3-1

Patterned light-shielding films of Example 2-3-1 and Comparative Example 2-3-1 were formed in the same manner as in the formation of the light-shielding films for wafer level lenses in 4A, except that a flat plate having a thickness of 1 mm and obtained by curing "SR-7010" (trade name) manufactured by Dow Corning Toray Co., Ltd., which is a thermosetting resin, by heat treatment at 210° C. for 1 hour was used as a substrate, in place of the glass wafer, which was used as a substrate in the formation of the light-shielding films for wafer level lens in 4A using the black curable compositions of Example 2-2-1 and Comparative Example 2-2-1. The thermosetting resin used in the present example can be used as a material or forming a lens.

Examples 2-3-2, 2-3-3

Patterned light-shielding films of Example 2-3-2 and Example 2-3-3 were formed in the same manner as in Example 2-3-1 except that the titanium black dispersion 2-A-1 used in Example 2-3-1 was replaced by the titanium black dispersions 2-A-2 and 2-A-3, respectively.

Comparative Examples 2-3-2, 2-3-3

Patterned light-shielding films of Comparative Example 2-3-2 and Comparative Example 2-3-3 were formed in the same manner as in Example 2-3-1, except that the titanium black dispersion 2-A-1 used in Example 2-3-1 was replaced by the titanium black dispersions 2-A-4 and 2-A-5, respectively.

In addition, the Si/Ti ratio of the dispersed objects in each of the patterned light-shielding films (cured films) obtained in Examples 2-2-1 to 2-3-3 and Comparative Examples 2-2-1 to 2-3-3 was measured in the following manner.

The substrate provided with the light-shielding film was split to prepare a cross-section of the light-shielding film. The resultant cross-section was measured with an S-4800 (trade name) manufactured by Hitachi High-Technologies Corporation and an INCA Energy PentaFETx3 (trade name) manufactured by Oxford Corp., as a result of which the amount of Si atoms and the amount of Ti atoms were obtained. The ratio therebetween was calculated as a Si/Ti ratio.

As a result, the same results as the Si/Ti ratios of the dispersed objects in the respective dispersions (the values described in Tables 3 and 4) were obtained as the Si/Ti ratios of the dispersed objects in the respective light-shielding layer.

Developed regions of the patterned light-shielding films obtained in Examples 2-2-1 to 2-3-3 and Comparative Examples 2-2-1 to 2-3-3 (exposure amounts are shown in Tables 3 and 4) were observed using a scanning electron microscope (S-4800 (trade name) manufactured by Hitachi High-Technologies Corporation), and the presence or absence of development residues on the substrate was evaluated.

When residues of 10 nm or larger were not observed on the substrate, it is indicated that the light-shielding film is favorable as a light-shielding film for a wafer level lens. The results obtained are shown in Tables 3 and 4.

TABLE 3

| | Black curable composition | Si/Ti ratio of dispersed objects | Results of evaluation of residues on glass substrate | | | | |
|---|---|---|---|---|---|---|---|
| | | | 100 mJ/cm$^2$ | 200 mJ/cm$^2$ | 300 mJ/cm$^2$ | 400 mJ/cm$^2$ | 500 mJ/cm$^2$ |
| Example 2-2-1 | 2-A-1 | 0.07 | Residues were not observed | Residues were not observed | Residues were not observed | Residues were not observed | Residues were not observed |
| Example 2-2-2 | 2-A-2 | 0.4 | Residues were not observed | Residues were not observed | Residues were not observed | Residues were not observed | Residues were not observed |
| Example 2-2-3 | 2-A-3 | 0.05 | Residues were not observed | Residues were not observed | Residues were not observed | Residues were not observed | Residues were not observed |
| Comparative Example 2-2-1 | 2-B | 0 | Residues were present | Residues were present | Residues were present | Residues were present | Residues were present |
| Comparative Example 2-2-2 | 2-A-4 | 0.048 | Residues were present | Residues were present | Residues were present | Residues were present | Residues were present |
| Comparative Example 2-2-3 | 2-A-5 | 0 | Residues were present | Residues were present | Residues were present | Residues were present | Residues were present |

TABLE 4

| | Black curable composition | Si/Ti ratio of the dispersed objects | Results of evaluation of residues on resin substrate | | | | |
|---|---|---|---|---|---|---|---|
| | | | 100 mJ/cm$^2$ | 200 mJ/cm$^2$ | 300 mJ/cm$^2$ | 400 mJ/cm$^2$ | 500 mJ/cm$^2$ |
| Example 2-3-1 | 2-A-1 | 0.07 | Residues were not observed | Residues were not observed | Residues were not observed | Residues were not observed | Residues were not observed |
| Example 2-3-2 | 2-A-2 | 0.4 | Residues were not observed | Residues were not observed | Residues were not observed | Residues were not observed | Residues were not observed |
| Example 2-3-3 | 2-A-3 | 0.05 | Residues were not observed | Residues were not observed | Residues were not observed | Residues were not observed | Residues were not observed |
| Comparative Example 2-3-1 | 2-B | 0 | Residues were present | Residues were present | Residues were present | Residues were present | Residues were present |
| Comparative Example 2-3-2 | 2-A-4 | 0.048 | Residues were present | Residues were present | Residues were present | Residues were present | Residues were present |
| Comparative Example 2-3-3 | 2-A-5 | 0 | Residues were present | Residues were present | Residues were present | Residues were present | Residues were present |

As demonstrated in Tables 3 and 4, the black curable compositions 2-A-1 to 2-A-3 of Examples exhibited practically sufficient curability at any of the exposure amounts, as compared to the black curable compositions 2-B, 2-A-4, and 2-A-5 of Comparative Examples. Further, when light-shielding films were formed using the black curable compositions 2-A-1 to 2-A-3 of Examples, development residues were not observed in developed regions (regions other than the regions in which a light-shielding film was formed) in any of the case in which the glass substrate was used and the case in which the resin substrate was used.

Example 2-4

On the substrate on which the patterned light-shielding film had been formed in the same manner as in Example 2-3-1, a curable resin layer was formed using a curable resin composition having the following composition 2-3. A quartz mold having a lens shape was used to transfer the shape to the curable resin layer, and the curable resin layer was cured with an exposure amount of 400 mJ/cm$^2$ using a high pressure mercury lamp, as a result of which a wafer level lens array having plural wafer level lenses was produced.

(Composition 2-3)

| | |
|---|---|
| N-vinylpyrrolidone: | 35 parts |
| Epoxy acrylate (epoxy ester 80 MF(trade name), manufactured by Kyoeisha Chemical Co., LTD.): | 40 parts |
| Pentaerythritol tetraacrylate: | 20 parts |
| IRGACURE 907(trade name, manufactured by BASF Japan Ltd.): | 5 parts |

The wafer level lens array produced was cut, a lens module was produced thereon, and image pickup devices and a sensor substrate were attached thereto, thereby producing an image pickup unit.

The wafer level lens obtained in Example 2-4 was free of residues on the lens apertures, and had excellent light transmission properties; moreover, the uniformity of the coated surface of the light-shielding layer region was high, and the light-shielding property was high.

When an image was obtained using the image pickup unit provided with the wafer level lens, the image quality was excellent.

Example 2-5-1 to Example 2-5-3

Patterned light-shielding layers were formed in the same manner as the formation of the light-shielding films for wafer level lenses in 4A, and wafer level lens arrays provided with a light-shielding layer were produced in the same manner as in Example 2-4, except that the black curable compositions 2-A-1,2-A-2, and 2-A-3 prepared in Examples 2-2-1 to 2-2-3 were respectively coated on silicon wafers provided with lenses.

Each of the wafer level lens arrays produced was cut, a lens module was produced thereon, and image pickup devices and a sensor substrate were attached thereto, thereby producing an image pickup unit.

All of the wafer level lenses obtained in Examples 2-5-1 to 2-5-3 were free of residues on the lens apertures, and had excellent transmission properties; moreover, the uniformity of the coating surface of the light-shielding layer regions were high, and the light-shielding property of the wafer level lenses was high.

When images were obtained using the image pickup units provided with the wafer level lenses, the image quality was excellent.

Examples of Third Embodiment

Preparation of Substrate 3A and Substrate 3B (Preparation of Substrate 3A)
A substrate 3A for testing development residues in a solid-state image pickup device of the structure K (having a configuration in which a solder resist layer is not provided on the back surface) was prepared as described below.

That is, a Ti-plated seed layer was formed on a silicon substrate using a micro processing (photolithography) technique and a sputtering method, and a circular metal electrode made of copper (Cu) and having a thickness of 5 μm and a diameter 10 μm was obtained using an electrolytic plating method.

Figure 11:
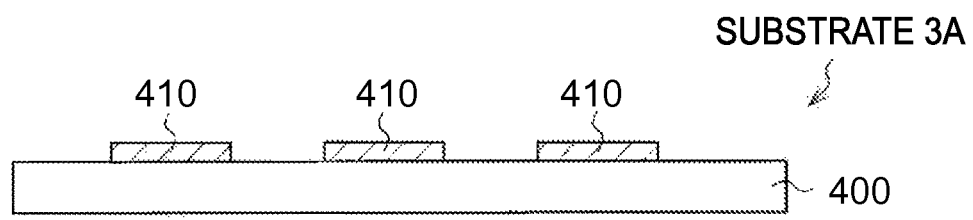
FIG. 11 is a schematic cross-sectional view of a substrate 3A used in Example 3-2 and Comparative Example 3-2.

As a result of the above, a substrate 3A having plural circular metal electrodes 410 on a silicon substrate 400 as shown in the schematic cross-sectional view of FIG. 11 was obtained.

(Preparation of Substrate 3B)
A substrate 3B for testing development residues in a solid-state image pickup device of the structure K (having a configuration in which a solder resist layer is not provided on the back surface) was prepared as described below.

A patterned solder resist layer was formed on a side of the substrate 3A on which the circular metal electrodes were formed, by photolithography using a commercially available solder resist.

Figure 13:
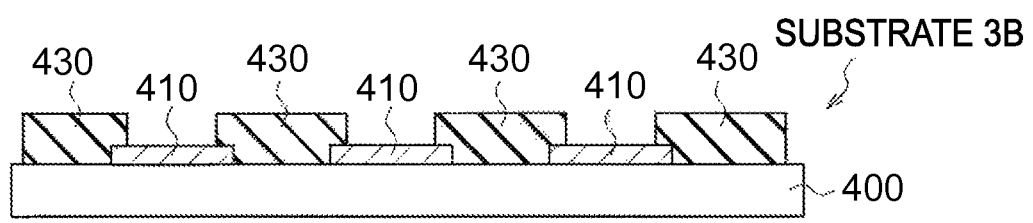
FIG. 13 is a schematic cross-sectional view of a substrate 3B used in Example 3-3 and Comparative Example 3-3.

The pattern of the solder resist layer was set to a pattern having openings at which part of the metal electrodes was exposed as shown in FIG. 13.

As a result of the above, a substrate 3B having plural circular metal electrodes 410 and plural solder resist layer portions 430 on a silicon substrate 400 as shown in the schematic cross-sectional view of FIG. 13 was obtained.

Example 3-1, Comparative Example 3-1

Preparation of Titanium Black Dispersions 3-A and 3-B

The ingredients listed in the following composition 3-1 were mixed using a stirrer (EUROSTAR (trade name) manufactured by IKA Laboratory) for 15 minutes, as a result of which a dispersion 3-a was obtained.

(Composition 3-1)

| | |
|---|---|
| Titanium black (titanium black having an average particle diameter of 30 nm or less): | 25 parts |
| The 30% solution of the dispersant described above 1: | 25 parts |
| Propylene glycol monomethyl ether acetate (PGMEA) (solvent): | 50 parts |

The titanium black having average particle diameter of 30 nm or less described above was obtained as described below.

100 g of titanium oxide MT-150A (trade name) having an average particle diameter of 15 nm manufactured by Tayca Corporation, 25 g of silica particles AEROPERL (registered trademark) 300/30 having a BET surface area of 300 m$^2$/g (manufactured by Evonik Industries AGd.), and 100 g of a dispersant DISPERBYK190 (trade name: manufactured by BYK-Chemie GmbH) were weighed out, 71 g of ion exchange water was added thereto, and the mixture was treated for 20 minutes using MAZERSTAR KK-400W manufactured by Kurabo Industries Ltd. at an orbital rotation speed of 1360 rpm and a spin rotation speed of 1047 rpm, as a result of which a uniform mixture aqueous solution was obtained. This aqueous solution was filled into a quartz container, and heated under an oxygen atmosphere at 920° C. using a small Rotary kiln manufactured by Motoyama Co., Ltd. Then, the atmosphere was replaced with nitrogen, and nitridation reduction treatment was carried out by flowing an ammonia gas at 100 mL/min at 920° C. for 5 hours. After completion of the nitridation reduction treatment, the recovered powder was ground with a mortar, as a result of which a powdery titanium black having an average particle diameter of 30 nm or less was obtained.

The resultant dispersion 3-a was subjected to dispersing treatment using an ULTRA APEX MILL UAM015 (trade name) manufactured by Kotobuki Industries Co., Ltd., under the following conditions.

<Dispersion Conditions>

| | |
|---|---|
| Bead diameter: | diameter of 0.05 mm |
| Filling ratio of beads: | 75 vol % |
| Circumferential velocity of mill: | 8 m/sec |
| Amount of mixed liquid to be dispersed: | 500 g |
| Circulating flow rate (pump supply amount): | 13 kg/hour |
| Temperature of liquid to be treated: | from 25° C. to 30° C. |
| Cooling water: | tap water |
| Volume of circular path of bead mill: | 0.15 L |
| Number of passes: | 90 passes |

As a result, titanium black dispersion 3-A of Example 3-1 was obtained.

In addition, a titanium black dispersion 3-B of Comparative Example 3-1 was obtained by preparing a dispersion 3-b having the same composition as that of the dispersion 3-a of Example 3-1 except that the titanium black used in Example 3-1 was replaced by "13M-T" (trade name) manufactured by Mitsubishi Materials Corporation, and subjecting the dispersion 3-b to the same dispersing treatment as in Example 3-1.

<Evaluation of Titanium Black Dispersions 3-A and 3-B>

Each of the obtained titanium black dispersions 3-A and 3-B was diluted 500-fold with propylene glycol monomethyl ether acetate (hereinafter sometimes simply referred to as PGMEA), the dripped on a carbon thin film and dried, and photographs for morphological observation of titanium black particles (dispersed objects) contained in the dispersion were taken by a TEM (manufactured by Hitachi High-Technologies.). The projection areas of the outer surfaces of 400 particles were obtained from the photographs obtained, the diameters of circles corresponding to the areas were calculated, and the frequency distribution thereof was evaluated.

Images of 400 particles were sampled from the TEM photographs, the projection areas of the outer surfaces of the individual particles thereof were obtained, the diameters of circles corresponding to the areas were calculated, and the average value thereof was taken as an average particle diameter of the titanium black particles (dispersed objects) contained in each dispersion liquid.

As a result, the average particle diameter of the titanium black particles contained in titanium black dispersion 3-A of Example 3-1 was 19 nm, and the proportion of particles having particle diameters of 30 nm or less in the total titanium black particles was 95%.

The average particle diameter of the titanium black particles contained in the titanium black dispersion 3-B of Comparative Example 3-1 was 50 nm, and the proportion of particles having particle diameters of 30 nm or less in the total titanium black particles was 6%.

These results are shown in Tables 5 to 7.

Example 3-2, Comparative Example 3-2

Preparation of Black Curable Composition

Photosensitive Resin Composition

A black curable composition 3-A of Example 3-2 was prepared by mixing the ingredients of the following composition 3-2 by using a stirrer.

(Composition 3-2)

| | |
|---|---|
| Benzyl methacrylate/methyl methacrylate/hydroxyethyl methacrylate/acrylic acid copolymer (50/15/5/30 [molar ratio])[binder polymer]: | 1.6 parts |
| Dipentaerythritol hexaacrylate [polymerizable compound]: | 2.0 parts |
| Pentaerythritol triacrylate [polymerizable compound]: | 1.0 parts |
| Polymerization initiator having the following structure [photopolymerization initiator]: | 0.3 parts |

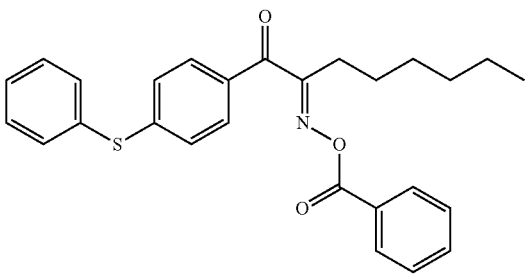 [SMILES: CCCCCC/C(=N\OC(=O)c1ccccc1)C(=O)c1ccc(Sc2ccccc2)cc1]

IRGACURE OXE01 (manufactured by BASF Japan Ltd.)

| | |
|---|---|
| The titanium black dispersion 3-A: | 24 parts |

-continued

| Propylene glycol monomethyl ether acetate (PGMEA): | 10 parts |
| Ethyl 3-ethoxypropionate: | 8 parts |

In addition, a black curable composition 3-B of Comparative Example 3-2 was prepared in the same manner as in the case of the black curable composition 3-A, except that the titanium black dispersion 3-A from among the components of the composition 3-2 was replaced by the titanium black dispersion 3-B <Production of Light-Shielding Film>

The black curable compositions 3-A or 3-B obtained above was coated, by spin coating, on a surface of the substrate 3A on which the metal electrode was formed, and thereafter heated on a hot plate at 120° C. for 2 minutes, to obtain a black curable composition coating layer.

Subsequently, the coating layer obtained was patternwise exposed at exposure amounts of 100 mJ/cm$^2$, 200 mJ/cm$^2$, 300 mJ/cm$^2$, 400 mJ/cm$^2$, and 500 mJ/cm$^2$, using an i-ray stepper.

Then, the coating layer after exposure to light was subjected to paddle development at 23° C. for 60 seconds using a 0.3% aqueous solution of tetramethyl ammonium hydroxide. Thereafter, the coating layer was rinsed by spin shower, and further washed with pure water, as a result of which a patterned light-shielding film was obtained.

Figure 12:
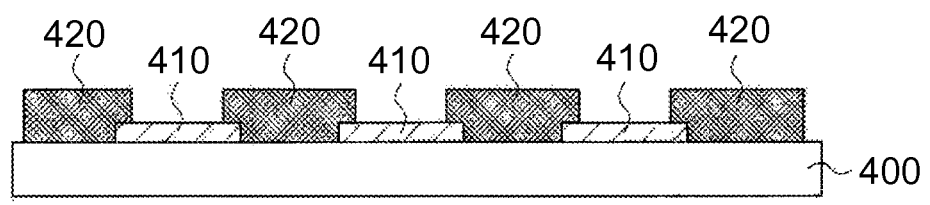
FIG. 12 is a schematic cross-sectional view illustrating a state in which a light-shielding film is formed on a substrate 3A.

The pattern of the light-shielding film (light-shielding film 420 in FIG. 12) was set to a pattern having openings at which part of the metal electrodes 410 was exposed as shown in FIG. 12.

Example 3-3, Comparative Example 3-3

Patterned light-shielding films were formed in the same manner as in Example 3-2 and Comparative Example 3-2, respectively, except that the substrate 3B was used instead of the substrate 3A used in Example 3-2 and Comparative Example 3-2.

Figure 14:
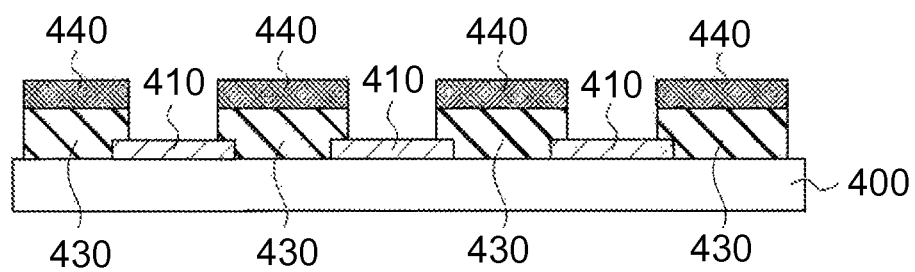
FIG. 14 is a schematic cross-sectional view illustrating a state in which a light-shielding film is formed on a substrate 3B.

The pattern of each light-shielding film was set to a pattern having openings at which part of the metal electrode 410 provided on the silicon substrate 400 was exposed as shown in FIG. 14 (specifically, a pattern that overlaps a solder resist layer 430 when viewed in a direction perpendicular to the substrate; a light-shielding film 440 in FIG. 14).

<Evaluation>

In the formation of each of the patterned light-shielding films obtained in Examples 3-2 and 3-3 and Comparative Examples 3-2 and 3-3, an exposure amount with which detachment ceases to occur was determined using an optical microscope. Here, the smaller the exposure amount is, the more effective the adhesion between the light-shielding film and the substrate is.

The particle diameters (nm) of dispersed objects in each of the patterned light-shielding films (cured film) obtained in Examples 3-2 and 3-3 and Comparative Examples 3-2 and 3-3 were measured as follows.

A cross-section of the substrate on which the film had been formed was observed by a scanning electron microscope (S-3400N (trade name) manufactured by Hitachi High-Technologies Corporation) and an energy-dispersive X-ray analyzer (GENESIS (trade name) manufactured by EDAX), thereby obtaining photographs for morphological observation and elemental maps of Ti and Si. For 400 particles in which Ti element was detected, the projection areas of the outer surfaces were obtained from the photographs obtained, the diameters of circles corresponding to the areas were calculated, and the frequency distribution thereof was evaluated.

As a result, in each of the light-shielding films formed in Examples 3-2 and 3-3, the proportion of particles having particle diameters of 30 nm or less in the dispersed objects contained in the light-shielding film was 95%.

Further, in each of the light-shielding films formed in Comparative Examples 3-2 and 3-3, the proportion of particles having particle diameters of 30 nm or less in the dispersed objects contained in the light-shielding film was 6%.

Developed regions (exposed surface of the metal electrode) of the patterned light-shielding films obtained in Examples 3-2 and 3-3 and Comparative Examples 3-2 and 3-3 (exposure amounts are described in Tables 5 and 6) were observed with a scanning electron microscope (S-4800 (trade name), manufactured by Hitachi High-Technologies Corporation), and the presence or absence of development residues on the substrate 3A or the substrate 3B was evaluated.

When development residues of 10 nm or larger were not observed on the circular metal electrode of the substrate 3A or substrate 3B, favorable properties as a light-shielding film is indicated. The evaluation results of development residues are shown in Tables 5 and 6.

TABLE 5

| | | Titanium black particles | | Results of observation of development residues (substrate A) | | | | |
|---|---|---|---|---|---|---|---|---|
| | Black curable composition | Average particle diameter | Proportion of dispersed objects having particle diameters of 30 nm or less (%) | 100 mJ/cm$^2$ | 200 mJ/cm$^2$ | 300 mJ/cm$^2$ | 400 mJ/cm$^2$ | 500 mJ/cm$^2$ |
| Example 3-2 | 3-A | 19 nm | 95 | Residues were not observed | Residues were not observed | Residues were not observed | Residues were not observed | Residues were not observed |
| Comparative Example 3-2 | 3-B | 50 nm | 6 | Pattern formation was impossible | Residues were present | Residues were present | Residues were present | Residues were not observed |

TABLE 6

| | Black curable composition | Titanium black particles | | Results of observation of development residues (substrate B) | | | | |
|---|---|---|---|---|---|---|---|---|
| | | Average particle diameter | Proportion of the dispersed objects having particle diameters of 30 nm or less (%) | 100 mJ/cm² | 200 mJ/cm² | 300 mJ/cm² | 400 mJ/cm² | 500 mJ/cm² |
| Example 3-3 | 3-A | 19 nm | 95 | Residues were not observed | Residues were not observed | Residues were not observed | Residues were not observed | Residues were not observed |
| Comparative Example 3-3 | 3-B | 50 nm | 6 | Pattern formation was impossible | Residues were present | Residues were present | Residues were present | Residues were not observed |

In Tables 5 and 6, "Residues were not observed" means that development residues of 10 nm or larger were not observed on the circular metal electrode.

In addition, "Residues were present" means that development residues of 10 nm or larger were observed on the circular metal electrode.

In addition, "Pattern formation was impossible" means that curability was insufficient, and detachment of the pattern occurred.

As demonstrated in Tables 5 and 6, the black curable composition 3-A of Examples exhibited excellent curability at any of the exposure amounts, as compared to the black curable composition 3-B of Comparative Examples. Further, when light-shielding films were formed using the black curable composition 3-A of Examples, development residues were not observed in any of the case in which the substrate 3A was used and the case in which the substrate 3B was used.

From the evaluation results of Examples 3-2 and 3-3, it is understood that, when a light-shielding film at the back face side of a solid-state image pickup device of the structure K is formed, development residues derived from the photosensitive resin composition for forming the light-shielding film can be reduced.

Example 3-4, Comparative Example 3-4

Evaluation of Ability to Shield Against Infrared Light

Light-shielding films of Example 3-4 and Comparative Example 3-4 were formed in the same manner as in Example 3-2 and Comparative Example 3-2, except that glass substrates (1737 manufactured by Corning Incorporated) were used instead of the substrates 3A, and that entire-surface exposure was carried out instead of the patternwise exposure, thereby forming solid light-shielding films (having a film thickness of 2 µm) on the glass substrates.

The transmittance of each of the obtained light-shielding films at wavelength regions was measured using a UV3600 (trade name, manufactured by Shimadzu Corporation). From the measurement results, the maximum transmittance (%) in the wavelength region of from 700 nm to 1200 nm was obtained.

TABLE 7

| | Black curable composition | Titanium black particles | | Maximum transmittance (%) | | | | |
|---|---|---|---|---|---|---|---|---|
| | | Average particle diameter | Proportion of dispersed objects having particle diameters of 30 nm or less (%) | 100 mJ/cm² | 200 mJ/cm² | 300 mJ/cm² | 400 mJ/cm² | 500 mJ/cm² |
| Example 3-4 | 3-A | 19 nm | 95 | 5% | 5% | 5% | 5% | 5% |
| Comparative Example 3-4 | 3-B | 50 nm | 6 | 12% | 12% | 12% | 12% | 12% |

As demonstrated in Table 7, the maximum transmittance in an infrared region was low in Example 3-4 and Comparative Example 3-4, and it was confirmed that the black curable composition 3-A has an effect in terms of reducing development residues and improving curability while maintaining excellent infrared light shielding ability of titanium black.

Examples 3-5 and 3-6, and Comparative Examples 3-5 and 3-6

First, the black curable composition 3-A was prepared.

Then, black curable compositions 3-C, 3-D, 3-E and 3-F having the average particle diameters and the proportions of dispersed objects having particle diameters of 30 nm or less shown in the following Table 8 were prepared.

In the black curable compositions 3-C, 3-D, 3-E and 3-F, the adjustment of the average particle diameters and the proportion of dispersed objects having particle diameters of 30 nm or less were carried out by replacing a part of the 25 parts of titanium black having an average particle diameter of 30 nm or less used in the black curable composition 3-A (titanium black dispersion 3-A) with a commercially available titanium black (12S (trade name) manufactured by Mitsubishi Materials Electronic Chemicals Co., Ltd.)).

<Evaluation of Development Residues>

Developed regions (exposed surface of the metal electrode) of the light-shielding films of Examples 3-5 and 3-6 and Comparative Examples 3-5 and 3-6, which were obtained by a process similar to the above, were observed with a scanning electron microscope (S-3400N (trade name) manufactured by Hitachi High-Technologies Corporation) and an energy-dispersive X-ray analyzer (GENESIS (trade name), manufactured by EDAX), thereby obtaining photographs for morphological observation and elemental maps of Ti and Si with a size of 10 μm×10 μm. From the photographs obtained, the number of particulate matters having diameters of 10 nm or more in which Ti atoms had been detected was evaluated, and the frequency distribution thereof was evaluated.

From the results obtained, development residues were evaluated according to the following criteria. The evaluation results are shown in Table 8.

—Evaluation Criteria—
A: the number was smaller than 10.
B: the number was from 10 to smaller than 50, which was within a practically acceptable range.
C: the number was from 50 to smaller than 100.
D: the number was 100 or greater.

<Evaluation of Ability to Shield Against Infrared Light>

The same processes as in Examples 3-2, 3-5, and 3-6 and Comparative Examples 3-5 and 3-6 were carried out, except that glass substrates (1737 manufactured by Corning Incorporated) were used instead of the substrates 3A or 3B, and that entire-surface exposure was carried out instead of the patternwise exposure, thereby forming solid light-shielding films (having a film thickness of 2 μm) on the glass substrates.

The transmittance of the light-shielding films obtained was measured at wavelength regions using a UV3600 (trade name) manufactured by Shimadzu Corporation. From the measurement results, the maximum transmittance (%) in the wavelength region of from 700 nm to 1200 nm was obtained.

From the results obtained, the ability to shield against infrared light was evaluated according to the following criteria. The evaluation results are shown in Table 8.

—Evaluation Criteria—
A: the maximum transmittance was lower than 7%.
B: the maximum transmittance was from 7% to lower than 10%, which was within a practically acceptable range.
C: the maximum transmittance was from 10% to lower than 15%.
D: the maximum transmittance was 15% or higher.

As demonstrated in Table 8, it was confirmed that excellent effects in terms of reducing development residues can be obtained when the proportion of dispersed objects having particle diameters of 30 nm or less is 90% or higher.

The disclosures of Japanese Patent Application Nos. 2009-240546, 2010-079581, and 2010-079779 are incorporated herein by reference. All publications, patent applications, and technical standards mentioned in this specification are herein incorporated by reference to the same extent as if each individual publication, patent application, or technical standard was specifically and individually indicated to be incorporated by reference.

The invention claimed is:

1. A titanium black dispersion for a wafer level lens comprising:
   titanium black particles;
   a dispersant; and
   an organic solvent,
   wherein 90% or more of dispersed objects that consist of the titanium black particles have particle diameters of 30 nm or less.

2. A photosensitive resin composition for a wafer level lens comprising:
   the titanium black dispersion according to claim 1;
   a photopolymerizable compound; and
   a photopolymerization initiator.

3. A wafer level lens comprising, at a peripheral portion of a lens present on a substrate, a light-shielding film obtained by curing the photosensitive resin composition according to claim 2.

4. A solid-state image pickup device comprising the wafer level lens according to claim 3.

5. A titanium black dispersion for a wafer level lens comprising:
   titanium black particles;
   a dispersant; and
   an organic solvent,
   wherein dispersed objects including titanium black particles contain Si atoms, and
   a content ratio of Si atoms to Ti atoms (Si/Ti) in the dispersed objects is 0.05 or higher.

6. A photosensitive resin composition for a wafer level lens comprising:
   the titanium black dispersion according to claim 5;
   a photopolymerizable compound; and
   a photopolymerization initiator.

TABLE 8

| | Titanium black particles | | | Results of observation of development residues | | |
|---|---|---|---|---|---|---|
| | Black curable composition | Average particle diameter | Proportion of the dispersed objects having particle diameters of 30 nm or less (%) | (Substrate A) 300 mJ/cm² | (substrate B) 300 mJ/cm² | Infrared light-shielding property |
| Example 3-2 | 3-A | 19 nm | 95 | A | A | A |
| Example 3-5 | 3-C | 22 nm | 90 | B | A | A |
| Example 3-6 | 3-D | 24 nm | 92 | B | A | A |
| Comparative Example 3-5 | 3-E | 26 nm | 86 | C | C | B |
| Comparative Example 3-6 | 3-F | 30 nm | 80 | D | D | C |

7. A wafer level lens comprising, at a peripheral portion of a lens present on a substrate, a light-shielding film obtained by curing the photosensitive resin composition according to claim 6.

8. A solid-state image pickup device comprising the wafer level lens according to claim 7.

9. A titanium black dispersion comprising:
titanium black particles;
a dispersant; and
an organic solvent,
wherein 90% or more of dispersed objects that consist of the titanium black particles have particle diameters of 30 nm or less, and the titanium black dispersion is used for formation of a light-shielding film that is provided on one side of a silicon substrate having an image pickup device section on the other side thereof, and that shields against infrared light.

10. The titanium black dispersion according to claim 9, wherein the dispersant is a graft copolymer having a graft chain in which a number of atoms excluding hydrogen atoms is from 40 to 10000.

11. The titanium black dispersion according to claim 10, wherein the graft copolymer comprises at least a structural unit represented by any one of the following Formulae (1) to (5):

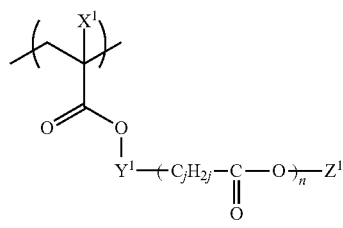

(1)

(2)

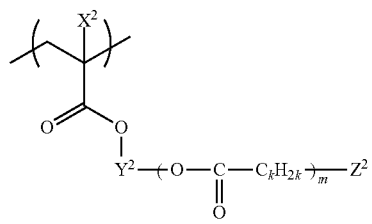

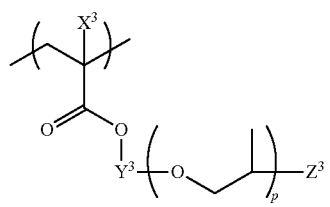

(3)

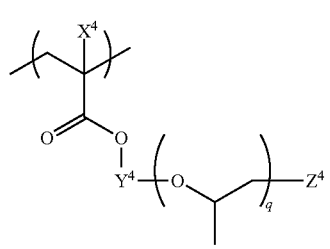

(4)

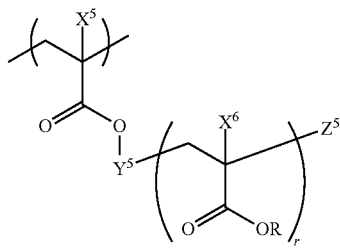

(5)

wherein, in Formulae (1) to (5), $X^1, X^2, X^3, X^4, X^5$, and $X^6$ each independently represent a hydrogen atom or a monovalent organic group; $Y^1, Y^2, Y^3, Y^4$, and $Y^5$ each independently represent a divalent linking group; $Z^1, Z^2, Z^3, Z^4$, and $Z^5$ each independently represent a monovalent organic group; R represents a hydrogen atom or a monovalent organic group; and R's having different structures may be used in mixture in the copolymer; n, m, p, q, and r each represent an integer of 1 to 500; and j and k each independently represent an integer of 2 to 8.

12. The titanium black dispersion according to claim 11, wherein the graft copolymer comprises a structural unit represented by any one of Formulae (1) to (5) in a range of from 10% by mass to 90% by mass relative to a total mass of the graft copolymer.

13. A photosensitive resin composition comprising:
the titanium black dispersion according to claim 9;
a photopolymerizable compound; and
a photopolymerization initiator,
wherein the photosensitive resin composition is used for formation of a light-shielding film that is provided on one side of a silicon substrate having an image pickup device section on the other side thereof, and that shields against infrared light.

14. A light-shielding film formed on one side of a silicone substrate having an image pickup device section on the other side thereof using the photosensitive resin composition according to claim 13.

15. A method for producing a light-shielding film comprising:
applying the photosensitive resin composition according to claim 13 to one side of a silicon substrate having an image pickup device section on the other side thereof to form a photosensitive layer;
patternwise exposing the photosensitive layer to light; and
developing the photosensitive layer after exposure to form a pattern.

16. A solid-state image pickup device comprising the light-shielding film according to claim 14 on the one side of the silicon substrate having an image pickup device section on the other side thereof.

17. A solid-state image pickup device comprising:
a silicon substrate having an image pickup device section on one side thereof;
a metal electrode provided on the other side of the silicon substrate and electrically connected to the image pickup device section; and
the light-shielding film according to claim 14 provided on the side of the silicon substrate on which the metal electrode is provided, and patterned to expose at least a part of the metal electrode.

18. The titanium black dispersion for a wafer level lens according to claim 1, wherein the dispersant comprises a graft copolymer.

19. The photosensitive resin composition for a wafer level lens according to claim 2, wherein the photopolymerization initiator comprises an oxime ester compound.

20. The photosensitive resin composition for a wafer level lens according to claim 2, wherein a content of the titanium black particles in the photosensitive resin composition is from 2.5% by mass to 30% by mass.

21. The photosensitive resin composition for a wafer level lens according to claim 2, wherein a content of the titanium black particles in the photosensitive resin composition is from 5% by mass to 20% by mass.

22. The titanium black dispersion for a wafer level lens according to claim 5, wherein the dispersant comprises a graft copolymer.

23. The titanium black dispersion for a wafer level lens according to claim 5, wherein a Si/Ti ratio of the dispersed objects is from 0.05 to 0.5.

24. The titanium black dispersion for a wafer level lens according to claim 5, wherein a Si/Ti ratio of the dispersed objects is from 0.07 to 0.4.

25. The photosensitive resin composition for a wafer level lens according to claim 6, wherein the photopolymerization initiator comprises an oxime ester compound.

26. The titanium black dispersion according to claim 9, wherein the dispersant comprises a graft copolymer.

27. The photosensitive resin composition according to claim 13, wherein the photopolymerization initiator comprises an oxime ester compound.

28. The photosensitive resin composition according to claim 13, wherein a content of the titanium black particles in the photosensitive resin composition is from 2.5% by mass to 30% by mass.

29. The photosensitive resin composition according to claim 13, wherein a content of the titanium black particles in the photosensitive resin composition is from 5% by mass to 20% by mass.

* * * * *